| | | |
|---|---|---|
| (12) | United States Patent<br>Moon et al. | (10) Patent No.: US 9,490,216 B2<br>(45) Date of Patent: Nov. 8, 2016 |

(54) SEMICONDUCTOR DEVICE AND SEMICONDUCTOR PACKAGE

(71) Applicant: SAMSUNG ELECTRONICS CO., LTD., Suwon-si, Gyeonggi-do (KR)

(72) Inventors: Kwang-Jin Moon, Gyeonggi-do (KR); Tae-Seong Kim, Gyeonggi-do (KR); Byung-Lyul Park, Seoul (KR); Jae-Hwa Park, Gyeonggi-do (KR); Suk-Chul Bang, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/596,480

(22) Filed: Jan. 14, 2015

(65) Prior Publication Data

US 2015/0287683 A1    Oct. 8, 2015

(30) Foreign Application Priority Data

Apr. 3, 2014    (KR) .................. 10-2014-0040162

(51) Int. Cl.
| | |
|---|---|
| *H01L 23/522* | (2006.01) |
| *H01L 23/544* | (2006.01) |
| *H01L 23/31* | (2006.01) |
| *H01L 23/48* | (2006.01) |
| *H01L 21/768* | (2006.01) |

(52) U.S. Cl.
CPC ....... *H01L 23/544* (2013.01); *H01L 21/76898* (2013.01); *H01L 23/3171* (2013.01); *H01L 23/3192* (2013.01); *H01L 23/481* (2013.01); *H01L 23/522* (2013.01); *H01L 2223/54426* (2013.01); *H01L 2223/54453* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 7,071,539 B2 | 7/2006 | Nicholson et al. | |
| 7,407,879 B2 | 8/2008 | Nicholson et al. | |
| 7,956,442 B2 | 6/2011 | Hsu et al. | |
| 8,252,665 B2 | 8/2012 | Chiou et al. | |
| 2012/0001337 A1* | 1/2012 | Tsai et al. | 257/770 |
| 2012/0193785 A1* | 8/2012 | Lin et al. | 257/737 |

FOREIGN PATENT DOCUMENTS

| | | |
|---|---|---|
| JP | 2005-051214 | 2/2005 |
| KR | 1020090044523 | 5/2009 |
| KR | 1020110136122 | 12/2011 |

OTHER PUBLICATIONS

Choi et al., "Optimization of PECVD-ONO rear surface passivation layer through improved electrical property and thermal stability", Vuum 101, pp. 22-26 (Mar. 2014).*

* cited by examiner

*Primary Examiner* — Johannes P Mondt
(74) *Attorney, Agent, or Firm* — F. Chau & Associates, LLC

(57) ABSTRACT

Provided are a semiconductor device and a semiconductor package. The semiconductor device includes semiconductor device includes a semiconductor substrate having a first side and a second side. A front-side structure including an internal circuit is disposed on the first side of the semiconductor substrate. A passivation layer is disposed on the second side of the semiconductor substrate. A through-via structure passes through the semiconductor substrate and the passivation layer. A back-side conductive pattern is disposed on the second side of the semiconductor substrate. The back-side conductive pattern is electrically connected to the through-via structure. An alignment recessed area is disposed in the passivation layer. An insulating alignment pattern is disposed in the alignment recessed area.

18 Claims, 48 Drawing Sheets

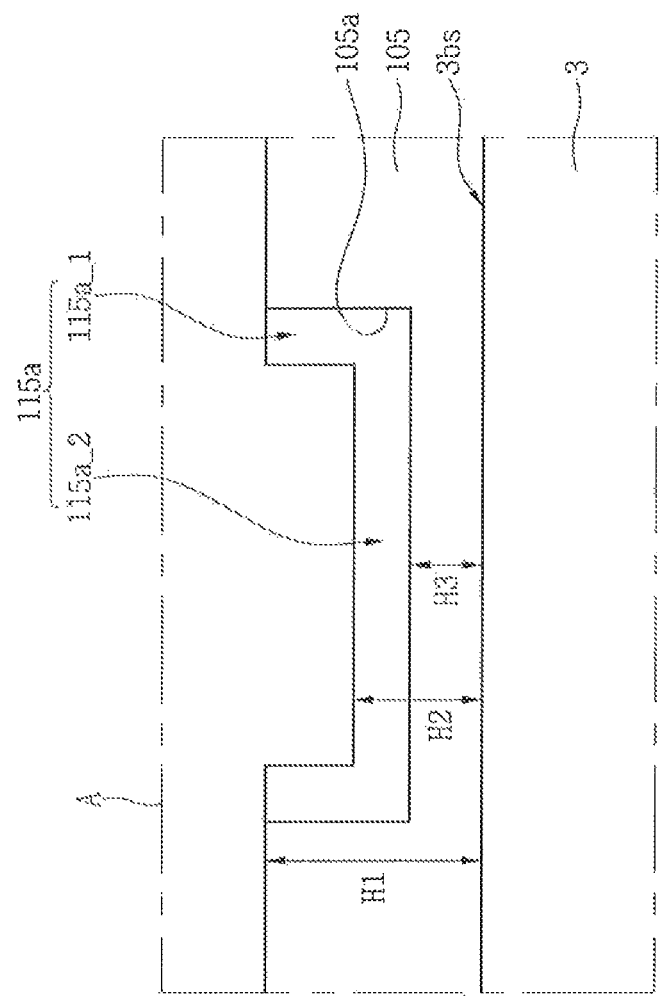

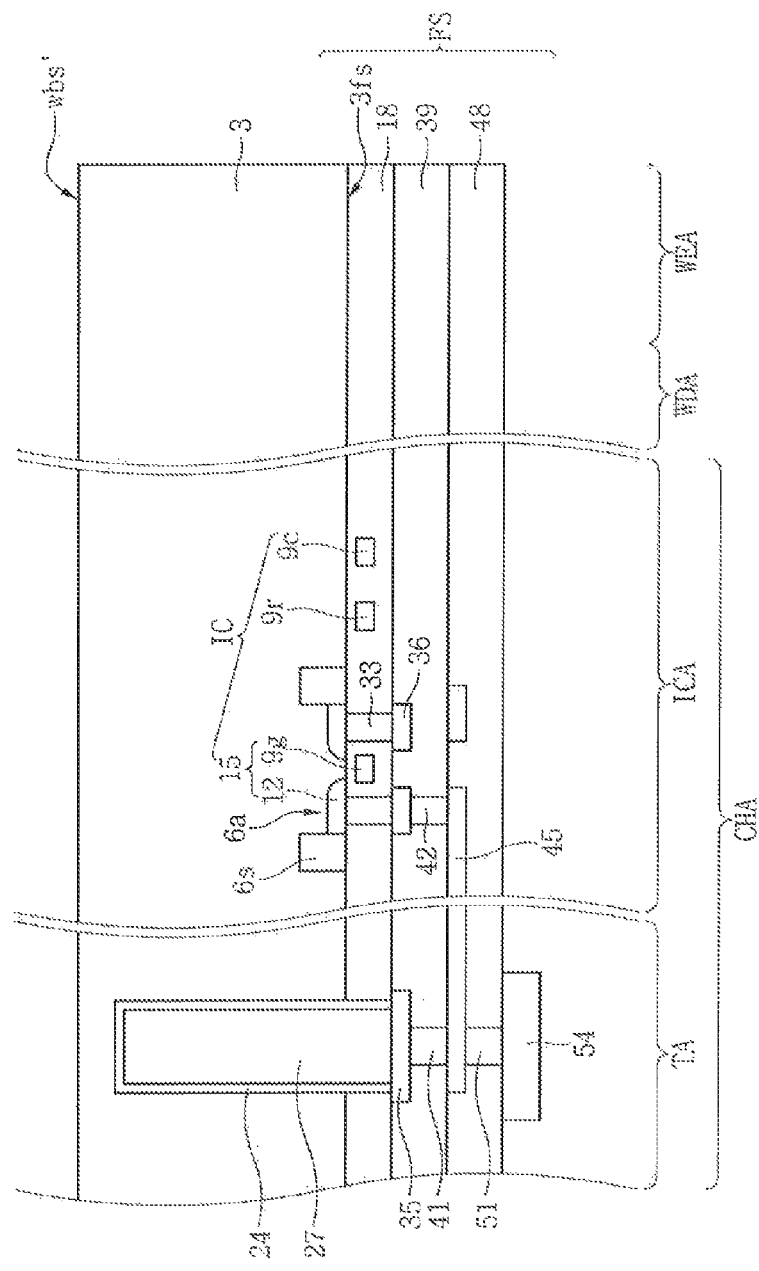

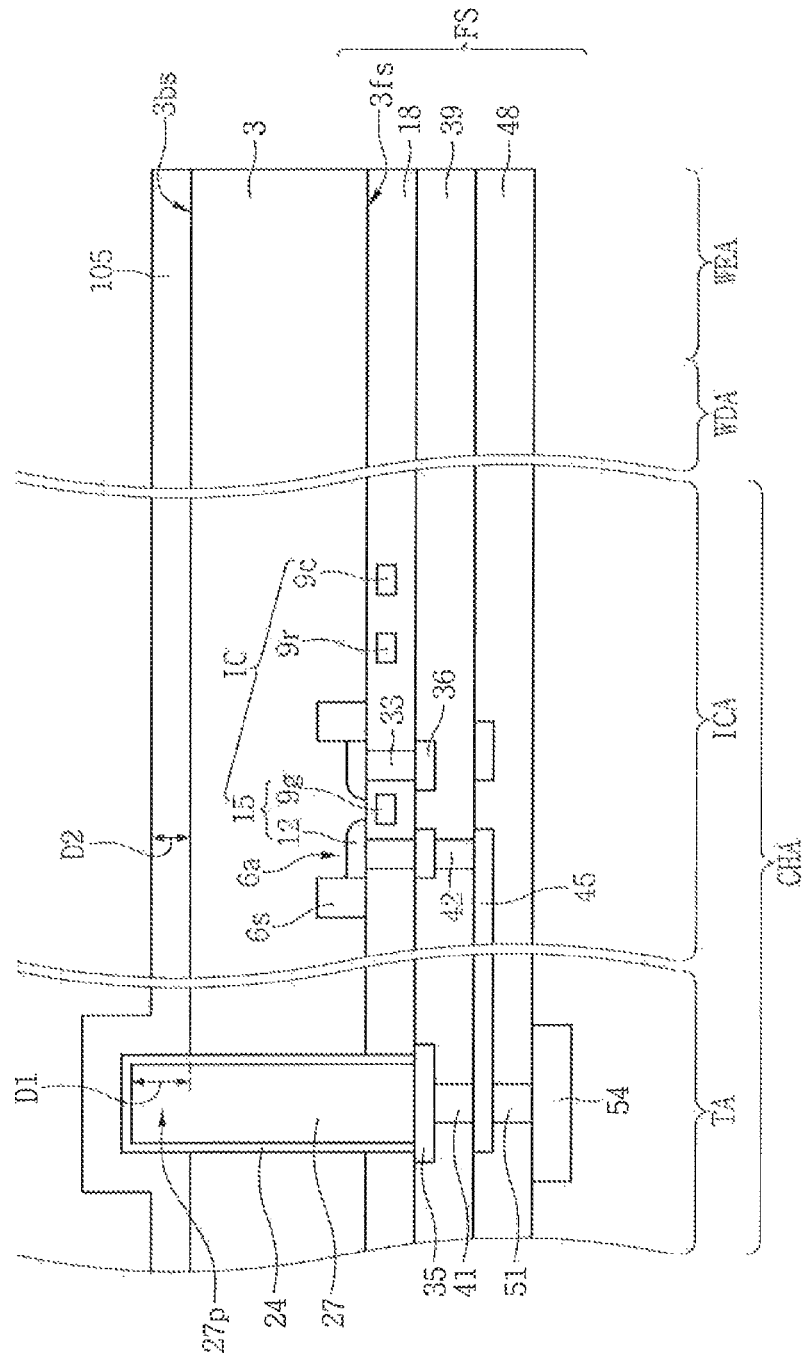

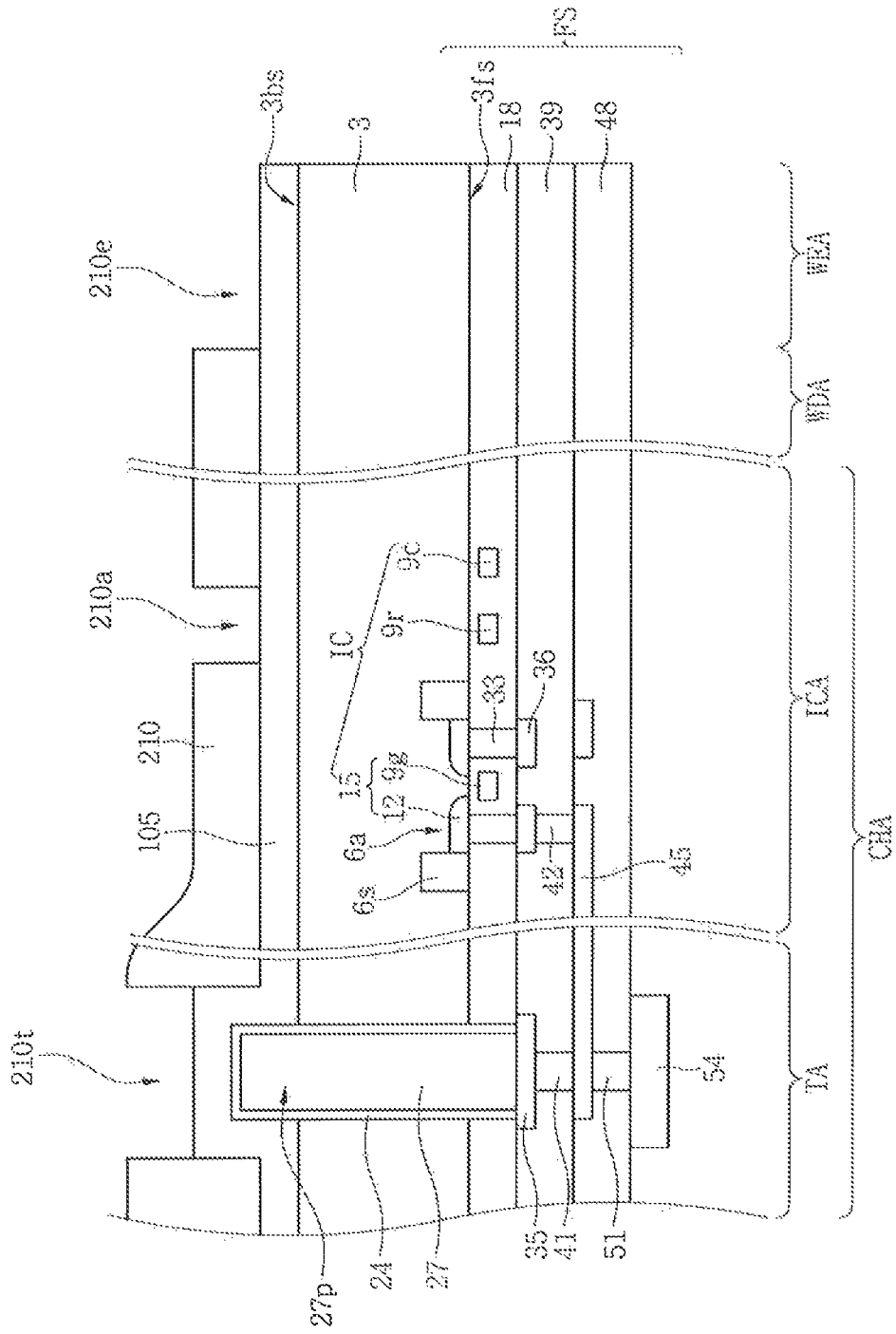

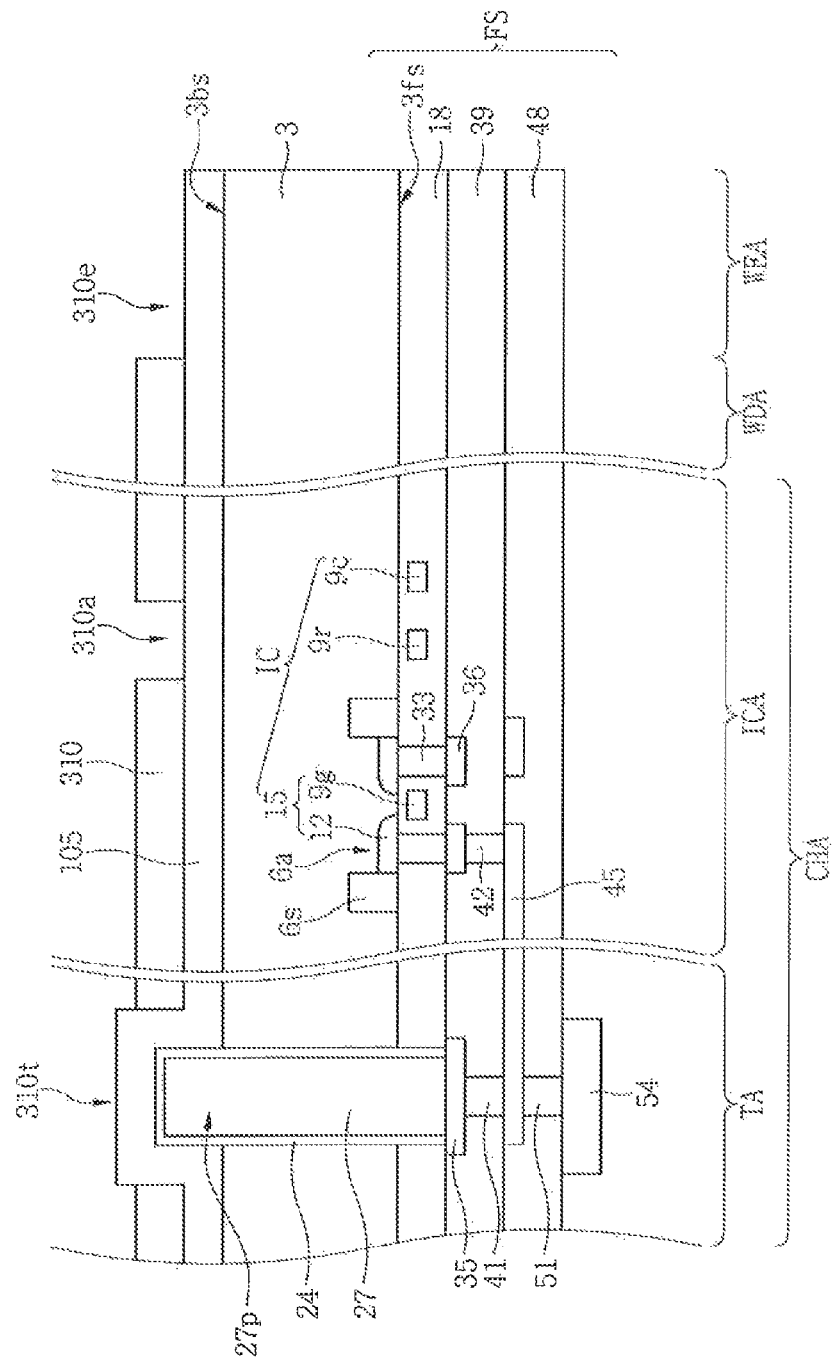

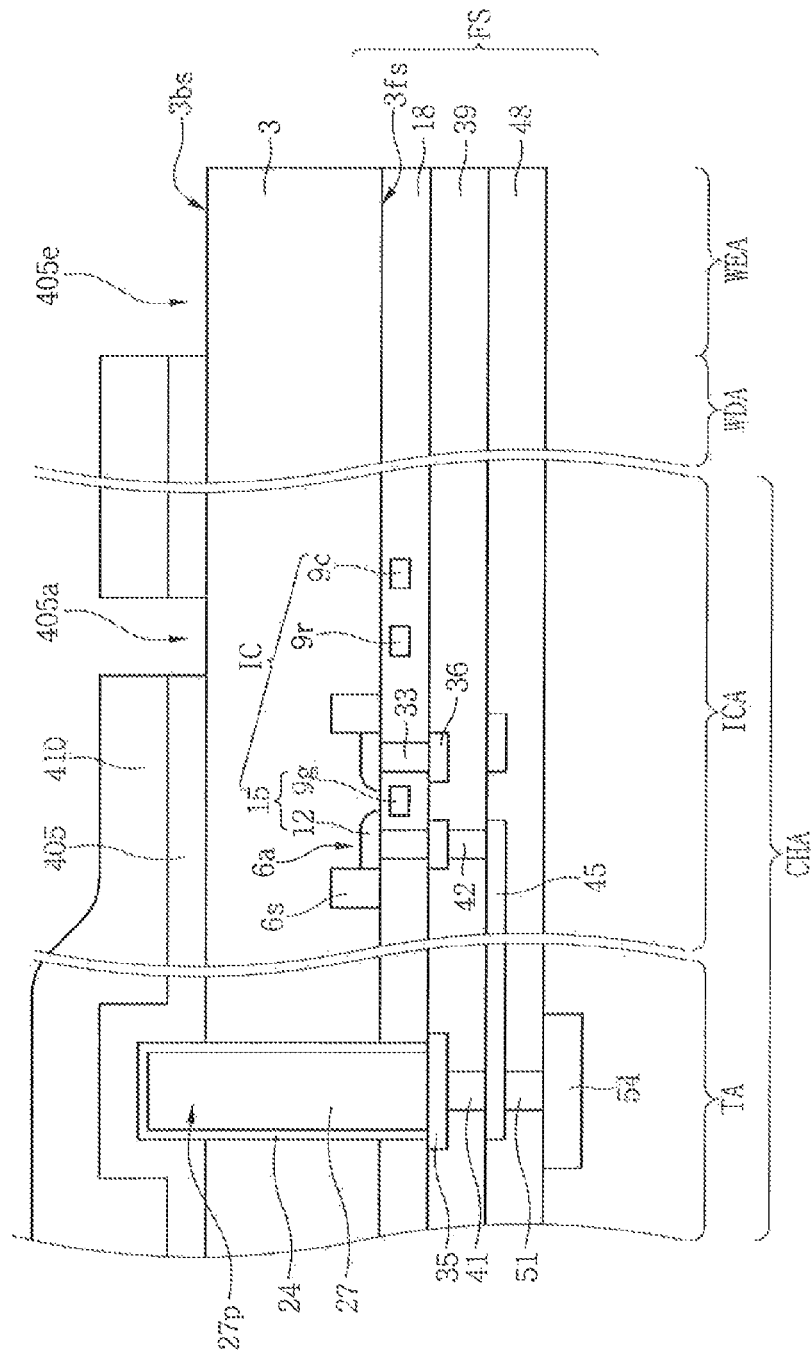

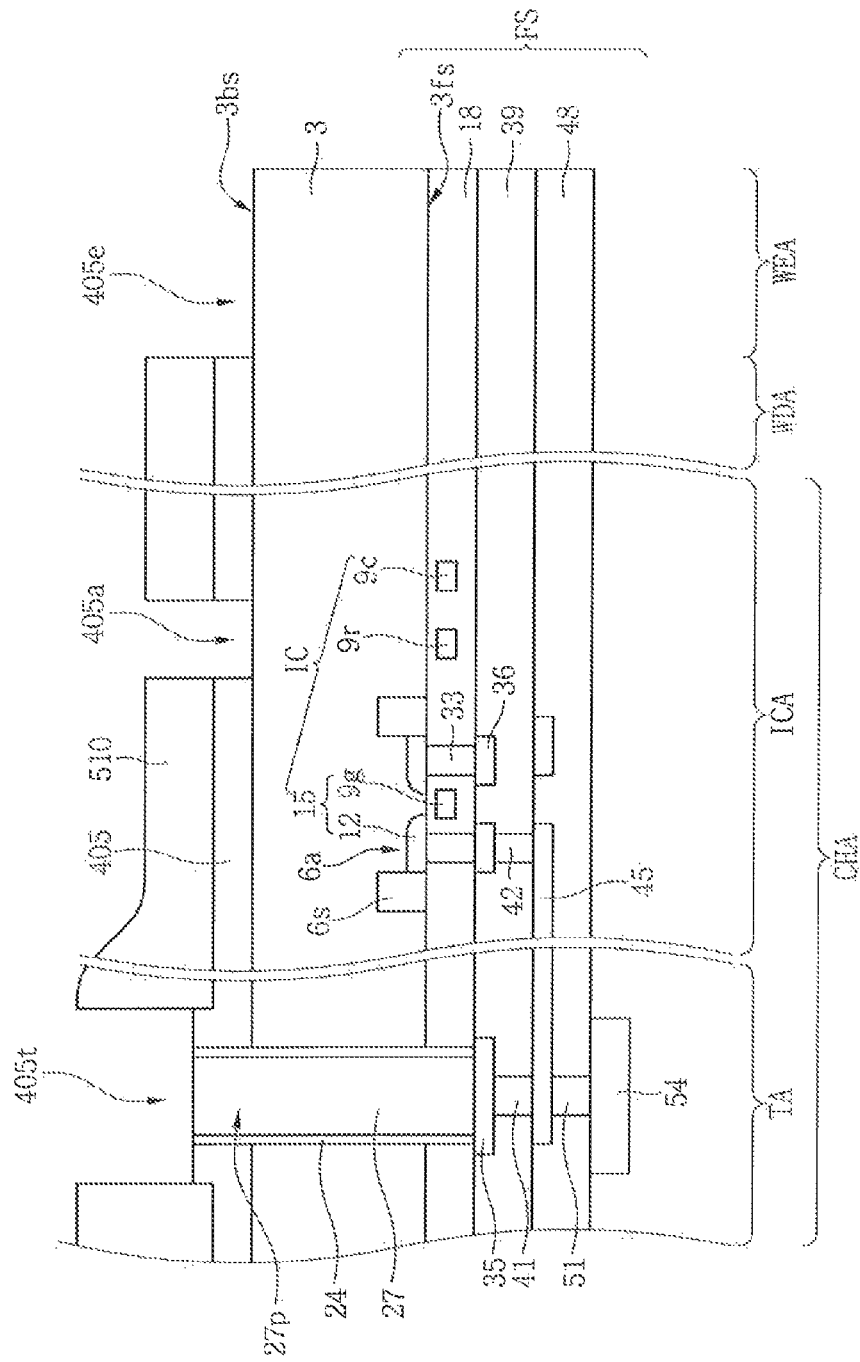

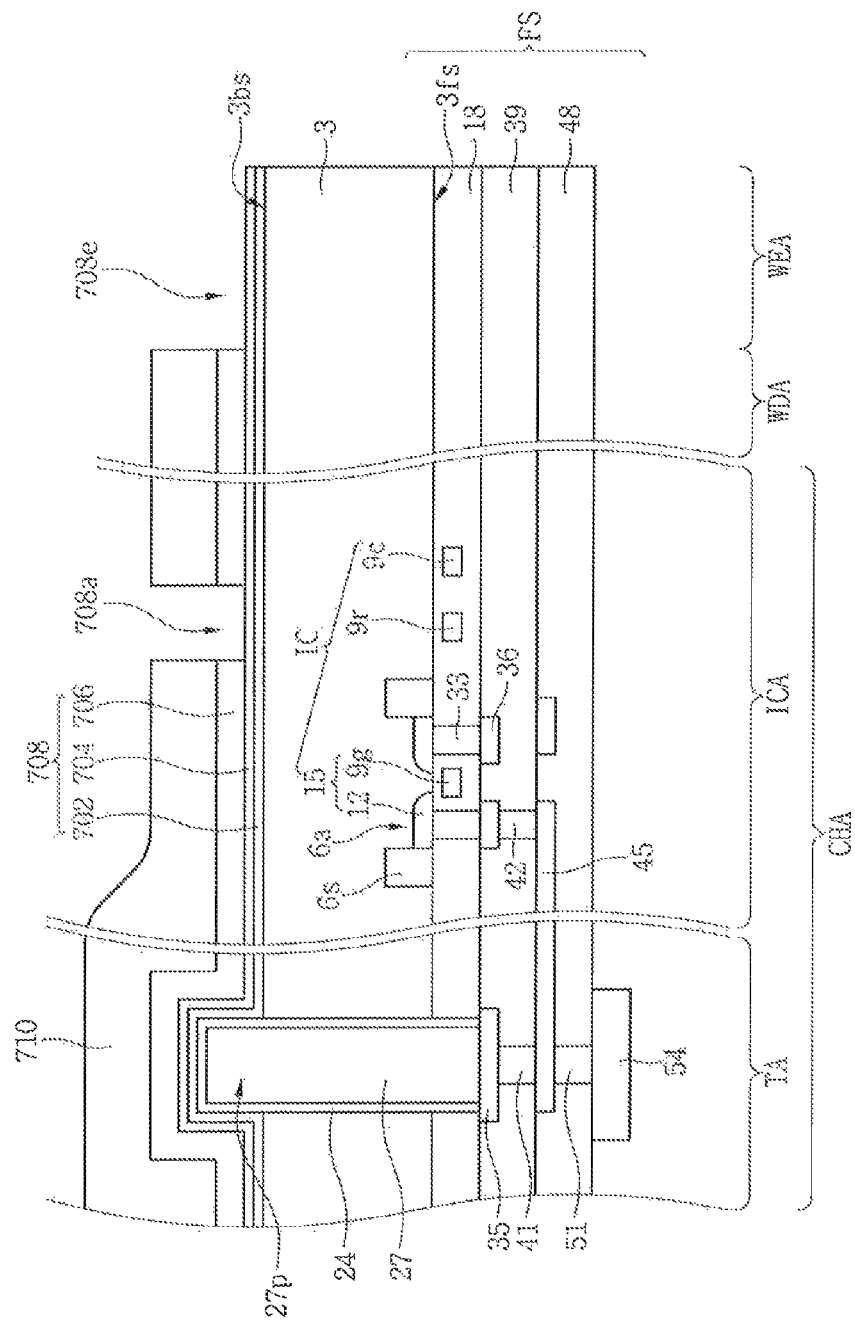

SEMICONDUCTOR DEVICE AND SEMICONDUCTOR PACKAGE

CROSS-REFERENCE TO RELATED APPLICATION

This application claims priority under 35 U.S.C. §119 to Korean Patent Application No. 10-2014-0040162 filed on Apr. 3, 2014, the disclosure of which is incorporated by reference herein in its entirety.

TECHNICAL FIELD

Exemplary embodiments of the present inventive concept relate to a semiconductor, and more particularly to a semiconductor device and a semiconductor package.

DISCUSSION OF RELATED ART

In semiconductor devices that are light, thin, short, and small in electronic systems, techniques using a through-via structure passing through a semiconductor substrate have been developed.

SUMMARY

In accordance with an exemplary embodiment of the present inventive concept, a semiconductor device includes a semiconductor substrate having a first side and a second side. A front-side structure including an internal circuit is disposed on the first side of the semiconductor substrate. A passivation layer is disposed on the second side of the semiconductor substrate. A through-via structure passes through the semiconductor substrate and the passivation layer. A back-side conductive pattern is disposed on the second side of the semiconductor substrate. The back-side conductive pattern is electrically connected to the through-via structure. An alignment recessed area is disposed in the passivation layer. An insulating alignment pattern is disposed in the alignment recessed area.

In an exemplary embodiment of the present inventive concept, the alignment pattern may include a first part covering a sidewall of the alignment recessed area and a second part covering a bottom of the alignment recessed area.

In an exemplary embodiment of the present inventive concept, an upper surface of the first part of the alignment pattern may be disposed at substantially the same level as an upper surface of the passivation layer.

In an exemplary embodiment of the present inventive concept, a distance between the upper surface of the first part of the alignment pattern and the second side of the semiconductor substrate may be greater than a distance between an upper surface of the second part of the alignment pattern and the second side of the semiconductor substrate.

In an exemplary embodiment of the present inventive concept, the passivation layer may include a lower passivation layer and an upper passivation layer disposed on the lower passivation layer.

In an exemplary embodiment of the present inventive concept, the alignment recessed area may pass through the upper passivation layer.

In an exemplary embodiment of the present inventive concept, the passivation layer may further include an intermediate passivation layer between the lower passivation layer and the upper passivation layer.

In an exemplary embodiment of the present inventive concept, the lower and intermediate passivation layers may each cover the second side of the semiconductor substrate, and may each include a part disposed between a side surface of the through-via structure and the upper passivation layer.

In an exemplary embodiment of the present inventive concept, the back-side conductive pattern may cover the through-via structure, and the lower and intermediate passivation layers may each be disposed between the side surface of the through-via structure and the upper passivation layer.

In an exemplary embodiment of the present inventive concept, the intermediate passivation layer and the alignment pattern may each comprise an insulating layer, and the lower and upper passivation layers may each include a different material from the intermediate passivation layer and the alignment pattern.

In an exemplary embodiment of the present inventive concept, the semiconductor substrate may have a circuit area and a through silica via (TSV) area. The through-via structure may pass through the semiconductor substrate in the TSV area, the internal circuit may be disposed on the first side of the semiconductor substrate in the circuit area, and the alignment pattern may be disposed on the second side of the semiconductor substrate in the circuit area.

In accordance with an exemplary embodiment of the present inventive concept, a semiconductor package including a semiconductor device includes a lower substrate and a lower conductive pattern disposed on the lower substrate. The semiconductor package includes an upper substrate and an upper conductive pattern disposed on the upper substrate. A semiconductor device is disposed between the lower substrate and the upper substrate. A lower connection pattern is disposed between the lower conductive pattern and the semiconductor device. An upper connection pattern is disposed between the upper conductive pattern and the semiconductor device. The semiconductor device includes a semiconductor substrate disposed between the lower substrate and the upper substrate. The semiconductor substrate includes a first side facing the lower substrate and a second side facing the upper substrate. A front-side structure is disposed on the first side of the semiconductor substrate. The front-side structure includes an internal circuit and a front-side conductive pattern. A passivation layer is disposed on the second side of the semiconductor substrate. A through-via structure passes through the semiconductor substrate and the passivation layer. A back-side conductive pattern is disposed on the passivation layer and is electrically connected to the through-via structure. An alignment recessed area is disposed in the passivation layer. An insulating alignment pattern is disposed in the alignment recessed area.

In an exemplary embodiment of the present inventive concept, the lower connection pattern may be in contact with the lower conductive pattern and the front-side conductive pattern, and the upper connection pattern may be in contact with the upper conductive pattern and the back-side conductive pattern.

In an exemplary embodiment of the present inventive concept, an upper filler may be disposed between the upper substrate and the semiconductor device.

In an exemplary embodiment of the present inventive concept, the upper filler and the alignment pattern may fill the alignment recessed area.

BRIEF DESCRIPTION OF THE DRAWINGS

The above and other features of the inventive concept will become more apparent by describing in detail exemplary embodiments thereof, with reference to the accompanying drawings in which:

FIG. 1B is a partially enlarged view of part A in FIG. 1A;

FIGS. 6A to 6J are cross-sectional views showing an example of a method of forming a semiconductor device in accordance with an exemplary embodiment of the present inventive concept;

FIGS. 7A to 7D are cross-sectional views showing an example of a method of forming a semiconductor device in accordance with an exemplary embodiment of the present inventive concept;

FIGS. 8A to 8C are cross-sectional views showing an example of a method of forming a semiconductor device in accordance with an exemplary embodiment of the present inventive concept;

FIGS. 9A to 9D are cross-sectional views showing an example of a method of forming a semiconductor device in accordance with an exemplary embodiment of the present inventive concept;

FIGS. 10A and 10B are cross-sectional views showing an example of a method of forming a semiconductor device in accordance with an exemplary embodiment of the present inventive concept;

FIGS. 12A to 12E are cross-sectional views showing an example of a method of forming a semiconductor device in accordance with an exemplary embodiment of the present inventive concept;

DETAILED DESCRIPTION OF THE EMBODIMENTS

Figure 1A:
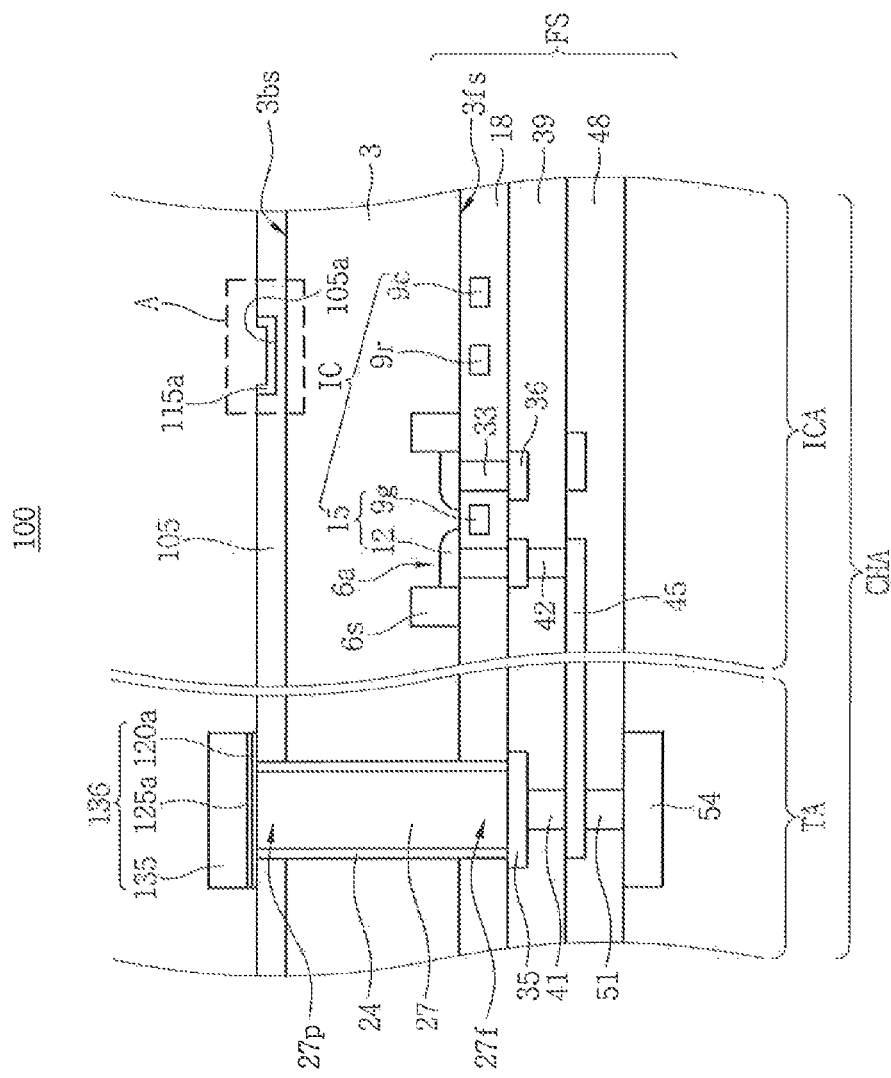
FIG. 1A is a cross-sectional view showing a semiconductor device in accordance with an exemplary embodiment of the present inventive concept.

Exemplary embodiments of the present inventive concept will now be more fully described with reference to the accompanying drawings in which exemplary embodiments are shown. The present inventive concept may, however, be embodied in various different forms, and should be construed as limited by the embodiments set forth herein. In the drawings, the sizes and relative sizes of layers and regions may be exaggerated for clarity. The same reference symbols may denote the same components throughout the specification and drawings.

Exemplary embodiments may be described herein with reference to cross-sectional views, plan views, and/or block diagrams that are schematic illustrations of idealized embodiments. Variations from the shapes of the illustrations as a result, for example, of manufacturing techniques and/or tolerances, may occur. Thus, embodiments should not be construed as limited to the particular shapes of regions illustrated herein but are to include deviations in shapes that result, for example, from manufacturing. Regions illustrated in the drawings may be schematic in nature, and their shapes are not intended to limit the present inventive concept.

The thicknesses of layers and regions in the drawings may be exaggerated for the sake of clarity. It will be understood that when a layer is referred to as being "on" another layer or a substrate, the layer may be formed directly on the other layer or the substrate, or there may be an intervening layer therebetween. The same reference numerals may refer to the same components throughout the specification and drawings.

Terms such as "top," "bottom," "upper," "lower," "above," "below," and the like may be used herein to describe the relative positions of elements or features. It will be understood that such descriptions are intended to encompass different orientations in use or operation in addition to orientations depicted in the drawings. Directional terms such as "upper," "intermediate," "lower," and the like may be used herein to describe the relationship of one element or feature with another, and the present inventive concept is not limited by these terms. Accordingly, these terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. The terminology used herein to describe embodiments of the present inventive concept is not intended to limit the scope of the present inventive concept.

Figure 2:
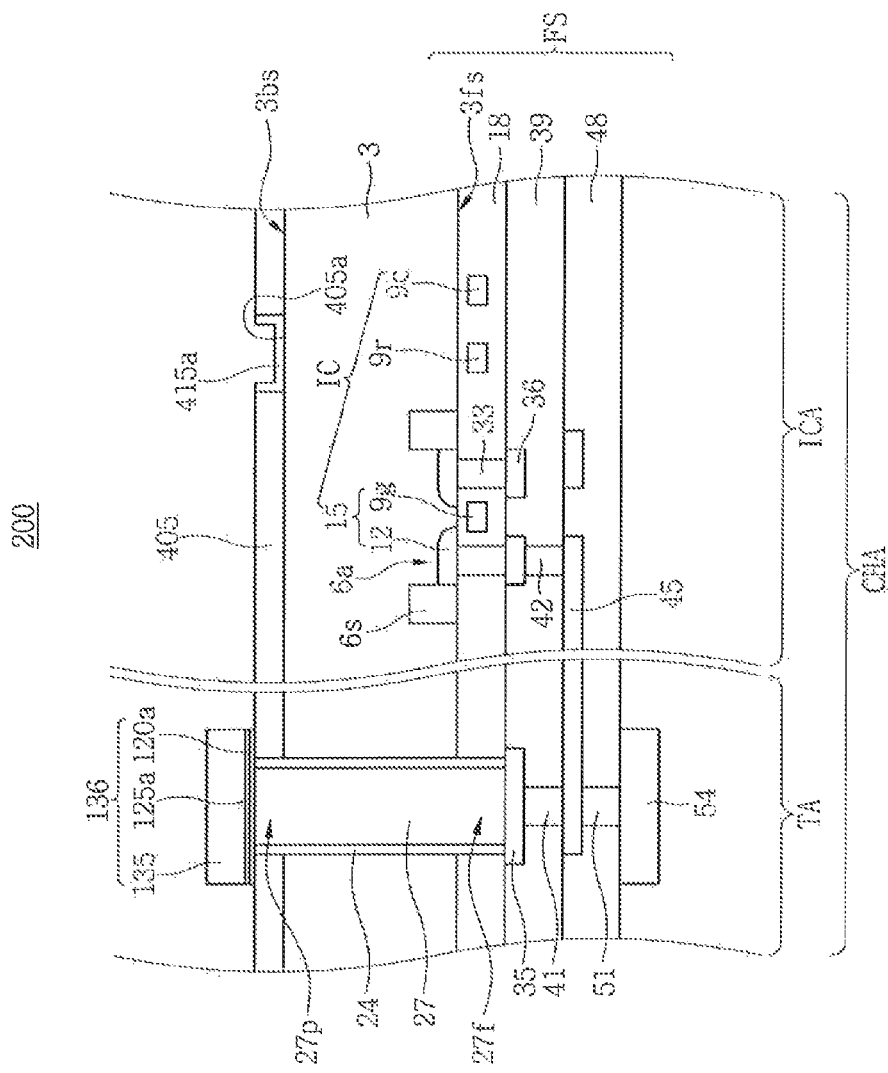
FIG. 2 is a cross-sectional view showing a semiconductor device in accordance with an exemplary embodiment of the present inventive concept.
Figure 3:
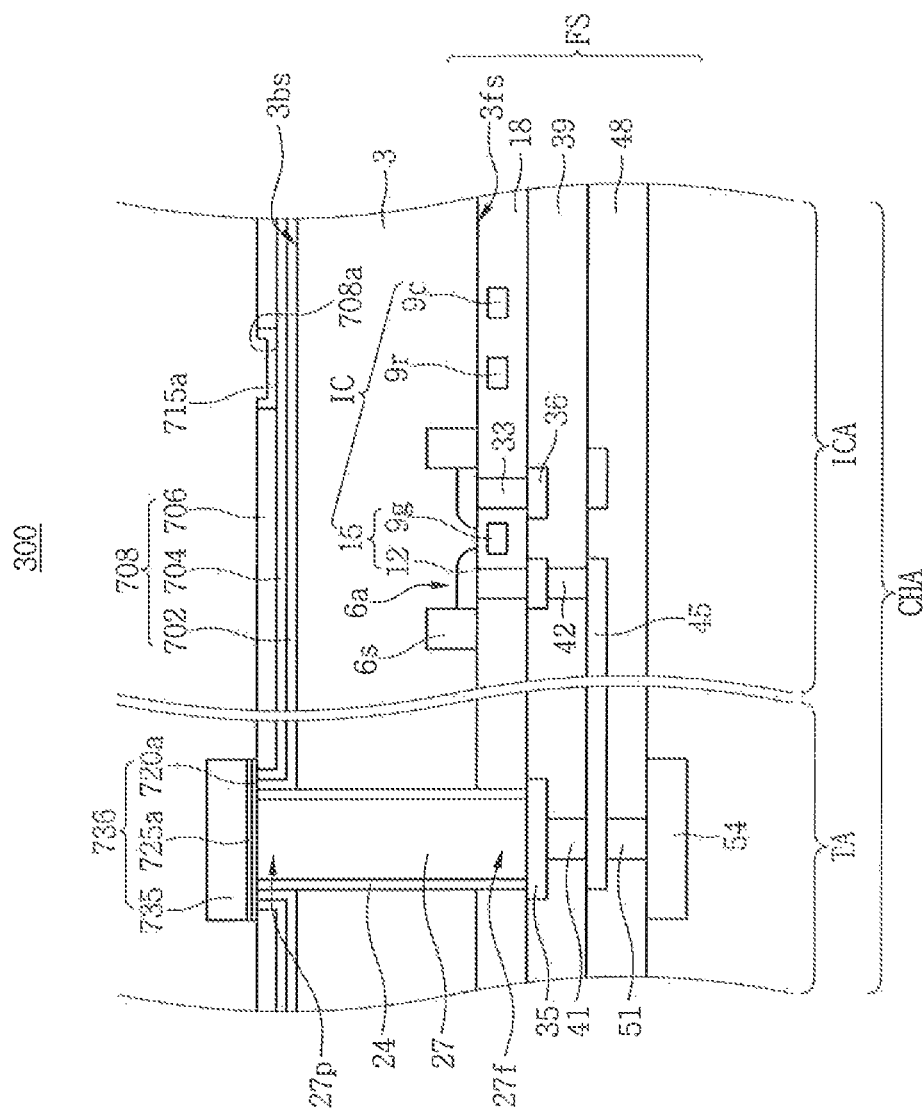
FIG. 3 is a cross-sectional view showing a semiconductor device in accordance with an exemplary embodiment of the present inventive concept.

FIG. 1A is a cross-sectional view showing a semiconductor device in accordance with an exemplary embodiment of the present inventive concept, FIG. 1B is a partially enlarged view of part A in FIG. 1A, FIG. 2 is a cross-sectional view showing a semiconductor device in accordance with an exemplary embodiment of the present inventive concept, and FIG. 3 is a cross-sectional view showing a semiconductor device in accordance with an exemplary embodiment of the present inventive concept.

A semiconductor device 100 in accordance with an exemplary embodiment of the present inventive concept will be described with reference to FIGS. 1A and 1B.

Referring to FIGS. 1A and 1B, the semiconductor device 100 in accordance with an exemplary embodiment of the present inventive concept may include a semiconductor substrate 3, a front-side structure FS, a through-via structure 27, a via insulating layer 24, a passivation layer 105, an alignment pattern 115a disposed in an alignment recessed area 105a, and a back-side conductive pattern 136.

The semiconductor substrate 3 may have a first side 3fs and a second side 3bs facing the first side 3fs. The semiconductor substrate 3 may include a through silicon via (TSV) area TA and a circuit area ICA. The first side 3fs of the semiconductor substrate 3 may be a front side, and the second side 3bs of the semiconductor substrate 3 may be a back side. The semiconductor substrate 3 may be a substrate including a semiconductor material such as silicon.

The through-via structure 27 may pass through the semiconductor substrate 3 in the TSV area TA, and may include a back-side protruding part 27p protruding from the second side 3bs of the semiconductor substrate 3 and a front-side protruding part 27f protruding from the first side 3fs of the semiconductor substrate 3.

The via insulating layer 24 may be disposed on a side surface of the through-via structure 27. The via insulating layer 24 may be disposed to cover the side surface of the through-via structure 27.

The passivation layer 105 may be disposed on the second side 3bs of the semiconductor substrate 3. The back-side protruding part 27p of the through-via structure 27 may pass through the passivation layer 105. The passivation layer 105 may be disposed to cover a side surface of the back-side protruding part 27p of the through-via structure 27. The via insulating layer 24 may include a part interposed between the back-side protruding part 27p of the through-via structure 27 and the passivation layer 105.

The passivation layer 105 may include an insulating material. For example, the passivation layer 105 may include an oxide-based insulating layer, a nitride-based insulating layer, or a polymer-based insulating layer. The passivation layer 105 may include an insulating oxide, an insulating nitride, or an insulating polymer. For example, the passivation layer 105 may include silicon oxide, silicon nitride, or a polyimide.

The alignment recessed area 105a may be disposed in the passivation layer 105. The alignment recessed area 105a may be disposed in the circuit area ICA of the semiconductor substrate 3. A bottom of the alignment recessed area 105a may be disposed in the passivation layer 105, and may be spaced apart from the second side 3bs of the semiconductor substrate 3. The alignment pattern 115a may be disposed in the alignment recessed area 105a. The alignment pattern 115a may be defined by the alignment recessed area 105a. The alignment pattern 115a may be disposed in the circuit area ICA of the second side 3bs of the semiconductor substrate 3. The alignment pattern 115a may overlap an internal circuit IC. The alignment pattern 115a may face a part of the internal circuit IC. The internal circuit IC may be disposed in the semiconductor substrate 3. The alignment pattern 115a may cover the bottom and a sidewall of the alignment recessed area 105a. The alignment pattern 115a may be substantially conformally formed along the bottom and the sidewall of the alignment recessed area 105a.

The alignment pattern 115a may include a first part 115a_1 configured to cover the sidewall of the alignment recessed area 105a, and a second part 115a_2 configured to cover the bottom of the alignment recessed area 105a. An upper surface of the first part 115a_of the alignment pattern 115a may be located at substantially the same level as an upper surface of the passivation layer 105. An upper surface of the second part 115a_2 of the alignment pattern 115a may be located at a lower level than the upper surface of the passivation layer 105 and the upper surface of the first part 115a_1 of the alignment pattern 115a. A first distance H1 between the upper surface of the first part 15a_1 of the alignment pattern 115a and the second side 3bs of the semiconductor substrate 3 may be greater than a second distance H2 between the upper surface of the second part 115a_2 of the alignment pattern 115a and the second side 3bs of the semiconductor substrate 3. The alignment pattern 115a may be spaced apart from the second side 3bs of the semiconductor substrate 3. The alignment pattern 115a may be spaced apart from the second side 3bs of the semiconductor substrate 3 by a third distance H3.

The alignment pattern 115a may include a different material than is used in the passivation layer 105. The passivation layer 105 may include a first material, and the alignment pattern 115a may include a second material different from the first material. For example, the passivation layer 105 may include an oxide-based insulating layer, a nitride-based insulating layer, or a polymer-based insulating layer. The passivation layer 105 may be formed as a single layer or as a multi-layered structure and may include silicon oxide, such as plasma oxide or tetraethyl orthosilicate (TEOS), and may include a polyimide, silicon nitride or silicon oxynitride. The passivation layer 105 may be formed at a relatively low temperature of, for example, about 100° C. to about 200° C. The alignment pattern 115a may include a nitride-based material such as silicon nitride or a polymer-based material. For example, when the passivation layer 105 includes a silicon oxide layer, the alignment pattern 115a may include a silicon nitride layer. The alignment pattern 115a may prevent degradation of the thickness distribution characteristic of the passivation layer 105 during semiconductor processes such as a chemical mechanical polishing (CMP) process.

The back-side conductive pattern 136 may be disposed on the passivation layer 105, and may cover the through-via structure 27. The back-side conductive pattern 136 may be electrically connected to the back-side protruding part 27p of the through-via structure 27. The back-side conductive pattern 136 may include a lower back-side conductive pattern 120a, an intermediate back-side conductive pattern 125a, and an upper back-side conductive pattern 135, which may be sequentially stacked on the through-via structure 27.

The lower back-side conductive pattern 120a may be a barrier pattern including a conductive material such as titanium (Ti), titanium nitride (TiN), titanium tungsten (TiW), tantalum (Ta), tantalum nitride (TaN), or tungsten nitride (WN). The intermediate back-side conductive pattern 125a may be a seed pattern including a metal such as copper (Cu), ruthenium (Ru), nickel (Ni), or tungsten (W). The upper back-side conductive pattern 135 may be a pad pattern including Ni, Cu, gold (Au), or a combination thereof.

The front-side structure FS may be disposed on the first side 3fs of the semiconductor substrate 3. The front-side structure FS may include the internal circuit IC, a plurality of conductive plugs 33, 41, 42 and 51, a via metal pattern 35, a plurality of metal interconnections 36 and 45, a plurality of front-side insulating layers 18, 39 and 48, and a front-side conductive pattern 54.

The front-side conductive pattern 54, the through-via structure 27, and the internal circuit IC may be electrically connected to each other through the plurality of metal interconnections 36 and 45, the via metal pattern 35, and the plurality of conductive plugs 33, 41, 42, and 51.

The internal circuit IC may include unit devices 15, 9r, and 9c formed in the circuit area ICA of the first side 3fs of the semiconductor substrate 3. The unit devices 15, 9r, and 9c may include devices, such as a metal-oxide-semiconductor (MOS) transistor, a resistor or a capacitor. For example, one of the unit devices 15, 9r, and 9c may be a transistor 15. The transistor 15 may include a gate structure 9g and source/drain areas 12. The gate structure 9g may be disposed on an active area 6a of the first side 3fs of the semiconductor substrate 3, and the source/drain areas 12 may be disposed in the active area 6a on two sides of the gate structure 9g. The active area 6a may be defined by an isolating area 6s formed in the semiconductor substrate 3.

The plurality of front-side insulating layers 18, 39, and 48 may include a lower front-side insulating layer 18, an intermediate front-side insulating layer 39 located on the lower front-side insulating layer 18, and an upper front-side insulating layer 48 located on the intermediate front-side insulating layer 39. The lower front-side insulating layer 18 may be disposed on the first side 3fs of the semiconductor substrate 3, and may cover the unit devices 15, 9r, and 9c.

The front-side protruding part 27f of the through-via structure 27 may protrude from the first side 3fs of the semiconductor substrate 3, and may pass through the lower front-side insulating layer 18. The front-side protruding part 27f of the through-via structure 27 may be disposed in the front-side structure FS.

The via metal pattern 35 may be disposed on the lower front-side insulating layer 18, and may cover the through-via structure 27. The via metal pattern 35 may be electrically connected to the through-via structure 27.

The plurality of metal interconnections 36 and 45 may include a lower metal interconnection 36 disposed on the lower front-side insulating layer 18 and covered by the intermediate front-side insulating layer 39, and an upper metal interconnection 45 disposed on the intermediate front-side insulating layer 39 and covered by the upper front-side insulating layer 48.

The plurality of conductive plugs 33, 41, 42, and 51 may include a lower conductive plug 33 passing through the lower front-side insulating layer 18, intermediate conductive plugs 41 and 42 passing through the intermediate front-side insulating layer 39, and an upper conductive plug 51 passing through the upper front-side insulating layer 48. The lower conductive plug 33 may electrically connect any of the unit devices 15, 9r, and 9c with the lower metal interconnection 36. The intermediate conductive plugs 41 and 42 may include a first intermediate conductive plug 41 and a second intermediate conductive plug 42. The first intermediate conductive plug 41 may electrically connect the via metal pattern 35 with the upper metal interconnection 45 by being interposed between the via metal pattern 35 and the upper metal interconnection 45. The second intermediate conductive plug 42 may electrically connect the lower metal interconnection 36 with the upper metal interconnection 45 by being interposed between the lower metal interconnection 36 and the upper metal interconnection 45. The upper conductive plug 51 may electrically connect the upper metal interconnection 45 with the front-side conductive pattern 54 by being interposed between the upper metal interconnection 45 and the front-side conductive pattern 54.

The front-side conductive pattern 54 may be disposed on the upper front-side insulating layer 48, and may be electrically connected to the front-side protruding part 27f of the through-via structure 27 and the internal circuit IC.

A semiconductor device 200 in accordance with an exemplary embodiment of the present inventive concept will be described with reference to FIG. 2.

Referring to FIG. 2, a semiconductor device 200 in accordance with an exemplary embodiment of the present inventive concept may include the semiconductor substrate 3 having the first side 3fs and the second side 3bs, the front-side structure FS, the through-via structure 27, the via insulating layer 24, the passivation layer 405, and the back-side conductive pattern 136 such as in the semiconductor device 100 described in FIGS. 1A and 1B.

The semiconductor device 200 in accordance with an exemplary embodiment of the present inventive concept may include an alignment recessed area 405a passing through a passivation layer 405, and an alignment pattern 415a disposed in the alignment recessed area 405a.

The alignment pattern 415a may contact the semiconductor substrate 3. The alignment pattern 415a may contact the second side 3bs of the semiconductor substrate 3. The alignment pattern 415a may include the same material as the alignment pattern 115a described in FIGS. 1A and 1B.

A semiconductor device 300 in accordance with an exemplary embodiment of the present inventive concept will be described with reference to FIG. 3.

Referring to FIG. 3, a semiconductor device 300 in accordance with an exemplary embodiment of the present inventive concept may include the semiconductor substrate 3 having the first side 3fs and the second side 3bs, the front-side structure FS, the through-via structure 27, and the via insulating layer 24 such as in the semiconductor device 100 described in FIGS. 1A and 1B.

The semiconductor device 300 in accordance with an exemplary embodiment of the present inventive concept may include a passivation layer 708, an alignment recessed area 708a, an alignment pattern 715a, and a back-side conductive pattern 736.

The passivation layer 708 may include a lower passivation layer 702, an intermediate passivation layer 704, and an upper passivation layer 706, which may be sequentially stacked on the second side 3bs of the semiconductor substrate 3.

The passivation layer 708 may cover the back-side protruding part 27p of the through-via structure 27.

The via insulating layer 24 may include a part interposed between the passivation layer 708 and the back-side protruding part 27p of the through-via structure 27.

The lower passivation layer 702 and/or the intermediate passivation layer 704 may cover the second side 3bs of the semiconductor substrate 3, and may extend onto a side surface of the back-side protruding part 27p of the through-via structure 27. The lower passivation layer 702 and the intermediate passivation layer 704 may cover the second side 3bs of the semiconductor substrate 3, and may include a part interposed between the side surface of the back-side protruding part 27p of the through-via structure 27 and the upper passivation layer 706. The lower passivation layer 702 may be interposed between the second side 3bs of the semiconductor substrate 3 and the intermediate passivation layer 704, and between the side surface of the back-side protruding part 27p of the through-via structure 27 and the intermediate passivation layer 704. The intermediate passivation layer 704 may be interposed between the lower passivation layer 702 and the upper passivation layer 706. The intermediate passivation layer 704 may cover the second side 3bs of the semiconductor substrate 3, and may include a part interposed between the side surface of the back-side protruding part 27p of the through-via structure 27 and the upper passivation layer 706.

The intermediate passivation layer 704 may include a different material from the lower and upper passivation layers 702 and 706. The lower passivation layer 702 may include an oxide-based insulating layer, the intermediate passivation layer 704 may include a nitride-based insulating layer, and the upper passivation layer 706 may include an oxide-based or a polymer-based insulating layer. The lower passivation layer 702 may include a silicon oxide layer, the intermediate passivation layer 704 may include a silicon nitride layer, and the upper passivation layer 706 may include a silicon oxide layer or a polyimide layer.

The alignment recessed area 708a may be disposed in the passivation layer 708. The alignment recessed area 708a may be disposed in the circuit area ICA of the semiconductor substrate 3. The alignment recessed area 708a may pass through the upper passivation layer 706. A bottom of the alignment recessed area 708a may be disposed in the passivation layer 708, and may be spaced apart from the second side 3bs of the semiconductor substrate 3. The alignment pattern 715a may be disposed in the alignment recessed area 708a. The alignment pattern 715a may cover the bottom and a sidewall of the alignment recessed area 708a. The alignment pattern 715a may be substantially conformally formed along the bottom and the sidewall of the alignment recessed area 708a.

The alignment pattern 715a may be substantially the same shape as the alignment pattern 115a described in FIGS. 1A and 1B. For example, the alignment pattern 715a, as described in FIG. 1B, may include a first part configured to cover the sidewall of the alignment recessed area 708a, and a second part configured to cover the bottom of the alignment recessed area 708a.

The alignment pattern 715a may include a different material from the upper passivation layer 706. The alignment pattern 715a may include an insulating layer including a same material as the intermediate passivation layer 704. The alignment pattern 715a and the intermediate passivation layer 704 may include a different material from the lower and upper passivation layers 702 and 706. The alignment pattern 715a and the intermediate passivation layer 704 may include a nitride-based insulating layer, the lower passivation layer 702 may include an oxide-based insulating layer, and the upper passivation layer 706 may include an oxide-based or a polymer-based insulating layer. The alignment pattern 715a and the intermediate passivation layer 704 may include a silicon nitride layer, the lower passivation layer 702 may include a silicon oxide layer, and the upper passivation layer 706 may include a silicon oxide layer or a polyimide layer.

The back-side conductive pattern 736 may be disposed on the passivation layer 708, and may cover the through-via structure 27. The back-side conductive pattern 736 may be electrically connected to the through-via structure 27. The back-side conductive pattern 736 may include a lower back-side conductive pattern 720a, an intermediate back-side conductive pattern 725a, and an upper back-side conductive pattern 735, which may be sequentially stacked on the through-via structure 27.

The back-side conductive pattern 736 may cover the through-via structure 27, and a part of the passivation layer 708. The back-side conductive pattern 736 may cover the back-side protruding part 27p of the through-via structure 27, and the lower and intermediate passivation layers 702 and 704 may be interposed between the side surface of the back-side protruding part 27p of the through-via structure 27 and the upper passivation layer 706. The back-side conductive pattern 736 may directly contact an end of the lower passivation layer 702 disposed on the side surface of the back-side protruding part 27p of the through-via structure 27. The back-side conductive pattern 736 may directly contact an end of the intermediate passivation layer 704 disposed on the side surface of the back-side protruding part 27p of the through-via structure 27. The back-side conductive pattern 736 may directly contact the upper passivation layer 706.

Hereinafter, examples of methods of forming semiconductor devices in accordance with exemplary embodiments of the present inventive concept will be described.

Figure 4:
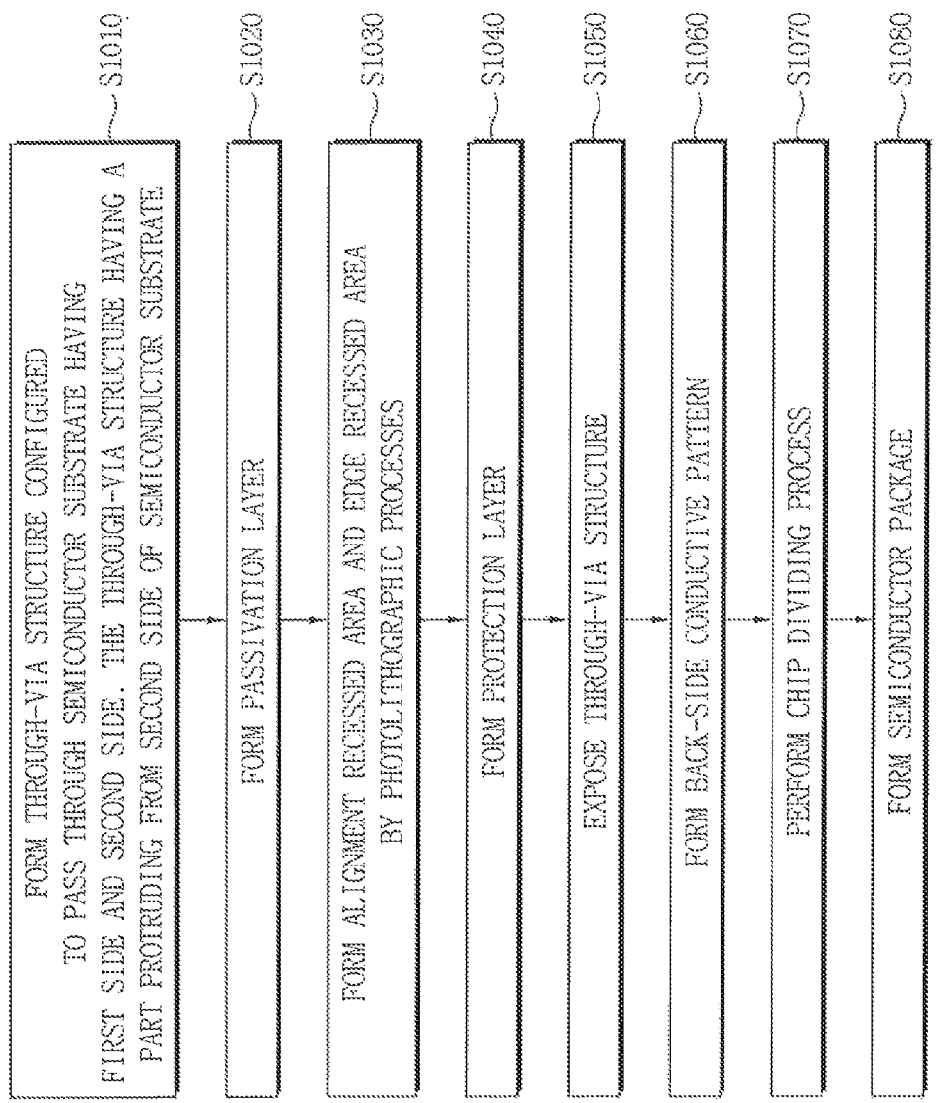
FIG. 4 is a process flow diagram showing a method of forming semiconductor devices in accordance with exemplary embodiments of the present inventive concept.

FIG. 4 is a process flow diagram showing a method of forming semiconductor devices in accordance with exemplary embodiments of the present inventive concept. A method of forming semiconductor devices in accordance with exemplary embodiments of the present inventive concept will be described with reference to FIG. 4.

Referring to FIG. 4, a method of forming semiconductor devices in accordance with exemplary embodiments of the present inventive concept may include forming a through-via structure configured to pass through a semiconductor substrate having a first side and a second side, the through-via structure having a part protruding from the second side of the semiconductor substrate (S1010). The method of forming the semiconductor devices in accordance with exemplary embodiments of the present inventive concept may include forming a passivation layer (S1020). The method of forming the semiconductor devices in accordance with exemplary embodiments of the present inventive concept may include forming an alignment recessed area and an edge recessed area by performing photolithographic processes (S1030). The method of forming the semiconductor devices in accordance with exemplary embodiments of the present inventive concept may include forming a protection layer (S1040). The method of forming the semiconductor devices in accordance with exemplary embodiments of the present inventive concept may include exposing the through-via structure (S1050). The method of forming the semiconductor devices in accordance with exemplary embodiments of the present inventive concept may include forming a back-side conductive pattern (S1060). The method of forming the semiconductor devices in accordance with exemplary embodiments of the present inventive concept may include performing a chip dividing process (S1070). The method of forming the semiconductor devices in accordance with exemplary embodiments of the present inventive concept may include forming a semiconductor package (S1080).

Figure 5:
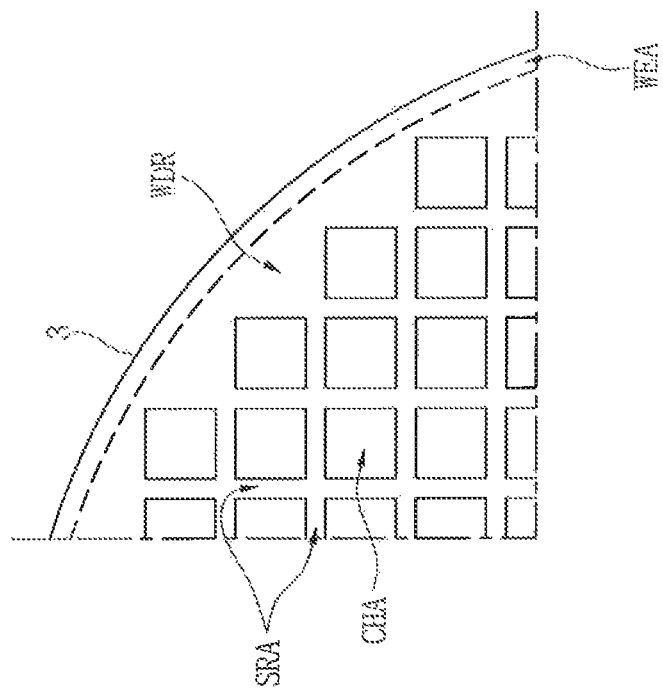
FIG. 5 is a plan view showing a part of a semiconductor substrate for describing a method of forming semiconductor devices in accordance with exemplary embodiments of the present inventive concept.

FIG. 5 is a plan view showing a part of a semiconductor substrate for describing a method of forming semiconductor devices in accordance with exemplary embodiments of the present inventive concept.

FIGS. 6A to 6J are cross-sectional views showing an example of a method of forming a semiconductor device in accordance with an exemplary embodiment of the present inventive concept.

An example of a method of forming a semiconductor device in accordance with an exemplary embodiment of the present inventive concept will be described with reference to FIGS. 5, and 6A to 6J.

Figure 6A:
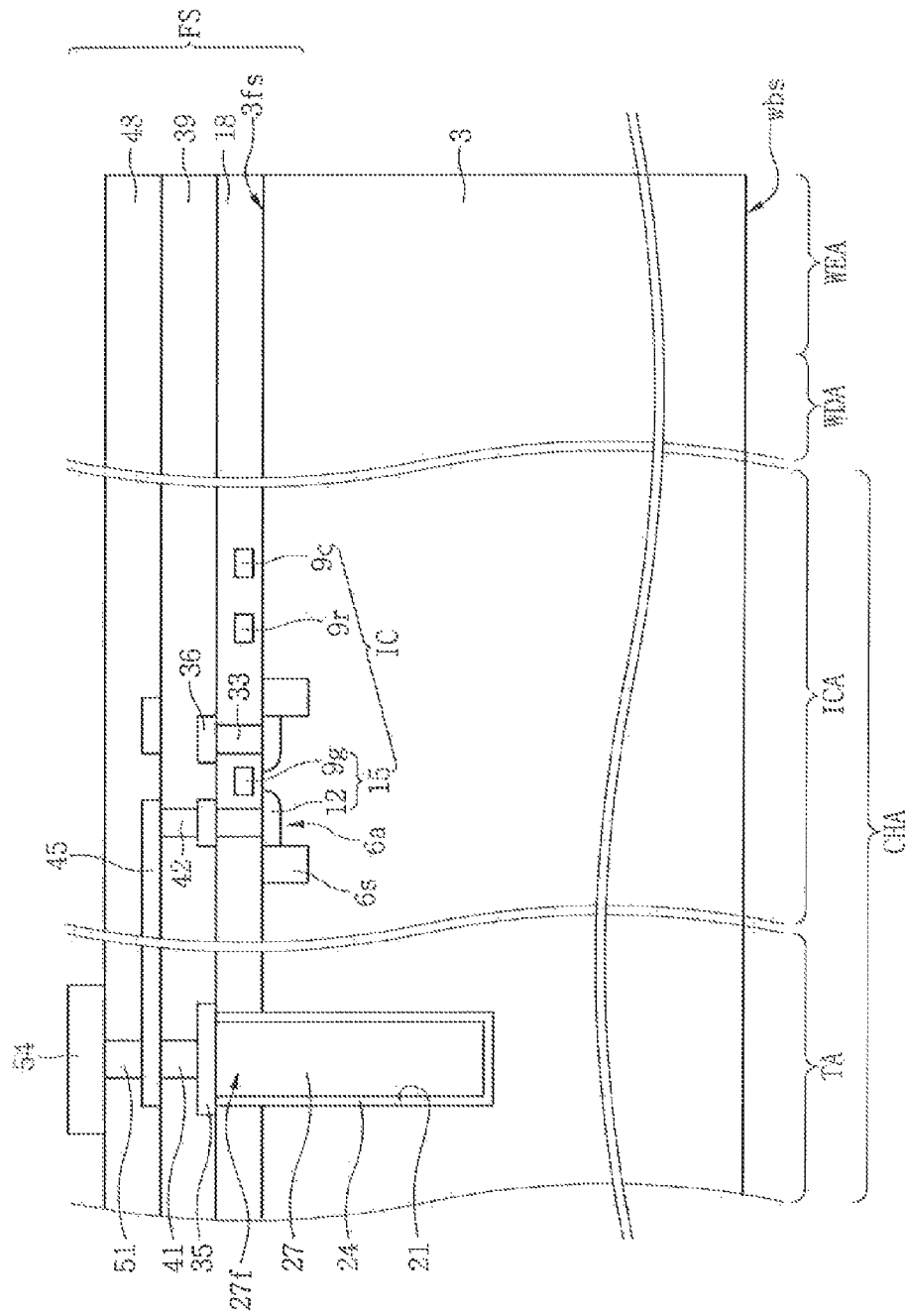

Referring to FIGS. 5 and 6A, an example of a method of forming a semiconductor device in accordance with an exemplary embodiment of the present inventive concept may include preparing the semiconductor substrate 3 having the first side 3fs and a second side wbs facing the first side 3fs. The example of a method of forming a semiconductor device in accordance with an exemplary embodiment of the present inventive concept may include forming the through-via structure 27, the via insulating layer 24, and the front-side structure FS.

The semiconductor substrate 3 may be a semiconductor wafer including a semiconductor material such as silicon. In the semiconductor substrate 3, the first side 3fs may be a front side, and the second side wbs may be a back side.

The semiconductor substrate 3 may include a plurality of chip areas CHA, a scribe lane area SRA, a dummy area WDR, and a wafer edge area WEA. The chip areas CHA may be spaced apart from each other by the scribe lane area SRA. Each of the chip areas CHA may include the TSV area TA, and the circuit area ICA. The scribe lane area SRA may include a cutting area for dividing the chip areas CHA. The wafer edge area WEA may be an end area of the semiconductor substrate 3. The wafer edge area WEA may have a constant width with respect to an outermost part of the semiconductor substrate 3. The wafer edge area WEA may be spaced apart from the chip areas CHA. The dummy area WDR may be located between the wafer edge area WEA and the chip areas CHA.

The formation of the front-side structure FS may include forming the internal circuit IC, conductive plugs 33, 41, 42, and 51, the via metal pattern 35, metal interconnections 36 and 45, front-side insulating layers 18, 39 and 48, and the front-side conductive pattern 54.

The conductive plugs 33, 41, 42 and 51 may include the lower conductive plug 33, the first intermediate conductive plug 41, the second intermediate conductive plug 42, and the upper conductive plug 51. The metal interconnections 36 and 45 may include the lower metal interconnection 36, and the upper metal interconnection 45. The front-side insulating layers 18, 39, and 48 may include the lower front-side insulating layer 18, the intermediate front-side insulating layer 39, and the upper front-side insulating layer 48.

The formation of the internal circuit IC may include forming unit devices 15, 9r, and 9c in the circuit area ICA of the first side 3fs of the semiconductor substrate 3. The unit devices 15, 9r, and 9c may include devices such as the MOS transistor, the resistor, or the capacitor. For example, one of the unit devices 15, 9r, and 9c may be the transistor 15. The transistor 15 may include the gate structure 9g and source/drain areas 12. The gate structure 9g may be formed on the active area 6a of the first side 3fs of the semiconductor substrate 3, and the source/drain areas 12 may be formed in the active area 6a of two sides of the gate structure 9g. The active area 6a may be defined by the isolating area 6s formed on the first side 3fs of the semiconductor substrate 3.

The formation of the front-side structure FS may include forming the lower front-side insulating layer 18 on the first side 3fs of the semiconductor substrate 3 having the unit devices 15, 9r, and 9c, forming the lower conductive plug 33 passing through the lower front-side insulating layer 18, forming the via metal pattern 35 and the lower metal interconnection 36 on the lower front-side insulating layer 18, and forming the intermediate front-side insulating layer 39 configured to cover the via metal pattern 35 and the lower metal interconnection 36 on the lower front-side insulating layer 18.

The formation of the front-side structure FS may include forming the first and second conductive plugs 41 and 42 passing through the intermediate front-side insulating layer 39, forming the upper metal interconnection 45 on the intermediate front-side insulating layer 39, forming the upper front-side insulating layer 48 configured to cover the upper metal interconnection 45 on the intermediate front-side insulating layer 39, forming the upper conductive plug 51 passing through the upper front-side insulating layer 48, and forming the front-side conductive pattern 54 on the upper front-side insulating layer 48.

The formation of the via insulating layer 24 and the through-via structure 27 may include forming a through-via-hole 21 configured to pass through the lower front-side insulating layer 18 and extend to the inside of the semiconductor substrate 3, forming the via insulating layer 24 on an inner wall of the through-via-hole 21, forming a conductive layer configured to fill the through-via-hole 21 on the via insulating layer 24, and planarizing the conductive layer. The through-via structure 27 may include the planarized conductive layer formed in the through-via-hole 21. A bottom of the through-via-hole 21 may be spaced apart from the second side wbs of the semiconductor substrate 3. The via insulating layer 24 may cover a bottom and a side surface of the through-via structure 27. The via insulating layer 24 may include a part interposed between the through-via structure 27 and the semiconductor substrate 3. The through-via structure 27 may include a front-side protruding part 27f protruding from the first side 3fs of the semiconductor substrate 3.

The lower conductive plug 33 may be interposed between any of the unit devices 15, 9r, and 9c, and the lower metal interconnection 36, and may electrically connect any of the unit devices 15, 9r, and 9c to the lower metal interconnection 36.

The via metal pattern 35 may be electrically connected to the through-via structure 27.

The first intermediate conductive plug 41 may electrically connect the via metal pattern 35 with the upper metal interconnection 45 by being interposed between the via metal pattern 35 and the upper metal interconnection 45. The second intermediate conductive plug 42 may electrically connect the lower metal interconnection 36 with the upper metal interconnection 45 by being interposed between the lower metal interconnection 36 and the upper metal interconnection 45. The upper conductive plug 51 may electrically connect the upper metal interconnection 45 with the front-side conductive pattern 54 by being interposed between the upper metal interconnection 45 and the front-side conductive pattern 54.

The through-via structure 27 and the internal circuit IC may be electrically connected to each other through the metal interconnections 36 and 45, and the conductive plugs 33, 41 and 42. The front-side conductive pattern 54 may be electrically connected to the through-via structure 27 and the internal circuit IC through the metal interconnections 36 and 45, and the conductive plugs 33, 41, 42, and 51.

Referring to FIGS. 5 and 6B, the example of a method of forming a semiconductor device in accordance with an exemplary embodiment of the present inventive concept may include reducing a thickness of the semiconductor substrate 3 by partially removing the semiconductor substrate 3. The reduction of the thickness of the semiconductor substrate 3 may include grinding the second side wbs (see e.g., FIG. 6A) of the semiconductor substrate 3 so that the through-via structure 27 is not exposed using a back-grinding process. Therefore, the semiconductor substrate 3 may have a grinded second side wbs'.

Figure 6C:
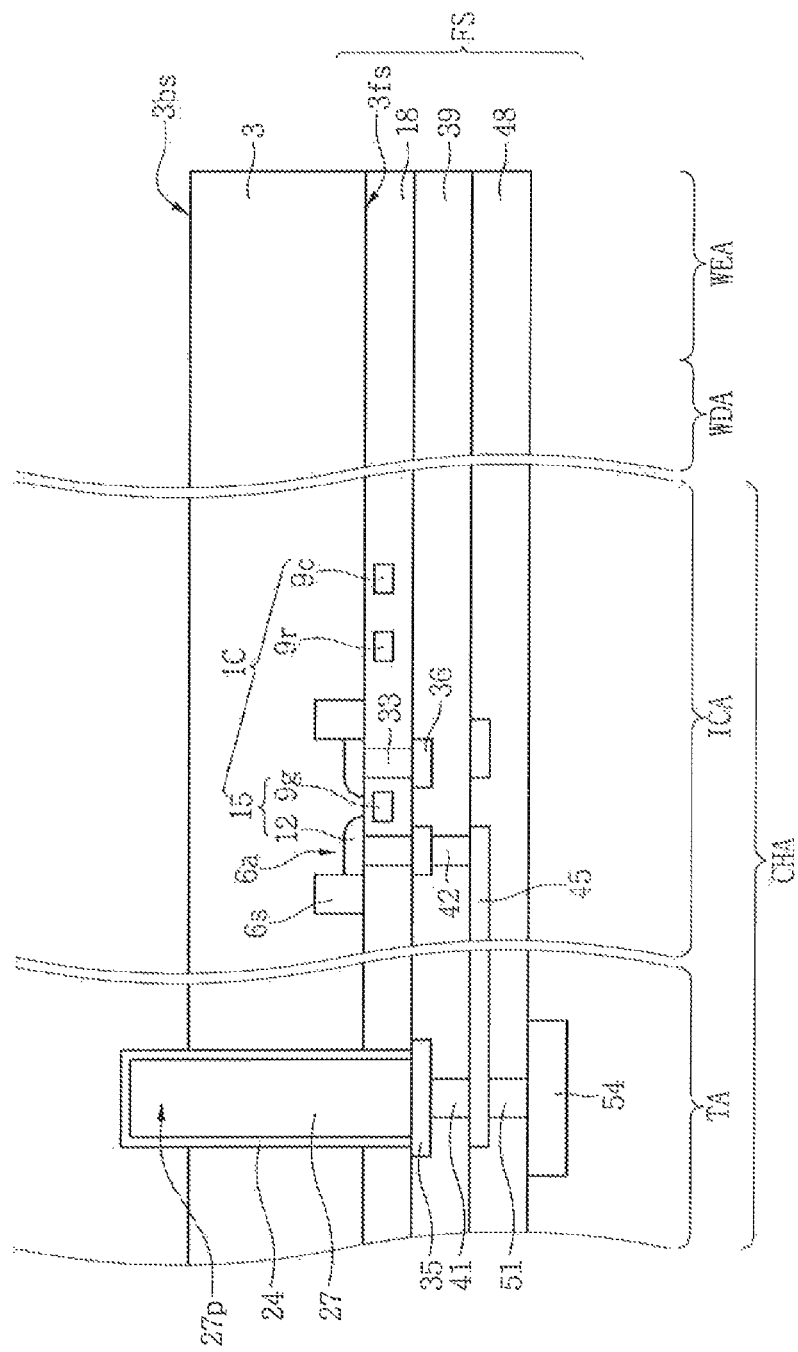

Referring to FIGS. 5 and 6C, the example of a method of forming a semiconductor device in accordance with an exemplary embodiment of the present inventive concept may include etching the second side wbs' (see e.g., FIG. 6B) of the semiconductor substrate 3 until the through-via structure 27 and the via insulating layer 24 protrude. Therefore, the semiconductor substrate 3 may have a second side 3bs formed by etching, and the through-via structure 27 may have the back-side protruding part 27p protruding from the second side 3bs of the semiconductor substrate 3 whose thickness is reduced.

The example of a method of forming a semiconductor device in accordance with an exemplary embodiment of the present inventive concept may include forming the through-via structure 27 configured to pass through the semiconductor substrate 3 having a first side 3fs and the second side 3bs facing the first side 3fs, and having the back-side protruding part 27p protruding from the second side 3bs of the semiconductor substrate 3 (see e.g., step S1010 shown in FIG. 4).

Referring to FIGS. 5 and 6D, the example of a method of forming a semiconductor device in accordance with an exemplary embodiment of the present inventive concept may include forming the passivation layer 105 (see e.g., step S1020 shown in FIG. 4).

The forming of the passivation layer 105 may include forming an insulating material layer such as a silicon oxide layer on the second side 3bs of the semiconductor substrate 3. The passivation layer 105 may cover the second side 3bs of the semiconductor substrate 3, the back-side protruding part 27p of the through-via structure 27 protruding from the second side 3bs of the semiconductor substrate 3, and the via insulating layer 24 configured to cover the back-side protruding part 27p.

A first distance D1 from the second side 3bs of the semiconductor substrate 3 to an upper surface of the back-side protruding part 27p may be greater than a second distance D2 from the second side 3bs of the semiconductor substrate 3 to an upper surface of the passivation layer 105 located on the circuit area ICA. The upper surface of the back-side protruding part 27p may be spaced apart from the second side 3bs of the semiconductor substrate 3 by the first distance D1, and the upper surface of the passivation layer 105 located on the circuit area ICA may be spaced apart from the second side 3bs of the semiconductor substrate 3 by the second distance D2, which may be smaller than the first distance D1. The size of a height (e.g., the first distance D1) of the back-side protruding part 27p may be greater than that of a thickness (e.g., the second distance D2) of the passivation layer 105.

Figure 6E:
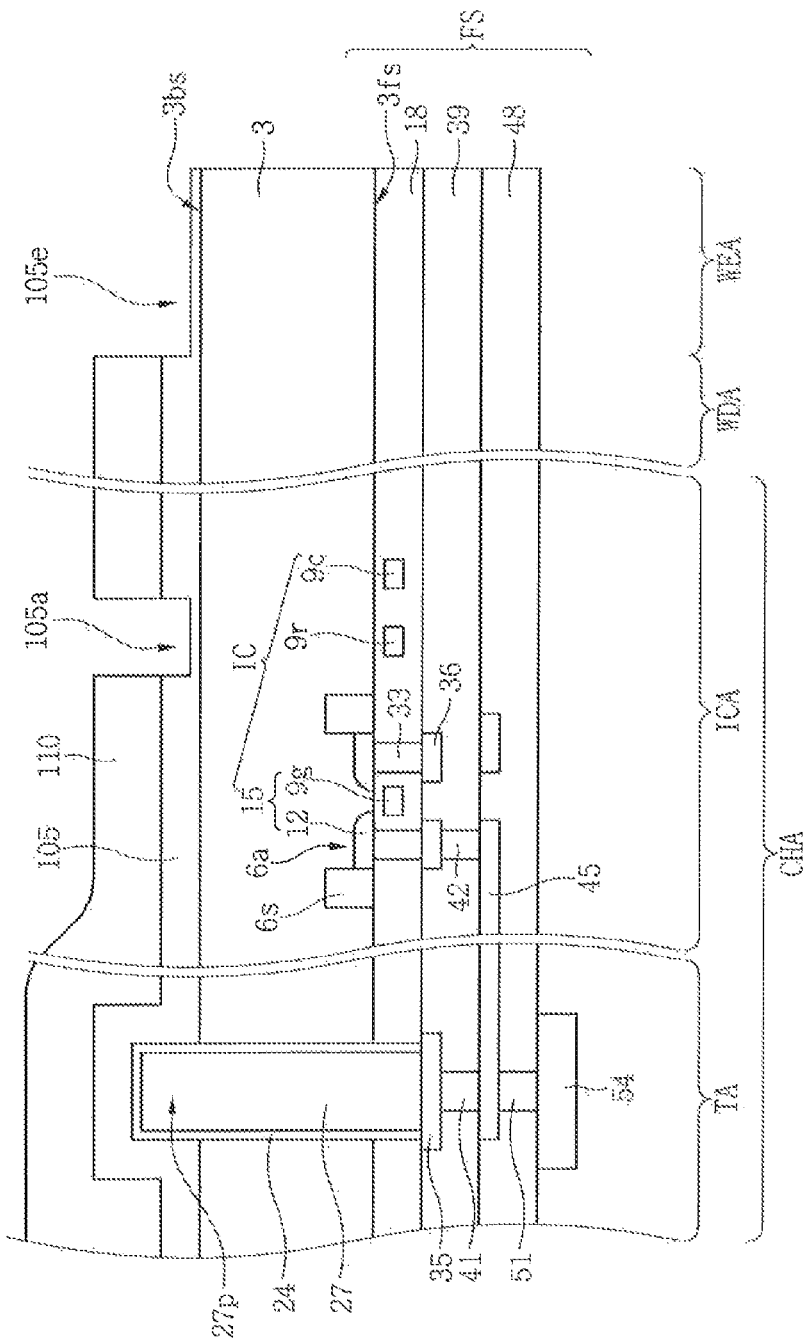

Referring to FIGS. 5 and 6E, the example of a method of forming a semiconductor device in accordance with an exemplary embodiment of the present inventive concept may include forming the alignment recessed area 105a and an edge recessed area 105e by performing photolithography and etching processes (see e.g., step S1030 shown in FIG. 4).

The forming of the alignment recessed area 105a and the edge recessed area 105e may include forming a mask pattern 110 on the passivation layer 105 by performing the photolithography process, and etching the passivation layer 105 by performing the etching process using the mask pattern 110 as an etching mask. The mask pattern 110 may be formed using a photoresist pattern.

Bottoms of the alignment recessed area 105a and the edge recessed area 105e may be formed in the passivation layer 105. The bottoms of the alignment recessed area 105a and the edge recessed area 105e may be spaced apart from the second side 3bs of the semiconductor substrate 3.

The edge recessed area 105e may be formed in the wafer edge area WEA of the semiconductor substrate 3. The alignment recessed area 105a may be formed in the chip area CHA of the semiconductor substrate 3.

Figure 6F:
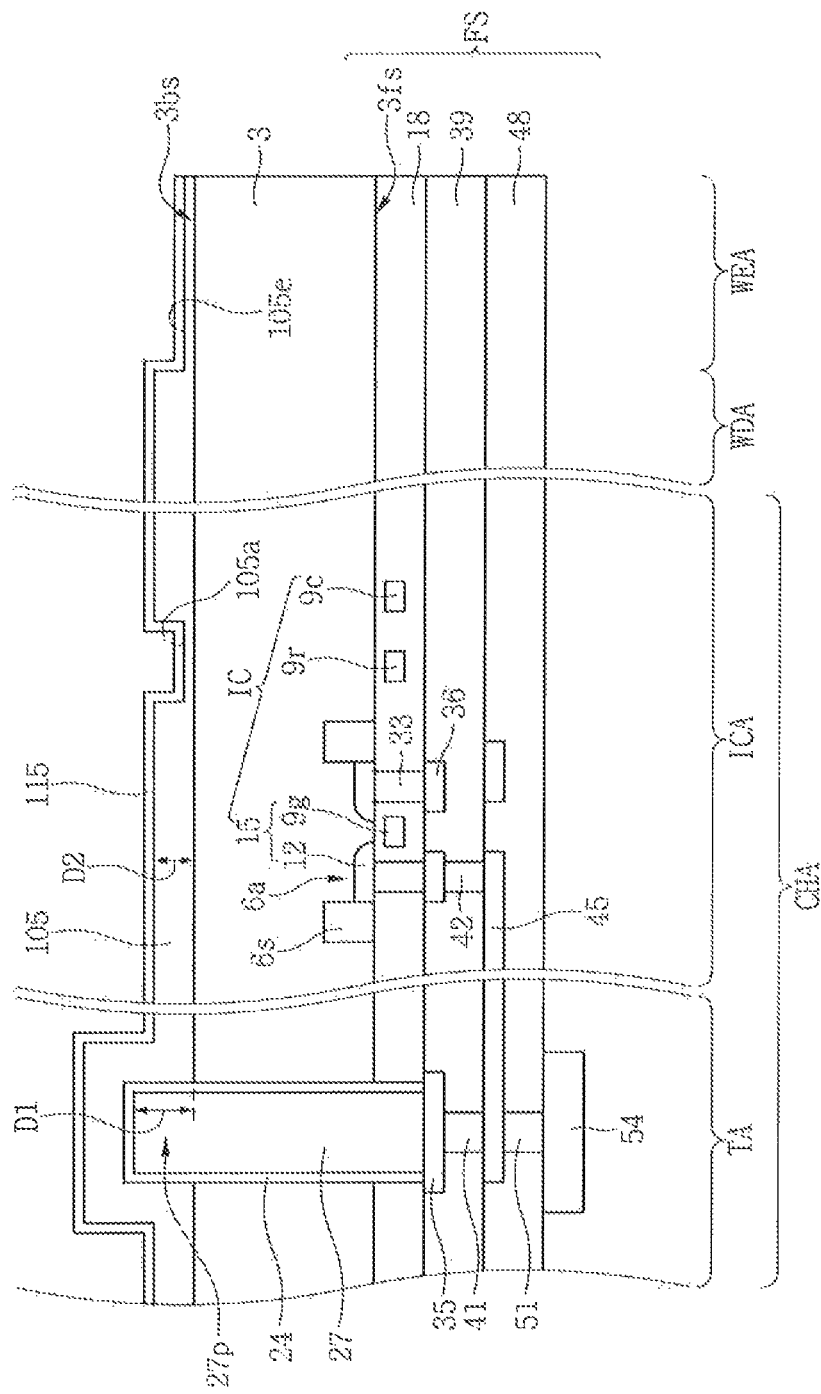

Referring to FIGS. 5 and 6F, the example of a method of forming a semiconductor device in accordance with an exemplary embodiment of the present inventive concept may include removing the mask pattern 110 (see e.g., FIG. 6E). When the mask pattern 110 (see e.g., FIG. 6E) is formed using the photoresist pattern, the mask pattern 110 (see e.g., FIG. 6E) may be removed using an ashing process.

When the edge recessed area 105e is formed by etching the passivation layer 105 formed in the wafer edge area WEA, a failure rate may be reduced by particles from the passivation layer 105 located in the wafer edge area WEA during removal of the mask pattern 110 (see e.g., FIG. 6E) using the ashing process.

The example of a method of forming a semiconductor device in accordance with an exemplary embodiment of the present inventive concept may include forming a protection layer 115 (see e.g., step S1040 shown in FIG. 4).

The protection layer 115 may be formed on the second side 3bs of the semiconductor substrate 3 having the alignment recessed area 105a and the edge recessed area 105e. The protection layer 115 may be conformally formed on the passivation layer 105 in which the alignment recessed area 105a and the edge recessed area 105e are formed. The protection layer 115 may cover the alignment recessed area 105a and the edge recessed area 105e. The protection layer 115 may be formed to have a smaller thickness than the passivation layer 105. The protection layer 115 may be formed to have a smaller thickness than a half width of the alignment recessed area 105a.

The protection layer 115 may include an oxide-based insulating layer, a nitride-based insulating layer, or a polymer-based insulating layer. The protection layer 115 may include an insulating oxide, an insulating nitride, or an insulating polymer. For example, the protection layer 115 may include silicon oxide, silicon nitride, or a polyimide.

The protection layer 115 may include a different material from the passivation layer 105. The protection layer 115 may include a different material from the passivation layer 105. For example, when the passivation layer 105 includes silicon oxide, the protection layer 115 may include silicon nitride.

Figure 6G:
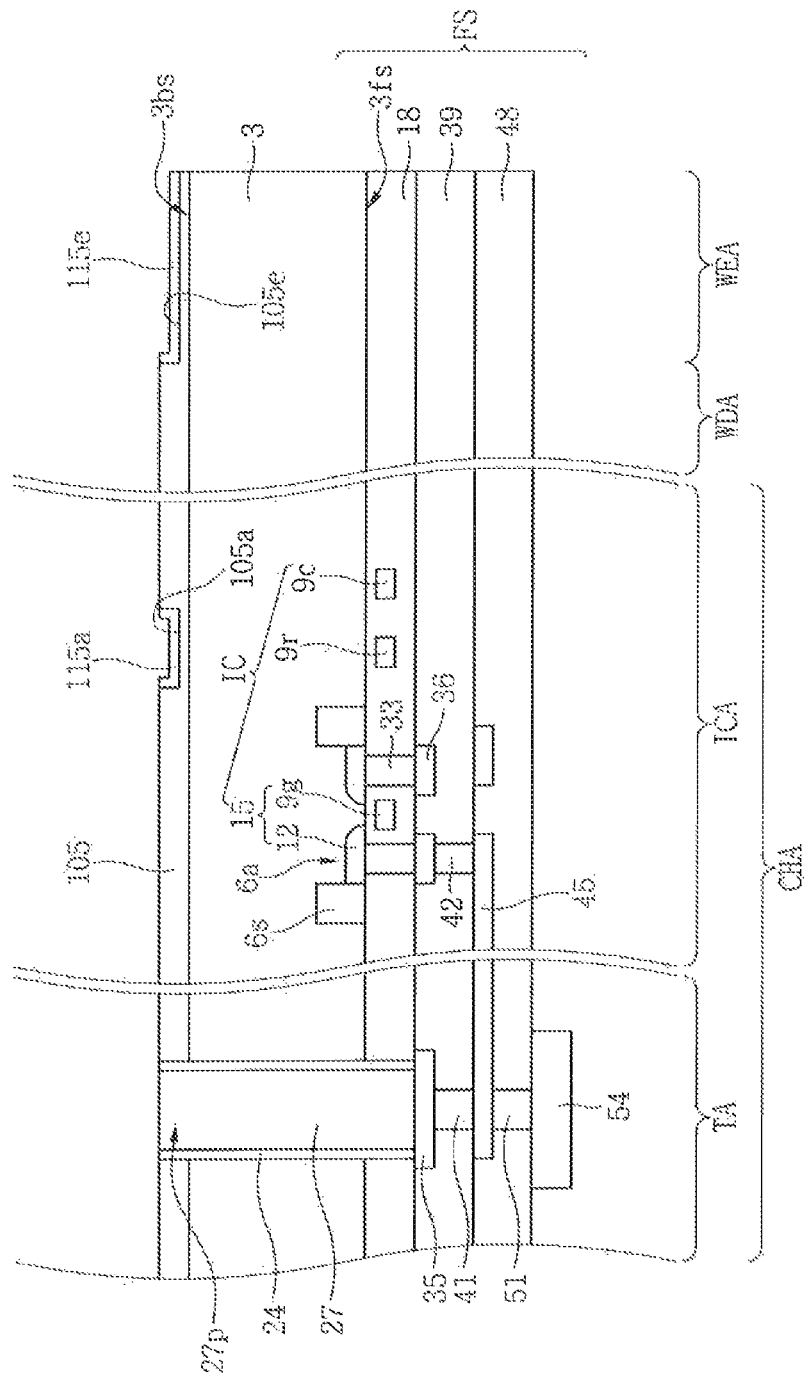

Referring to FIGS. 5 and 6G, the example of a method of forming a semiconductor device in accordance with an exemplary embodiment of the present inventive concept may include exposing the through-via structure 27 (see e.g., S1050 shown in FIG. 4).

The exposure of the through-via structure 27 may include performing the planarization process on the semiconductor substrate 3 on which the protection layer 115 (see e.g., FIG. 6F) is formed. The exposure of the through-via structure 27 may include removing the via insulating layer 24, the passivation layer 105, and the protection layer 115 (see e.g., FIG. 6F), which may be located on an upper part of the through-via structure 27, by performing the planarization process. The planarization process may be the CMP process.

The protection layer 115 (see e.g., FIG. 6F) located on the upper surface of the passivation layer 105 may be removed by performing the planarization process for exposing the through-via structure 27, the protection layer 115 (see e.g., FIG. 6F) located in the alignment recessed area 105a may be retained and formed to be the alignment pattern 115a, and the protection layer 115 (see e.g., FIG. 6F) located in the edge recessed area 105e may be retained and formed to be an edge pattern 115e.

The planarized passivation layer 105 may be formed to cover a side surface of the back-side protruding part 27p of the through-via structure 27. The via insulating layer 24 may be interposed between the planarized passivation layer 105 and the back-side protruding part 27p of the through-via structure 27.

In exemplary embodiments of the present inventive concept, the protection layer 115 (see e.g., FIG. 6F) and the edge pattern 115e may protect the wafer edge area WEA of the semiconductor substrate 3 during the planarization process for exposing the through-via structure 27.

The protection layer 115 (see e.g., FIG. 6F) and the edge pattern 115e may protect the wafer edge area WEA of the semiconductor substrate 3 from an edge stress of the wafer edge area WEA of the semiconductor substrate 3 caused by performing the planarization process for exposing the through-via structure 27. For example, the protection layer 115 (see e.g., FIG. 6F) and the edge pattern 115e may reduce the occurrence of a crack or a chipping failure in the wafer edge area WEA of the semiconductor substrate 3 caused during the planarization process for exposing the through-via structure 27. Therefore, the protection layer 115 (see e.g., FIG. 6F) may increase yield and throughput of the semiconductor device.

The protection layer 115 (see e.g., FIG. 6F), the edge pattern 115e, and the alignment pattern 115a may reduce a thickness loss or an occurrence of a recess in the passivation layer 105 during the planarization process for exposing the through-via structure 27.

The protection layer 115 (see e.g., FIG. 6F), the edge pattern 115e, and the alignment pattern 115a may reduce a thickness loss or an occurrence of a recess in the back-side protruding part 27p of the through-via structure 27 during the planarization process for exposing the through-via structure 27.

The planarization process for exposing the through-via structure 27 may include preferentially removing the via insulating layer 24, the passivation layer 105, and the protection layer 115 (see e.g., FIG. 6F), which may be located on the upper part of the back-side protruding part 27p of the through-via structure 27, exposing the back-side protruding part 27p of the through-via structure 27, and planarizing the protection layer 115 until the upper surface of the passivation layer 105 located in the circuit area ICA and a wafer dummy area WDA is exposed.

The protection layer 115 (see e.g., FIG. 6F), the edge pattern 115e, and the alignment pattern 115a may be relatively thin when the thickness of the passivation layer 105 is reduced during the planarization process. In the process of forming the passivation layer 105, such as illustrated, for example, in FIG. 6D, the passivation layer 105 may be formed to minimize the thickness thereof. The back-side protruding part 27p of the through-via structure 27 may be formed to minimize the height thereof.

The alignment pattern 115a may reduce dishing on the passivation layer 105 from occurring during the planarization process for exposing the through-via structure 27. For example, the alignment pattern 115a may be formed on the second side 3bs of the semiconductor substrate 3 in the circuit area ICA, and may serve as a planarization supporter during the planarization process, and thus dishing may be prevented on the passivation layer 105 formed on the second side 3bs of the semiconductor substrate 3 in the circuit area ICA. The alignment pattern 115a may reduce degradation of a thickness distribution characteristic of the passivation layer 105.

The protection layer 115 (see e.g., FIG. 6F), the edge pattern 115e, and the alignment pattern 115a according to exemplary embodiments of the present inventive concept may increase yield and throughput of the semiconductor device.

Figure 6H:
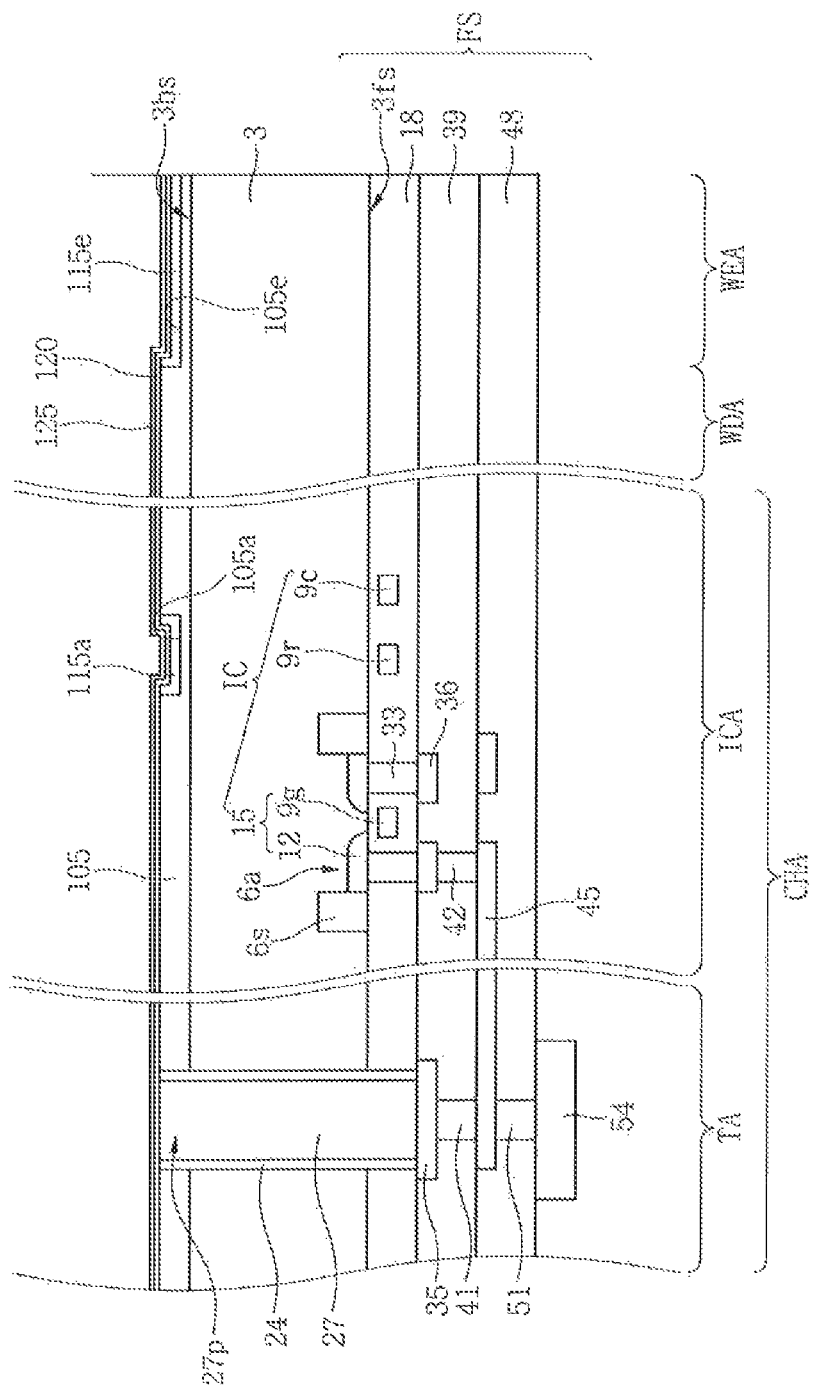

Referring to FIGS. 5 and 6H, the example of a method of forming a semiconductor device in accordance with an exemplary embodiment of the present inventive concept may include forming the lower back-side conductive layer 120 and the intermediate back-side conductive layer 125 on the second side 3bs of the semiconductor substrate 3 having the alignment pattern 115a and the edge pattern 115e.

The lower back-side conductive layer 120 may be a barrier layer including a conductive material such as Ti, TiN, TiW, Ta, TaN, or WN. The intermediate back-side conductive layer 125 may be a seed layer including a metal such as Cu, Ru, Ni, or W and formed using a deposition process.

Figure 6I:
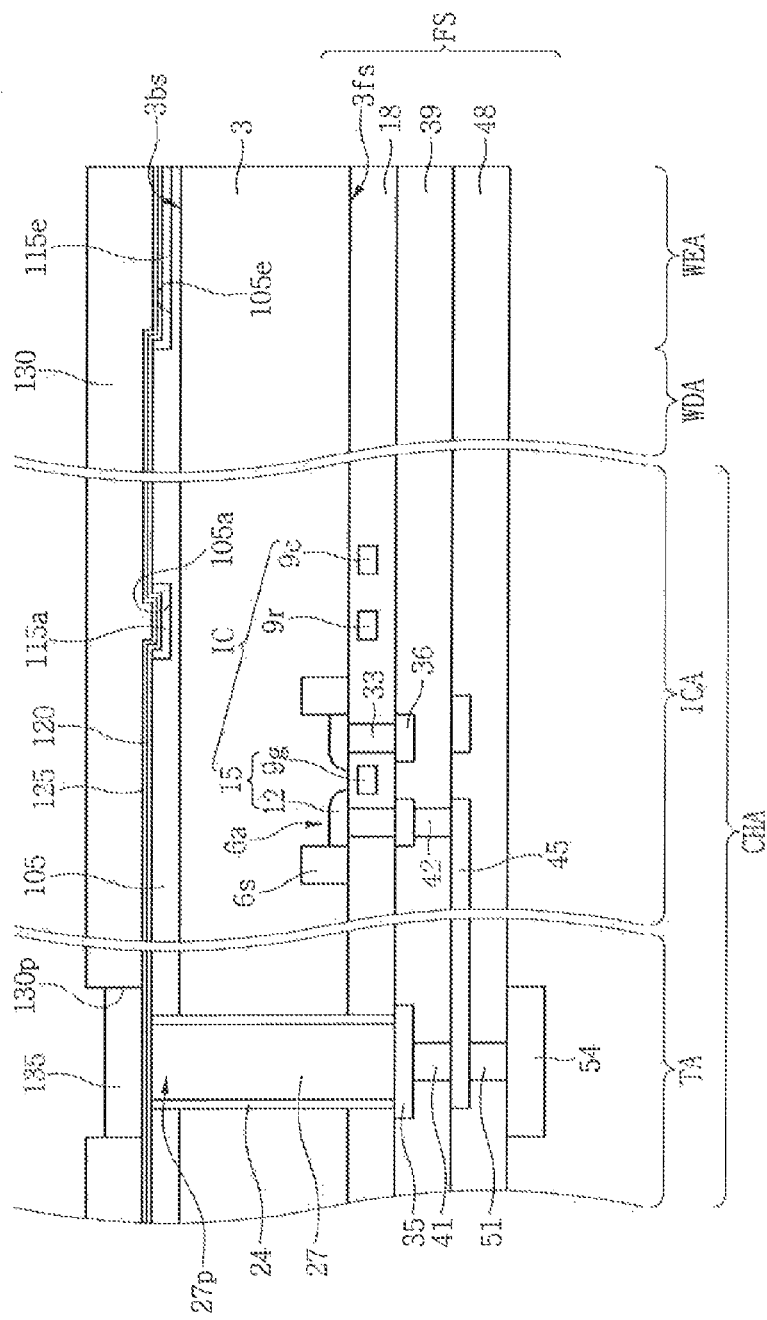

Referring to FIGS. 5 and 6I, the example of a method of forming a semiconductor device in accordance with an exemplary embodiment of the present inventive concept may include forming the upper back-side conductive pattern 135 (see e.g., step S1060 shown in FIG. 4).

The forming of the upper back-side conductive pattern 135 may include forming a back-side pad mask pattern 130, which may have an opening part 130p configured to expose a part of the intermediate back-side conductive layer 125 disposed on the upper part of the through-via structure 27 on the intermediate back-side conductive layer 125, and may include forming a conductive material layer in the opening part 130p. The back-side pad mask pattern 130 may be formed using the photoresist pattern. The upper back-side conductive pattern 135 may be formed by performing a plating process in which the intermediate back-side conductive layer 125 exposed by the opening part 130p is a seed. The upper back-side conductive pattern 135 may include Ni, Cu, Au, or a combination thereof.

Figure 6J:
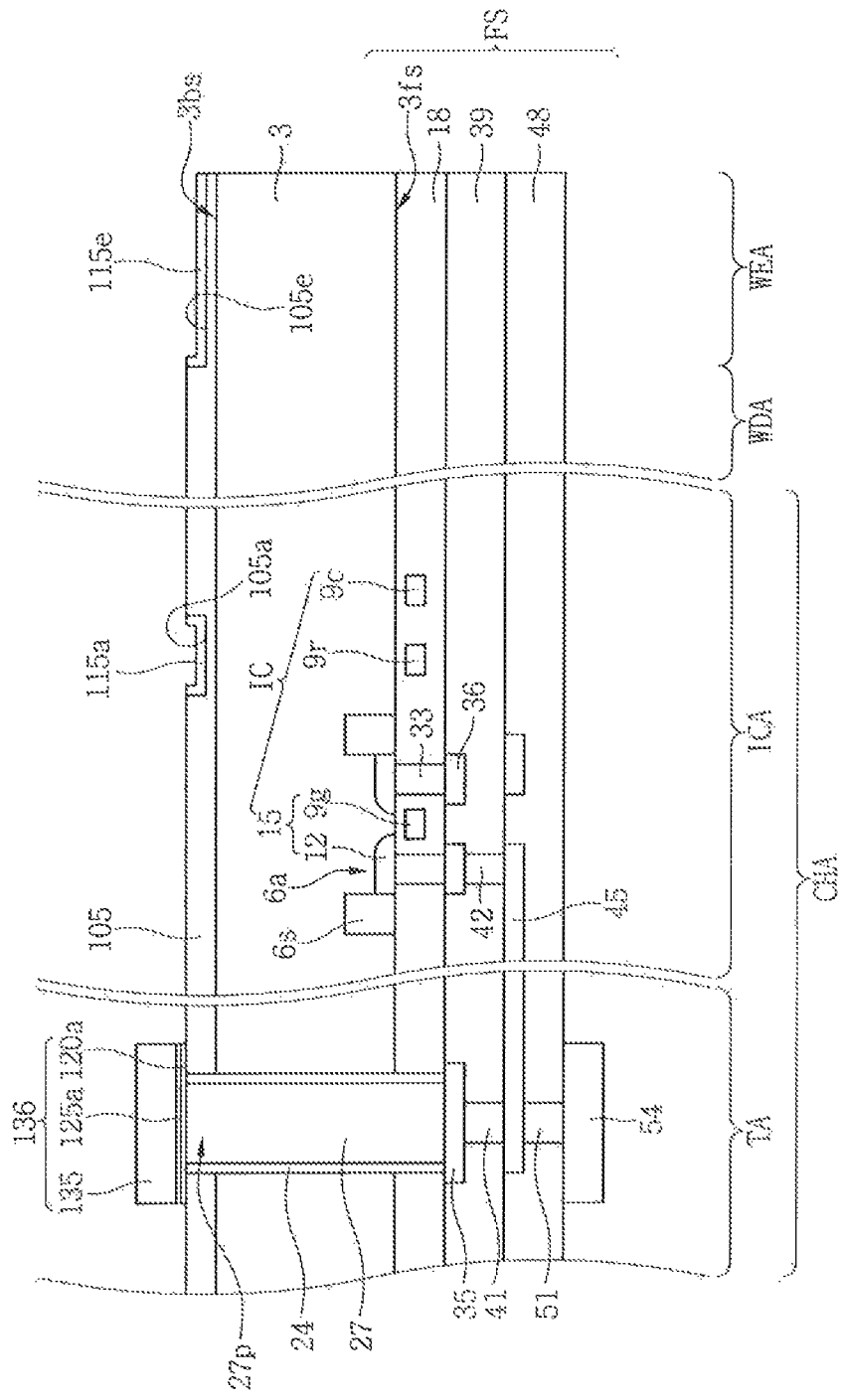

Referring to FIGS. 5 and 6J, the example of a method of forming a semiconductor device in accordance with an exemplary embodiment of the present inventive concept may include removing the back-side pad mask pattern 130 (see e.g., FIG. 6I), and the intermediate back-side conductive layer 125 (see e.g., FIG. 6I) and the lower back-side conductive layer 120 (see e.g., FIG. 6I), which may be disposed under the back-side pad mask pattern 130 (see e.g., FIG. 6I).

The intermediate back-side conductive layer 125 (see e.g., FIG. 6I) and the lower back-side conductive layer 120 (see e.g., FIG. 6I) may be removed by the etching process. The back-side conductive pattern 136, that may include the lower back-side conductive pattern 120a, the intermediate back-side conductive pattern 125a, and the upper back-side conductive pattern 135 which may be sequentially stacked, may be formed.

Referring again to FIGS. 1A, 1B, and 4, the example of a method of forming a semiconductor device in accordance with an exemplary embodiment of the present inventive concept may include performing the chip dividing process (see e.g., step S1070 shown in FIG. 4). The chip area CHA of the semiconductor substrate 3 may be divided by the chip dividing process. The example of a method of forming the semiconductor device in accordance with an exemplary embodiment of the present inventive concept may include forming the semiconductor package (see e.g., step S1080 shown in FIG. 4). The semiconductor package may be formed using the semiconductor substrate 3 having the divided chip area CHA. In accordance with the example of a method of forming the semiconductor device in accordance with an exemplary embodiment of the present inventive concept, the semiconductor device (e.g., the semiconductor device 100 shown in FIGS. 1A and 1B) may be formed.

An example of a method of forming a semiconductor device in accordance with an exemplary embodiment of the present inventive concept will be described with reference to FIGS. 5, and 7A to 7D.

Referring to FIGS. 5 and 7A, an example of a method of forming a semiconductor device in accordance with an exemplary embodiment of the present inventive concept may include forming the through-via structure 27 configured to pass through the semiconductor substrate 3 having the first side 3fs and the second side 3bs facing the first side 3fs, and having the back-side protruding part 27p protruding from the second side 3bs of the semiconductor substrate 3 using the same method as that described with reference to FIGS. 6A to 6C (see e.g., step S1010 shown in FIG. 4).

An example of a method of forming a semiconductor device in accordance with an exemplary embodiment of the present inventive concept may include forming the passivation layer 105 on the second side 3bs of the semiconductor substrate 3 as described with reference to FIG. 6D (see e.g., step S1020 shown in FIG. 4).

An example of a method of forming a semiconductor device in accordance with an exemplary embodiment of the present inventive concept may include forming a mask pattern 210 having a top opening part 210t, an alignment opening part 210a, and an edge opening part 210e on the passivation layer 105.

The mask pattern 210 may be formed by the photolithography process using the photoresist pattern.

The top opening part 210t of the mask pattern 210 may expose a part of the passivation layer 105 disposed on the upper part of the through-via structure 27. The alignment opening part 210a of the mask pattern 210 may be spaced apart from the TSV area TA and may expose a part of the passivation layer 105 disposed in the chip area CHA of the semiconductor substrate 3. The edge opening part 210e of the mask pattern 210 may expose the passivation layer 105 disposed in the wafer edge area WEA of the semiconductor substrate 3.

Figure 7B:
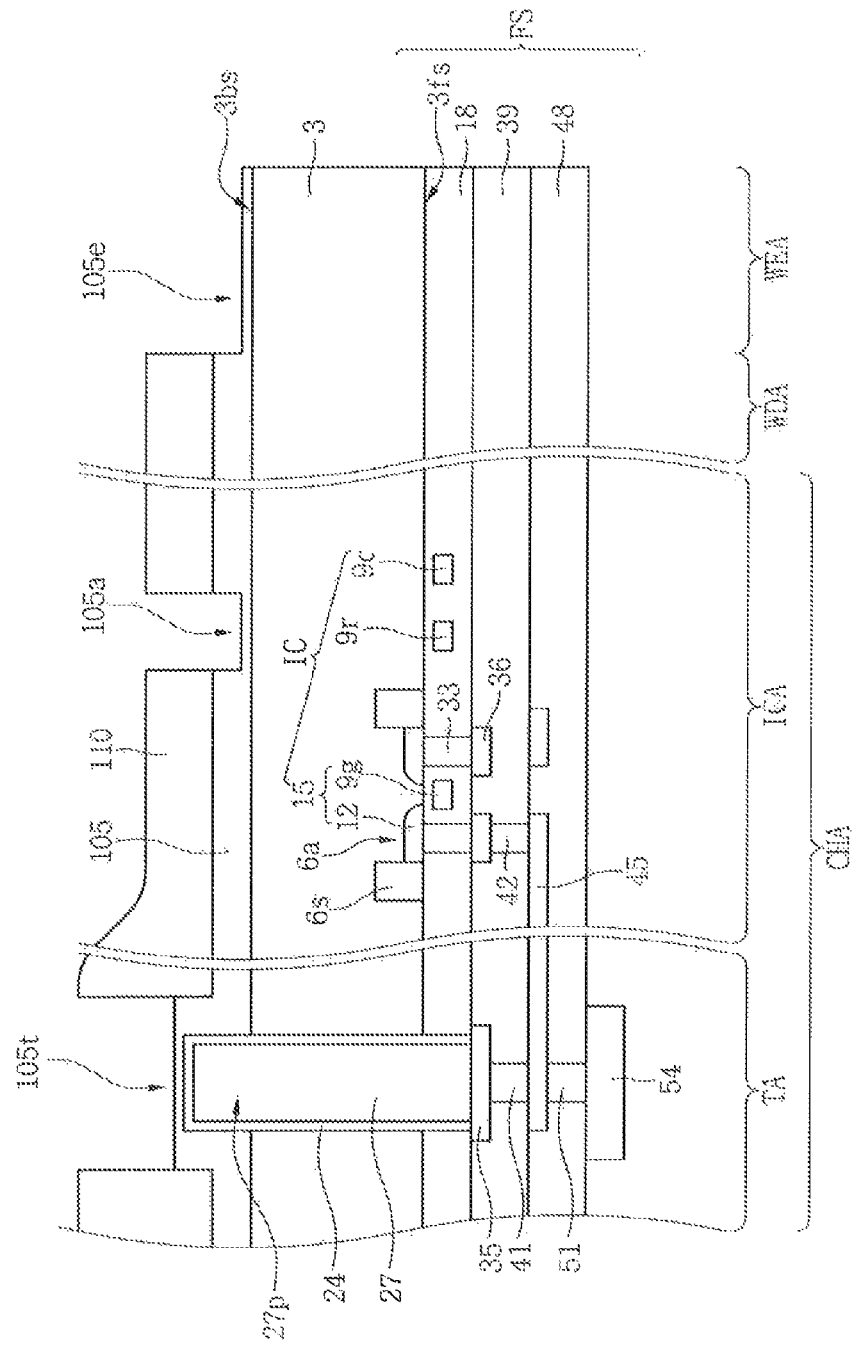

Referring to FIGS. 5 and 7B, an example of a method of forming a semiconductor device in accordance with an exemplary embodiment of the present inventive concept may include forming a top part 105t, the alignment recessed area 105a, and the edge recessed area 105e, of which thicknesses may be reduced by partially etching the passivation layer 105 by performing the etching process using the mask pattern 210 as an etching mask. The thickness of the top part 105t may be reduced by etching the part of the passivation layer 105 disposed on the upper part of the through-via structure 27. Bottoms of the alignment recessed area 105a and the edge recessed area 105e may be spaced apart from the second side 3bs of the semiconductor substrate 3. The edge recessed area 105e may be formed in the wafer edge area WEA of the semiconductor substrate 3. The alignment recessed area 105a may be formed in the chip area CHA of the semiconductor substrate 3.

Figure 7C:
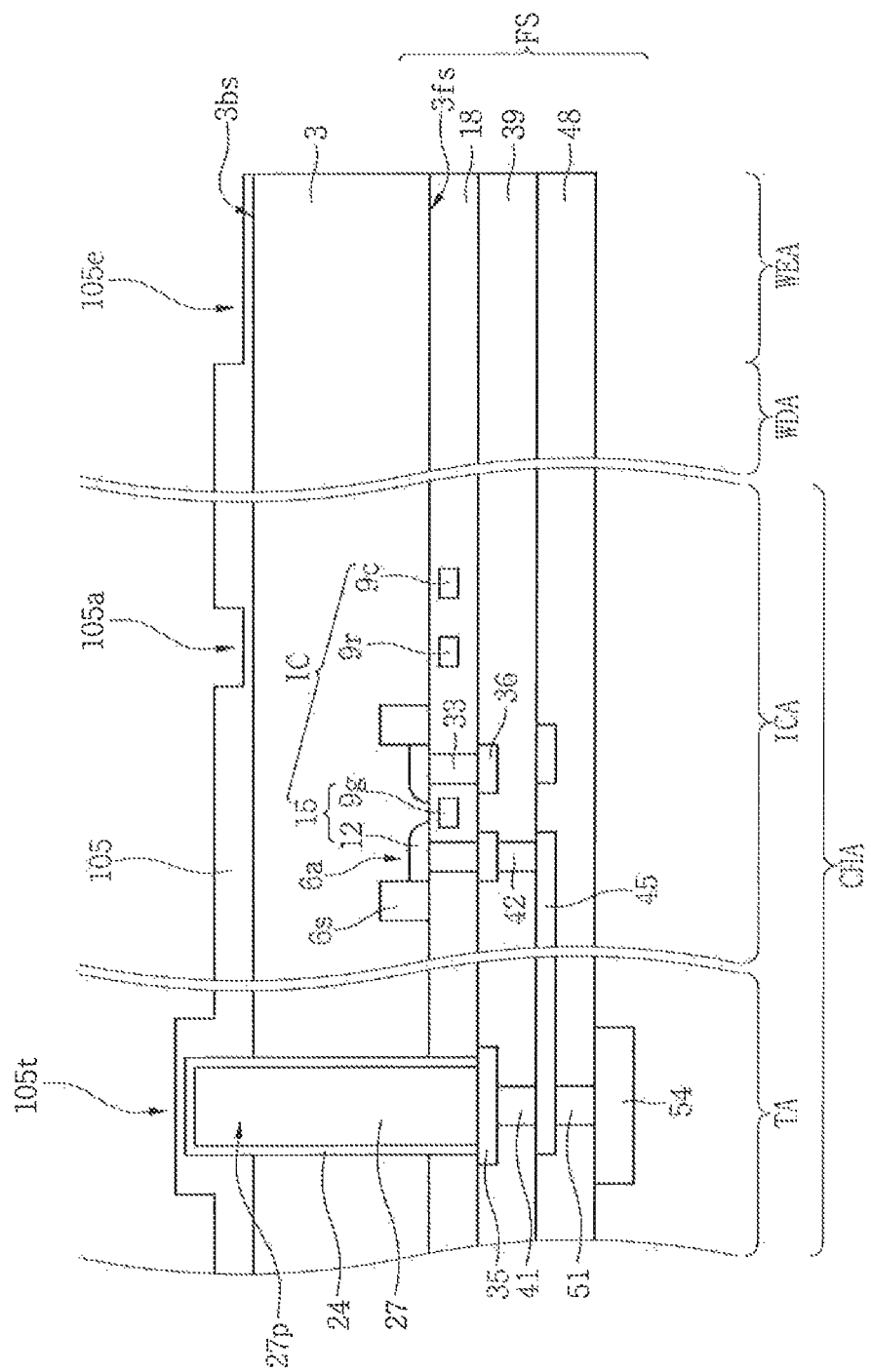

Referring to FIGS. 5 and 7C, an example of a method of forming a semiconductor device in accordance with an exemplary embodiment of the present inventive concept may include removing the mask pattern 110 (see e.g., FIG. 7B). When the mask pattern 110 (see e.g., FIG. 7B) is formed using the photoresist pattern, the mask pattern 110 (see e.g., FIG. 7B) may be removed by performing the ashing process.

Figure 7D:
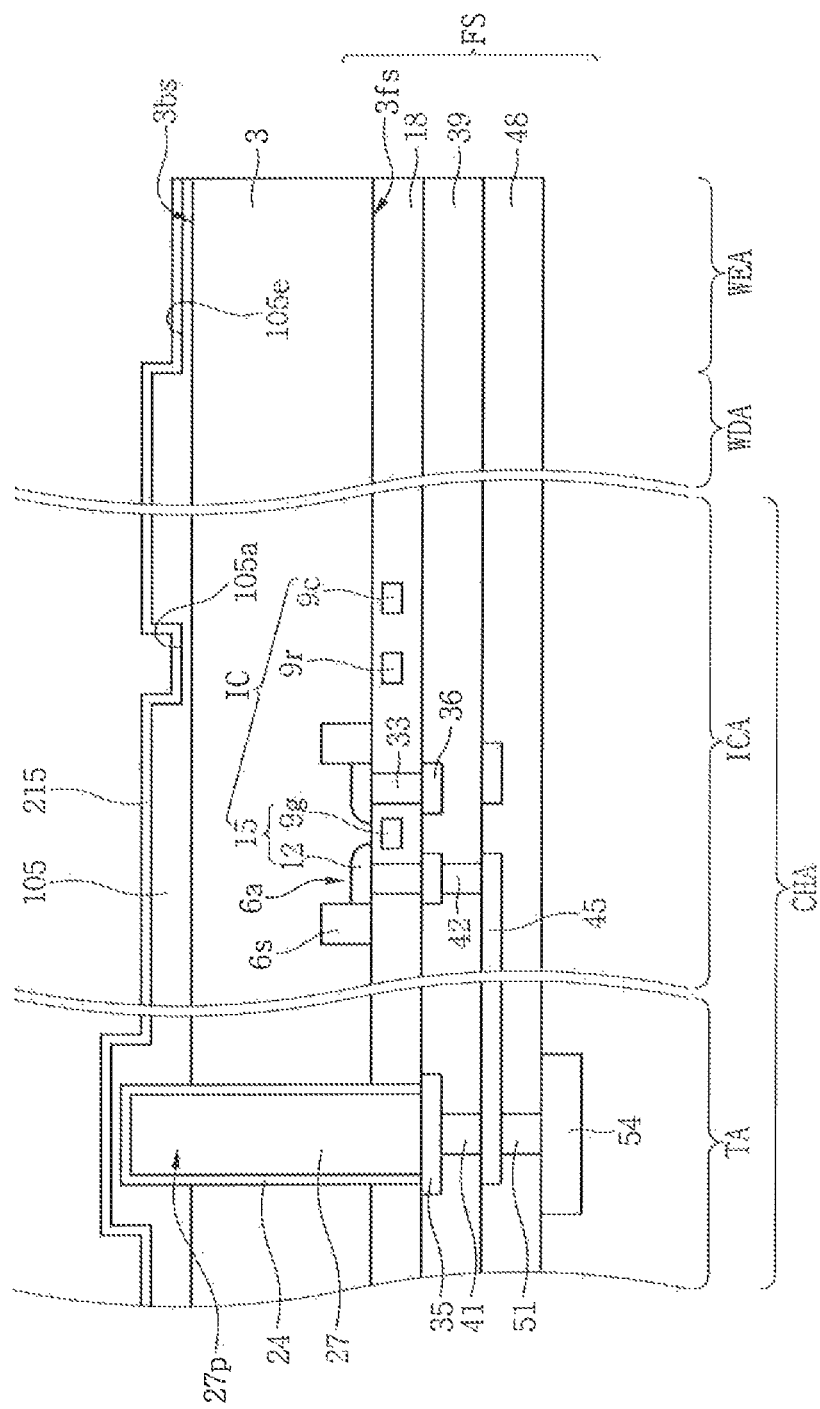

Referring to FIGS. 5 and 7D, an example of a method of forming a semiconductor device in accordance with an exemplary embodiment of the present inventive concept may include forming a protection layer 215 (see e.g., step S1040 shown in FIG. 4).

The protection layer 215 may be formed on the second side 3bs of the semiconductor substrate 3 on which the top part 105t, the alignment recessed area 105a, and the edge recessed area 105e, of which the thicknesses may be reduced, may be formed.

The protection layer 215 may be conformally formed on the passivation layer 105 in which the top part 105t, the alignment recessed area 105a, and the edge recessed area 105e, of which the thicknesses may be reduced, may be formed. The protection layer 215 may cover the top part 105t, the alignment recessed area 105a, and the edge recessed area 105e, of which the thicknesses may be reduced. The protection layer 215 may be formed to have a smaller thickness than the passivation layer 105.

The protection layer 215 may include an oxide-based insulating layer, a nitride-based insulating layer, or a polymer-based insulating layer. The protection layer 215 may include an insulating oxide, an insulating nitride, or an insulating polymer. For example, the protection layer 215 may include silicon oxide, silicon nitride, or a polyimide.

The protection layer 215 may include a different material from the passivation layer 105. For example, when the passivation layer 105 includes silicon oxide, the protection layer 215 may be formed of silicon nitride.

Referring to FIGS. 1A, 1B, and 4, an example of a method of forming a semiconductor device in accordance with an exemplary embodiment of the present inventive concept may include forming the alignment pattern 115a (see e.g., FIG. 6G) in the alignment recessed area 105a, and the edge pattern 115e (see e.g., FIG. 6G) in the edge recessed area 105e by performing the planarization process for exposing the through-via structure 27, by performing the same method as that described with reference to FIG. 6G.

An entire surface step height may be reduced due to the top part 105t of which the thickness may be reduced as described, for example, with reference to FIG. 7C, and thus the planarization process for exposing the through-via structure 27 may be simplified. Therefore, the top part 105t as described, for example, with reference FIG. 7C, of which the thickness may be reduced, may reduce the occurrence of a distribution failure caused by performing the planarization process.

The protection layer 215 (see e.g., FIG. 7D), the edge pattern 115e, and the alignment pattern 115a may increase yield and throughput such as described with reference to FIG. 6G.

The method of forming a semiconductor device in accordance with an exemplary embodiment of the present inventive concept may include forming the lower back-side conductive pattern 120a (see e.g., FIG. 6J), the intermediate back-side conductive pattern 125a (see e.g., FIG. 6J), and the upper back-side conductive pattern 135 (see e.g., FIG.

6J), which may be sequentially stacked, by performing the same method as that described with reference to FIGS. 6H to 6J. As described with reference to FIG. 4, the chip dividing process may be performed (see e.g., step S1070 shown in FIG. 4), and the semiconductor package may be formed (see e.g., step S1080 shown in FIG. 4).

An example of a method of forming a semiconductor device in accordance with an exemplary embodiment of the present inventive concept will be described with reference to FIGS. 5, and 8A to 8C.

Figure 8A:
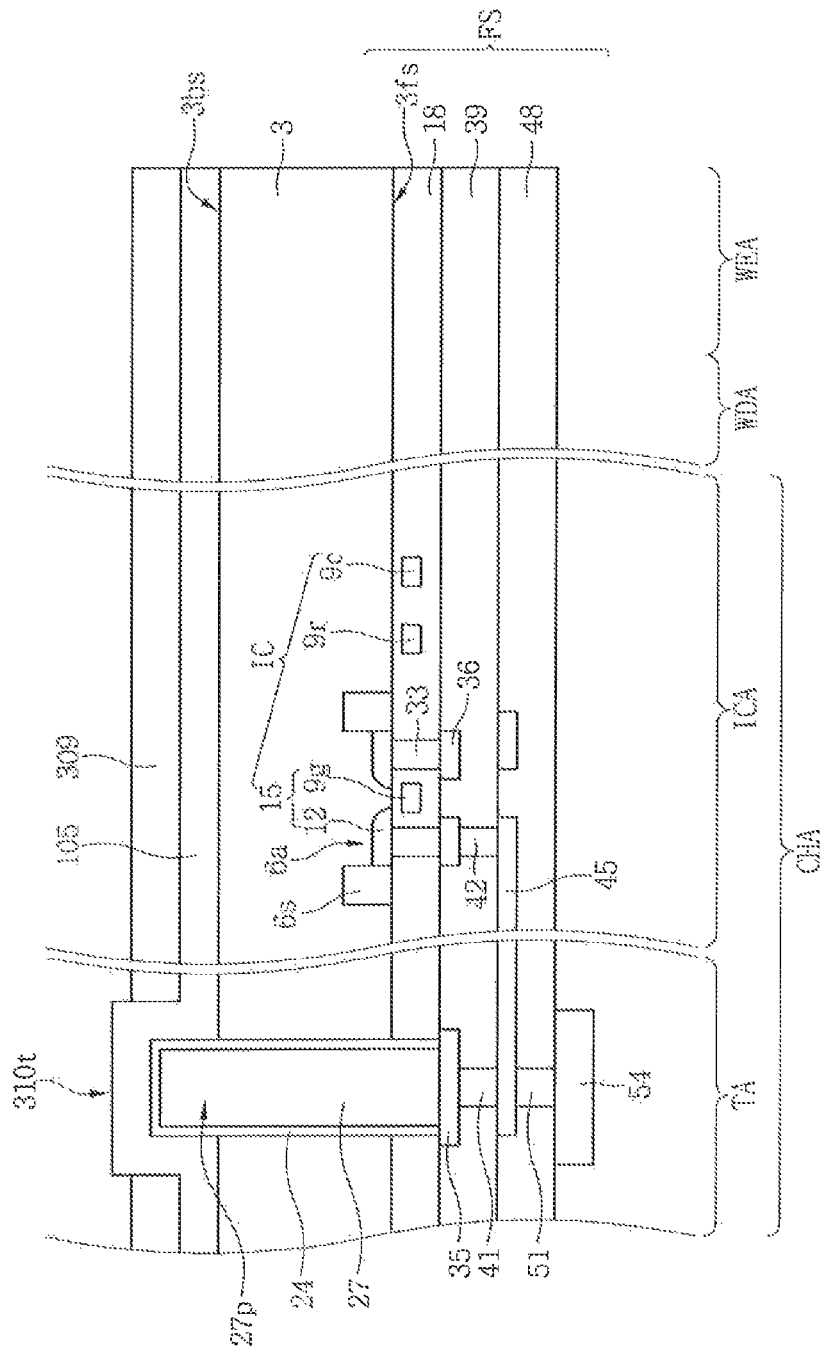

Referring to FIGS. 5 and 8A, an example of a method of forming a semiconductor device in accordance with an exemplary embodiment of the present inventive concept may include forming the through-via structure 27 configured to pass through the semiconductor substrate 3 having the first side 3fs and the second side 3bs, and having the back-side protruding part 27p protruding from the second side 3bs of the semiconductor substrate 3 using the same method as that described with reference to FIGS. 6A to 6C (see e.g., step S1010 shown in FIG. 4), and forming the passivation layer 105 on the second side 3bs of the semiconductor substrate 3 as described with reference to FIG. 6D (see e.g., step S1020 shown in FIG. 4).

An example of a method of forming a semiconductor device in accordance with an exemplary embodiment of the present inventive concept may include forming a mask layer 309 having a top opening part 310t configured to expose the passivation layer 105 disposed on the upper part of the through-via structure 27.

The mask layer 309 may be formed using the photoresist layer. For example, the forming of the mask layer 309 may include forming a photoresist material layer having a substantially planarized upper surface on the passivation layer 105, and reducing a thickness of the photoresist material layer until a protruding part of the passivation layer 105 is exposed. The protruding part of the passivation layer 105 may be a part disposed on the back-side protruding part 27p of the through-via structure 27.

Referring to FIGS. 5 and 8B, an example of a method of forming a semiconductor device in accordance with an exemplary embodiment of the present inventive concept may include forming a mask pattern 310 having an alignment opening part 310a and an edge opening part 310e by performing exposing and developing processes.

Figure 8C:
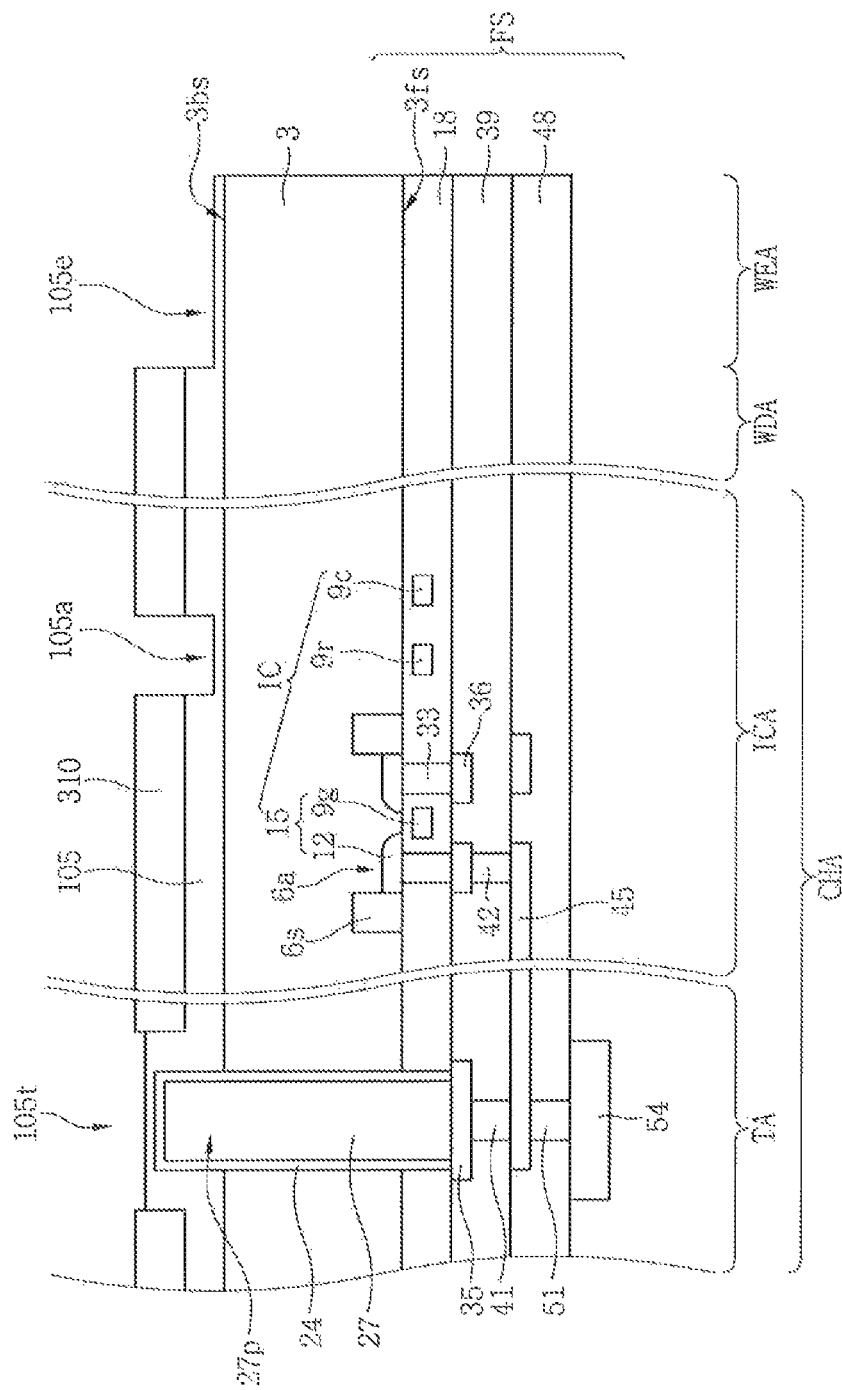

Referring to FIGS. 5 and 8C, an example of a method of forming a semiconductor device in accordance with an exemplary embodiment of the present inventive concept may include partially etching the passivation layer 105 using the mask pattern 310 as an etching mask, and forming the top part 105t, the alignment recessed area 105a, and the edge recessed area 105e, of which the thicknesses may be reduced, such as described with reference to FIG. 7B.

The mask pattern 310 (see e.g., FIG. 8C) may be removed, and the substrate, such as that described with reference to FIG. 7C, may be formed. When the mask pattern 310 is formed by the photoresist pattern, the mask pattern 310 may be removed by performing a photoresist (PR) strip process such as the ashing process.

An example of a method of forming a semiconductor device in accordance with an exemplary embodiment of the present inventive concept may include forming the protection layer 215, such as that described with reference to FIG. 7D, forming the alignment pattern 115a disposed in the alignment recessed area 105a, and the edge pattern 115e disposed in the edge recessed area 105e, as described with reference to FIG. 6G, by performing the planarization process for exposing the through-via structure 27, and forming the back-side conductive pattern 136 including the lower back-side conductive pattern 120a, the intermediate back-side conductive pattern 125a, and the upper back-side conductive pattern 135, which may be sequentially stacked, by performing the same method as that described with reference to FIGS. 6H to 6J. As described with reference to FIG. 4, the chip dividing process may be performed (see e.g., step S1070 shown in FIG. 4), and the semiconductor package may be formed (see e.g., step S1080 shown in FIG. 4).

An example of a method of forming a semiconductor device in accordance with an exemplary embodiment of the present inventive concept will be described with reference to FIGS. 5 and 9A to 9D.

Referring to FIGS. 5 and 9A, an example of a method of forming a semiconductor device in accordance with an exemplary embodiment of the present inventive concept may include forming the through-via structure 27 configured to pass through the semiconductor substrate 3 having the first side 3fs and the second side 3bs facing the first side 3fs, and having the back-side protruding part 27p protruding from the second side 3bs of the semiconductor substrate 3 using the same method as that described with reference to FIGS. 6A to 6C (see e.g., step S1010 shown in FIG. 4).

The example of a method of forming a semiconductor device in accordance with an exemplary embodiment of the present inventive concept may include forming a passivation layer 405 on the second side 3bs of the semiconductor substrate 3 (see e.g., step S1020 shown in FIG. 4).

The forming of the passivation layer 405 may include disposing an insulating material layer such as a silicon oxide layer on the second side 3bs of the semiconductor substrate 3. The passivation layer 405 may cover the back-side protruding part 27p of the through-via structure 27, and the via insulating layer 24 configured to cover the back-side protruding part 27p.

The example of a method of forming a semiconductor device in accordance with an exemplary embodiment of the present inventive concept may include forming an alignment recessed area 405a and an edge recessed area 405e by performing photolithography and etching processes (see e.g., step S1030 shown in FIG. 4).

The forming of the alignment recessed area 405a and the edge recessed area 405e may include forming a mask pattern 410 including the photoresist material on the passivation layer 405 by performing the photolithography process, and etching the passivation layer 405 by performing the etching process using the mask pattern 410 as an etching mask.

The alignment recessed area 405a and the edge recessed area 405e may pass through the passivation layer 405, and may expose the second side 3bs of the semiconductor substrate 3.

The edge recessed area 405e may be formed in the wafer edge area WEA of the semiconductor substrate 3. The alignment recessed area 405a may be formed in the chip area CHA of the semiconductor substrate 3.

Figure 9B:
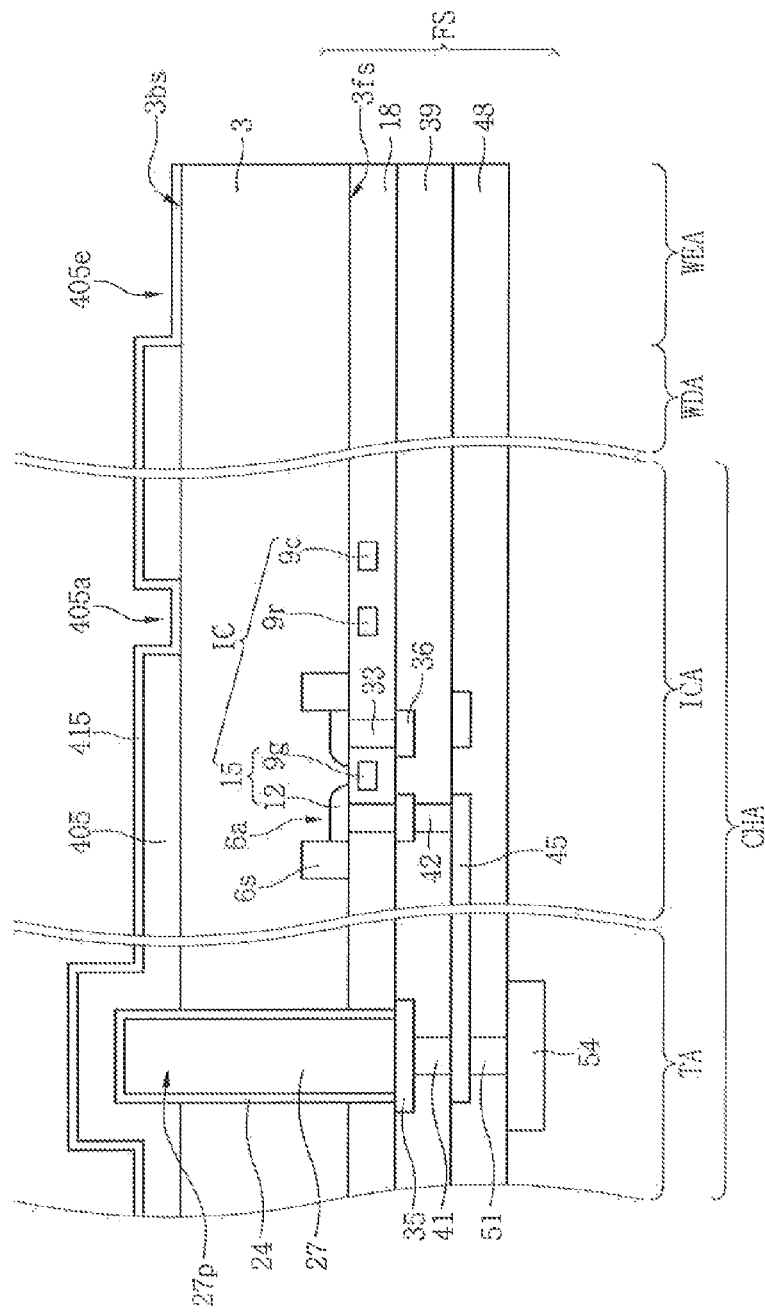

Referring to FIGS. 5 and 9B, the example of a method of forming a semiconductor device in accordance with an exemplary embodiment of the present inventive concept may include removing the mask pattern 410 (see e.g., FIG. 9A). When the mask pattern 410 is formed by the photoresist pattern, the mask pattern 410 may be removed by performing the ashing process.

The example of a method of forming a semiconductor device in accordance with an exemplary embodiment of the present inventive concept may include forming a protection layer 415 (see e.g., step S1040 shown in FIG. 4).

The protection layer 415 may be formed on the second side 3*bs* of the semiconductor substrate 3 having the alignment recessed area 405*a* and the edge recessed area 405*e*.

The protection layer 415 may be conformally formed on passivation layer 405 in which the alignment recessed area 405*a* and the edge recessed area 405*e* are formed. The protection layer 415 may cover the alignment recessed area 405*a* and the edge recessed area 405*e*.

The protection layer 415 may include an oxide-based, nitride-based, or polymer-based material. For example, the protection layer 415 may include silicon oxide, silicon nitride, or a polyimide.

According to an exemplary embodiment of the present inventive concept, the protection layer 415 may include a different material from the passivation layer 405. For example, when the passivation layer 405 includes silicon oxide, the protection layer 415 may include silicon nitride.

The protection layer 415 may be formed to have a smaller thickness than the passivation layer 405.

Figure 9C:
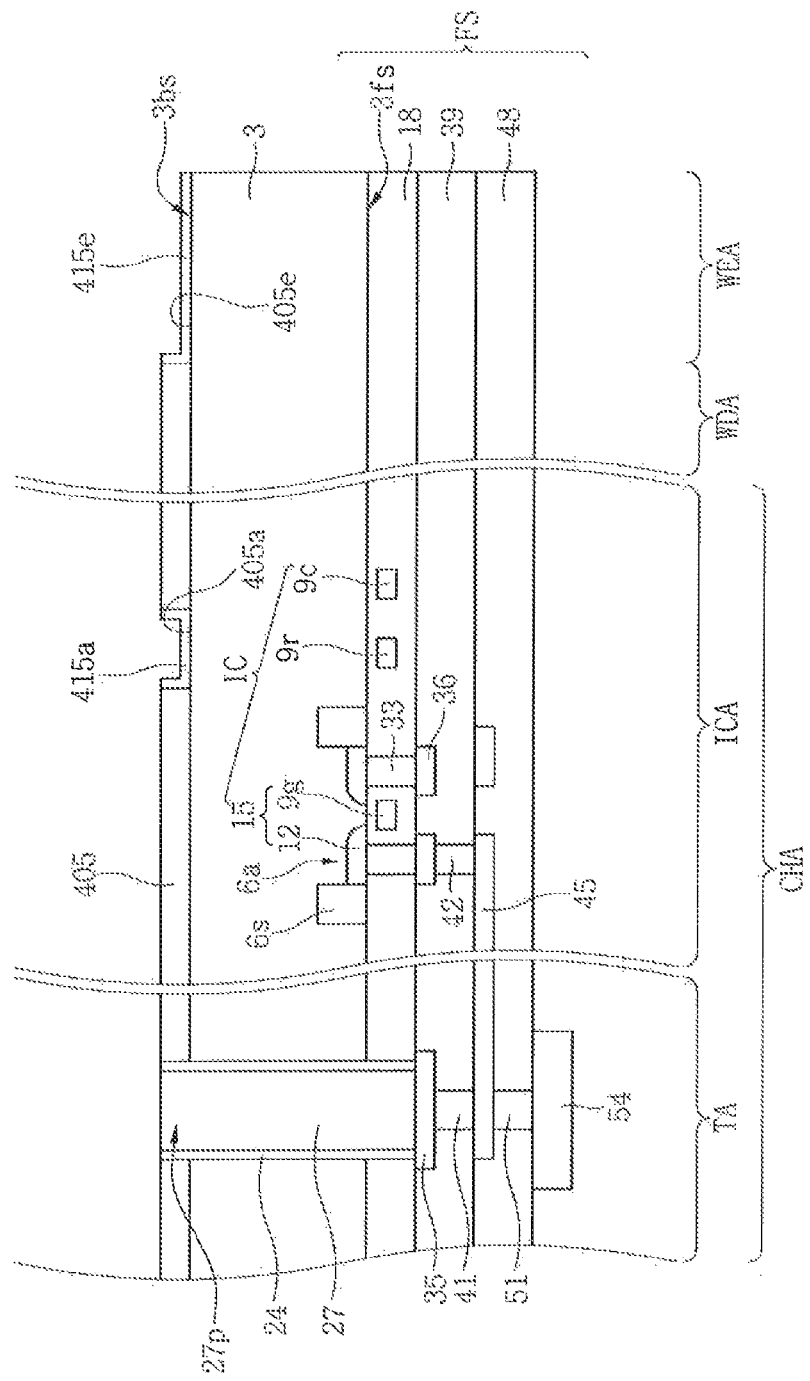

Referring to FIGS. 5 and 9C, the example of a method of forming a semiconductor device in accordance with an exemplary embodiment of the present inventive concept may include exposing the through-via structure 27 (see e.g., step S1050 shown in FIG. 4).

The exposing of the through-via structure 27 may include performing the planarization process on the substrate in which the protection layer 415 (see e.g., FIG. 9B) is formed, and removing the via insulating layer 24, the passivation layer 405 and the protection layer 415 (see e.g., FIG. 9B), which may be disposed on an upper part of the through-via structure 27. The planarization process may be a CMP process.

The protection layer 415 (see e.g., FIG. 9B) disposed on the upper surface of the passivation layer 405 may be removed by performing the planarization process for exposing the through-via structure 27, the protection layer 415 (see e.g., FIG. 9B) disposed in the alignment recessed area 405*a* may be retained and formed to be an alignment pattern 415*a*, and the protection layer 415 (see e.g., FIG. 9B) disposed in the edge recessed area 405*e* may be retained and formed to be an edge pattern 415*e*.

The protection layer 415 (see e.g., FIG. 9B), the alignment pattern 415*a*, and the edge pattern 415*e* may reduce the occurrence of a crack or a chipping failure in the wafer edge area WEA of the semiconductor substrate 3 caused during the planarization process for exposing the through-via structure 27.

Figure 9D:
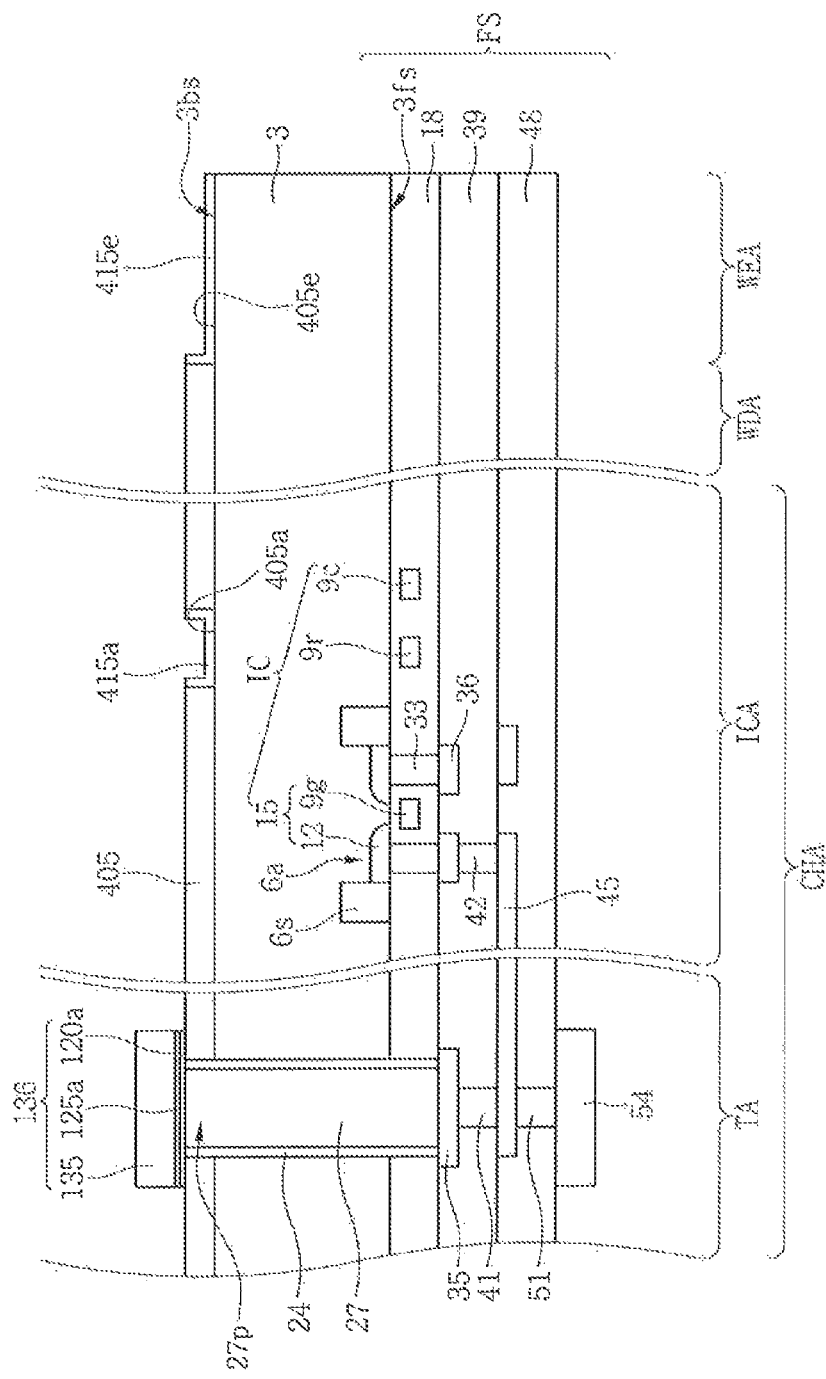

Referring to FIGS. 5 and 9D, the example of a method of forming a semiconductor device in accordance with an exemplary embodiment of the present inventive concept may include forming the back-side conductive pattern 136 including the lower back-side conductive pattern 120*a*, the intermediate back-side conductive pattern 125*a*, and the upper back-side conductive pattern 135, which may be sequentially stacked, by performing the same method as that described with reference to FIGS. 6H to 6J (see e.g., step S1060 shown in FIG. 4).

Referring to FIGS. 2 and 4, the example of a method of forming a semiconductor device in accordance with an exemplary embodiment of the present inventive concept may include performing the chip dividing process (see e.g., step S1070 shown in FIG. 4). The chip area CHA of the semiconductor substrate 3 may be divided by the chip dividing process. The example of a method of forming a semiconductor device in accordance with an exemplary embodiment of the present inventive concept may include forming the semiconductor package (see e.g., step S1080 shown in FIG. 4). The semiconductor package may be formed using the semiconductor substrate 3 having the divided chip area CHA.

An example of a method of forming a semiconductor device in accordance with an exemplary embodiment of the present inventive concept will be described with reference to FIGS. 5, 10A and 10B.

Referring to FIGS. 5 and 10A, an example of a method of forming a semiconductor device in accordance with an exemplary embodiment of the present inventive concept may include forming the through-via structure 27 configured to pass through the semiconductor substrate 3 having the first side 3*fs* and the second side 3*bs* facing the first side 3*fs*, and having the back-side protruding part 27*p* protruding from the second side 3*bs* of the semiconductor substrate 3 using the same method as that described with reference to FIGS. 6A to 6C (see e.g., step S1010 shown in FIG. 4).

An example of a method of forming a semiconductor device in accordance with an exemplary embodiment of the present inventive concept may include forming the passivation layer 405 on the second side 3*bs* of the semiconductor substrate 3 (see e.g., step S1020 shown in FIG. 4).

An example of a method of forming a semiconductor device in accordance with an exemplary embodiment of the present inventive concept may include forming a mask pattern 510, such as the mask pattern 210 described in FIG. 7A, on the passivation layer 405.

An example of a method of forming a semiconductor device in accordance with an exemplary embodiment of the present inventive concept may include forming a top part 405*t* on the through-via structure 27 and forming the alignment recessed area 405*a* and the edge recessed area 405*e*, as described with reference to FIG. 9A, at the same time by etching the passivation layer 405 by performing the etching process using the mask pattern 510 as an etching mask. The top part 405*t* may be a part in which the through-via structure 27 is exposed.

Figure 10B:
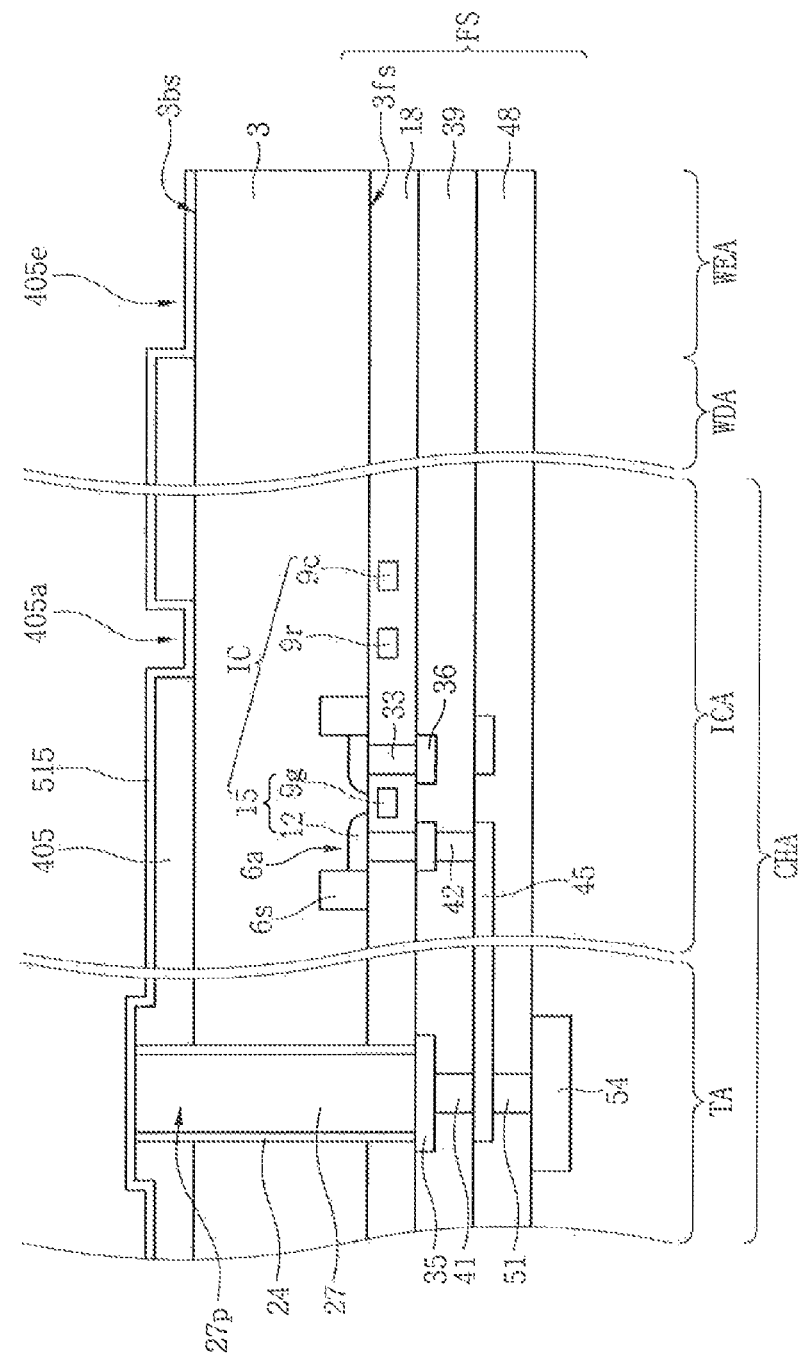

Referring to FIGS. 5 and 10B, an example of a method of forming a semiconductor device in accordance with an exemplary embodiment of the present inventive concept may include removing the mask pattern 510 (see e.g., FIG. 10A).

An example of a method of forming a semiconductor device in accordance with an exemplary embodiment of the present inventive concept may include forming a protection layer 515 (see e.g., step S1040 shown in FIG. 4).

The protection layer 515 may be conformally formed on the second side 3*bs* of the semiconductor substrate 3 having the alignment recessed area 405*a* and the edge recessed area 405*e*. The protection layer 515 may include the same material as the protection layer 415 described with reference to FIG. 9B.

Referring to FIGS. 2 and 4, an example of a method of forming a semiconductor device in accordance with an exemplary embodiment of the present inventive concept may include forming the alignment pattern 415*a* in the alignment recessed area 405*a*, and the edge pattern 415*e* in the edge recessed area 405*e* by performing the planarization process for exposing the through-via structure 27 substantially the same as that described with reference to FIG. 9C and forming the back-side conductive pattern 136 including the lower back-side conductive pattern 120*a*, the intermediate back-side conductive pattern 125*a*, and the upper back-side conductive pattern 135, which may be sequentially stacked on an exposed part of the through-via structure 27 as described with reference to FIG. 9D. The protection layer 515 (see e.g., FIG. 10B), the alignment pattern 415*a*, and the edge pattern 415e may reduce the occurrence of a chipping failure in the wafer edge area WEA of the semiconductor substrate 3 during the planarization process for exposing the through-via structure 27.

An example of a method of forming a semiconductor device in accordance with an exemplary embodiment of the present inventive concept may include performing the chip dividing process (see e.g., step S1070 shown in FIG. 4), and forming the semiconductor package (see e.g., step S1080 shown in FIG. 4).

An example of a method of forming a semiconductor device in accordance with an exemplary embodiment of the present inventive concept will be described with reference to FIGS. 5 and 11.

Figure 11:
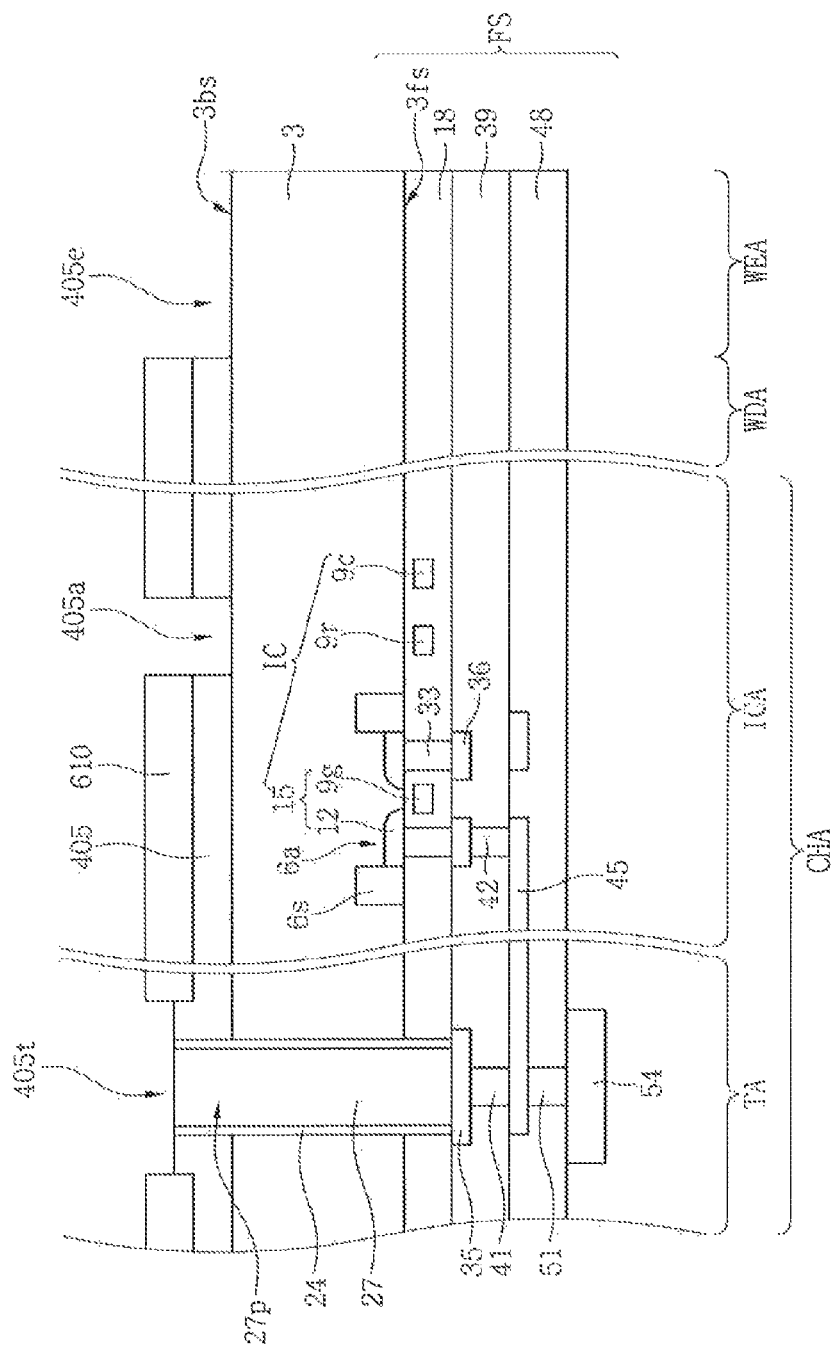
FIG. 11 is a cross-sectional view showing an example of a method of forming a semiconductor device in accordance with an exemplary embodiment of the present inventive concept.

Referring to FIGS. 5 and 11, an example of a method of forming a semiconductor device in accordance with an exemplary embodiment of the present inventive concept may include forming the through-via structure 27 configured to pass through the semiconductor substrate 3 having the first side 3fs and the second side 3bs facing the first side 3fs, and having the back-side protruding part 27p protruding from the second side 3bs of the semiconductor substrate 3 using the same method as that described with reference to FIGS. 6A to 6C (see e.g., step S1010 shown in FIG. 4).

An example of a method of forming a semiconductor device in accordance with an exemplary embodiment of the present inventive concept may include forming the passivation layer 405 on the second side 3bs of the semiconductor substrate 3 (see e.g., S1020 shown in FIG. 4).

An example of a method of forming a semiconductor device in accordance with an exemplary embodiment of the present inventive concept may include forming a mask pattern 610, such as the mask pattern 310 described with reference to FIGS. 8A and 8B, on the passivation layer 405.

An example of a method of forming a semiconductor device in accordance with an exemplary embodiment of the present inventive concept may include forming the top part 405t, the alignment recessed area 405a and the edge recessed area 405e, such as those described with reference to FIG. 10A by etching the passivation layer 405, using the mask pattern 610 as an etching mask.

An example of a method of forming a semiconductor device in accordance with an exemplary embodiment of the present inventive concept may include removing the mask pattern 610, and forming the protection layer 515, such as that described with reference to FIG. 10B. The substrate substantially the same as that described with reference to FIG. 10B may be formed.

An example of a method of forming a semiconductor device in accordance with an exemplary embodiment of the present inventive concept will be described with reference to FIGS. 5 and 12A to 12E.

Figure 12A:
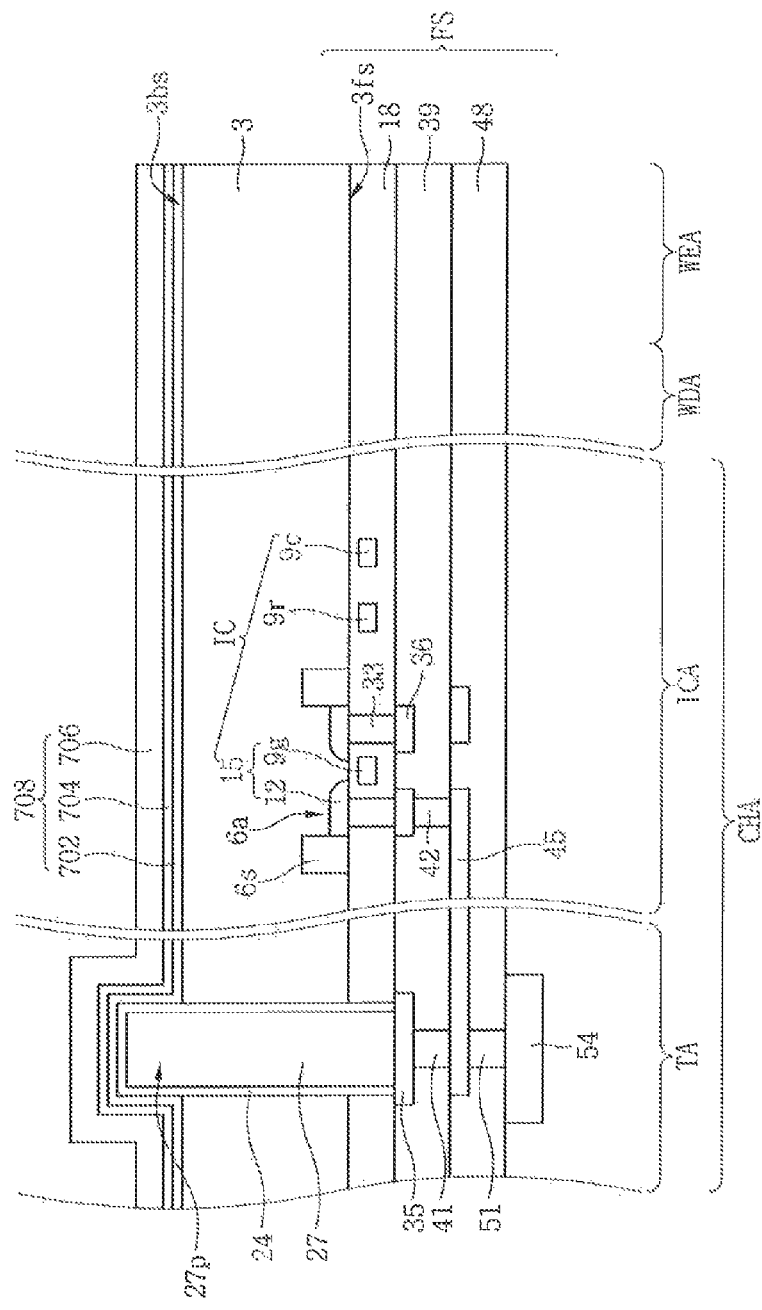

Referring to FIGS. 5 and 12A, an example of a method of forming a semiconductor device in accordance with an exemplary embodiment of the present inventive concept may include forming the through-via structure 27 configured to pass through the semiconductor substrate 3 having the first side 3fs and the second side 3bs facing the first side 3fs, and having the back-side protruding part 27p protruding from the second side 3bs of the semiconductor substrate 3 using the same method as that described with reference to FIGS. 6A to 6C (see e.g., step S1010 shown in FIG. 4).

The example of a method of forming a semiconductor device in accordance with an exemplary embodiment of the present inventive concept may include forming a passivation layer 708 on the second side 3bs of the semiconductor substrate 3 (see e.g., step S1020 shown in FIG. 4).

The forming of the passivation layer 708 may include sequentially forming a lower passivation layer 702, an intermediate passivation layer 704, and an upper passivation layer 706 on the second side 3bs of the semiconductor substrate 3.

The intermediate passivation layer 704 may include a different material from the lower and upper passivation layers 702 and 706. For example, the lower passivation layer 702 may include silicon oxide, the intermediate passivation layer 704 may include silicon nitride, and the upper passivation layer 706 may include silicon oxide or a polyimide.

Referring to FIGS. 5 and 12B, the example of a method of forming a semiconductor device in accordance with an exemplary embodiment of the present inventive concept may include forming an alignment recessed area 708a and an edge recessed area 708e by performing photolithography and etching processes (see e.g., step S1030 shown in FIG. 4).

The forming of the alignment recessed area 708a and the edge recessed area 708e may include forming a mask pattern 710 on the passivation layer 708 by performing the photolithography process, and partially etching the passivation layer 708 by performing the etching process using the mask pattern 710 as an etching mask. The mask pattern 710 may be formed using the photoresist pattern.

The partial etching of the passivation layer 708 by performing the etching process using the mask pattern 710 as an etching mask may include etching the upper passivation layer 706 using the intermediate passivation layer 704 as an etch-stop layer.

The alignment recessed area 708a and the edge recessed area 708e may pass through the upper passivation layer 706, and bottoms of the alignment and edge recessed areas 708a and 708e may be spaced apart from the second side 3bs of the semiconductor substrate 3.

The edge recessed area 708e may be formed in the wafer edge area WEA of the semiconductor substrate 3. The alignment recessed area 708a may be formed in the chip area CHA of the semiconductor substrate 3.

Figure 12C:
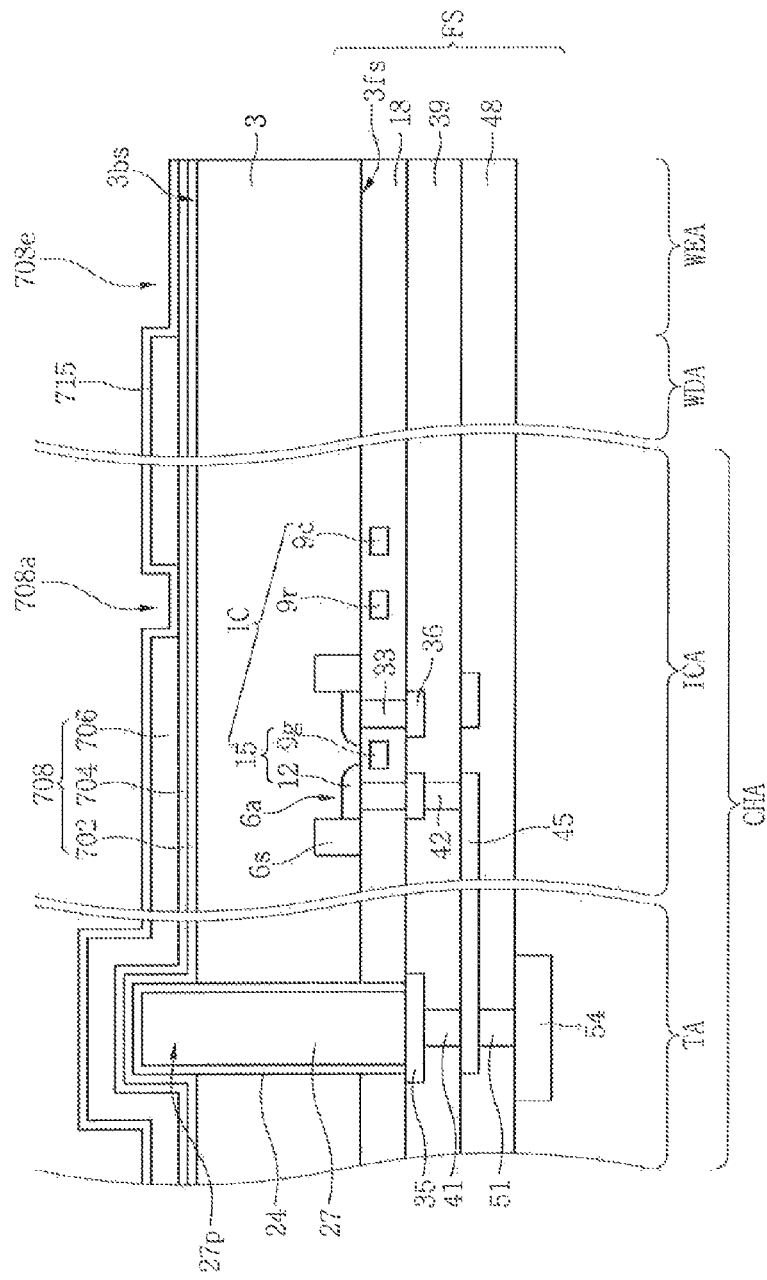

Referring to FIGS. 5 and 12C, the example of a method of forming a semiconductor device in accordance with an exemplary embodiment of the present inventive concept may include removing the mask pattern 710 (see e.g., FIG. 12B). When the mask pattern 710 is formed by the photoresist pattern, the mask pattern 710 may be removed by performing the ashing process.

The example of a method of forming a semiconductor device in accordance with an exemplary embodiment of the present inventive concept may include forming a protection layer 715 (see. e.g., step S1040 shown in FIG. 4).

The protection layer 715 may be formed on the second side 3bs of the semiconductor substrate 3 having the alignment recessed area 708a and the edge recessed area 708e.

The protection layer 715 may be conformally formed on the passivation layer 708 on which the alignment recessed area 708a and the edge recessed area 708e may be formed. The protection layer 715 may include an oxide-based, nitride-based, or polymer-based material. For example, the protection layer 715 may include silicon oxide, silicon nitride, or a polyimide.

The protection layer 715 may include a different material from the upper passivation layer 706. For example, when the upper passivation layer 706 includes silicon oxide, the protection layer 715 may include silicon nitride.

Figure 12D:
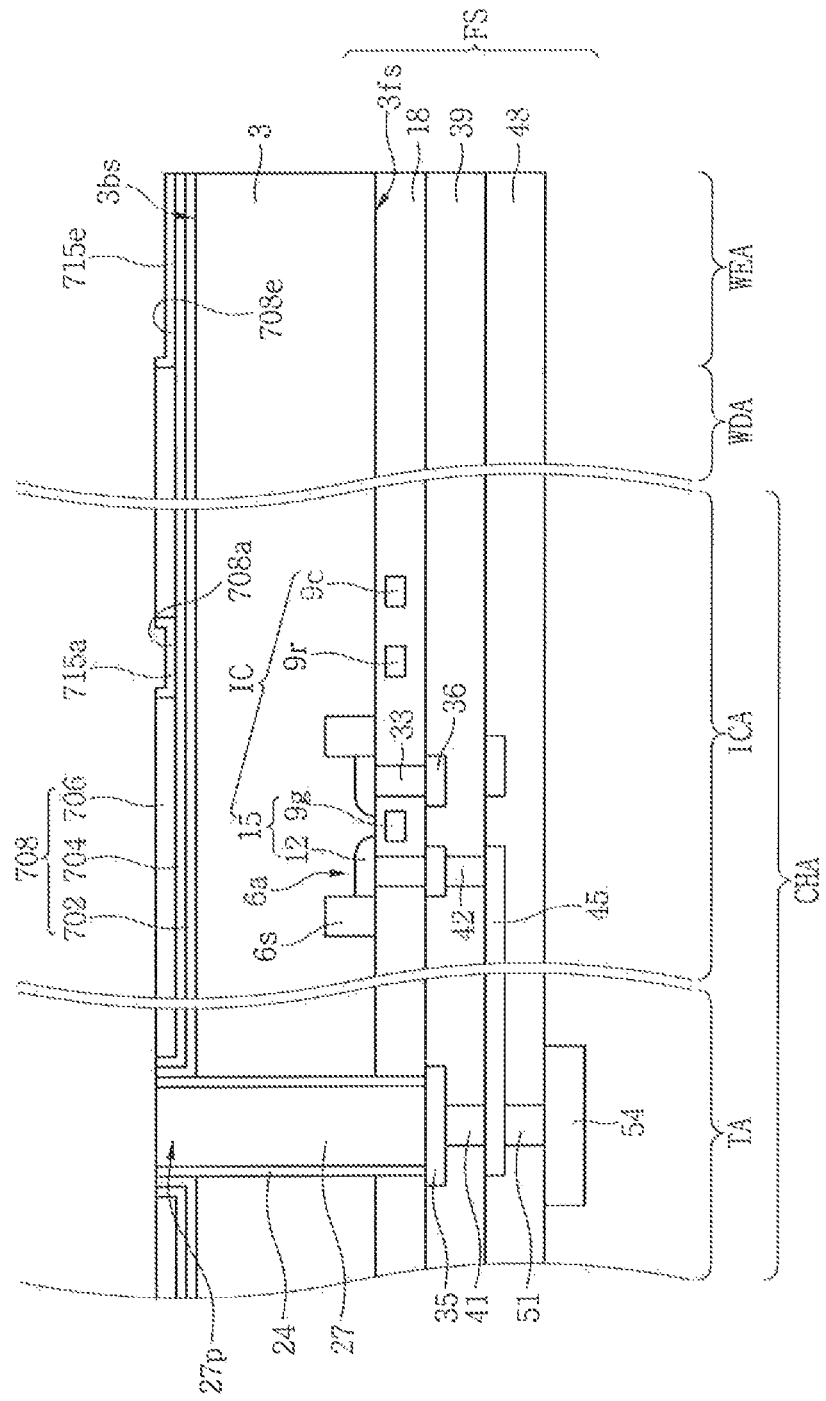

Referring to FIGS. 5 and 12D, the example of a method of forming a semiconductor device in accordance with an exemplary embodiment of the present inventive concept may include exposing the through-via structure 27 (see e.g., step S1050 shown in FIG. 4).

The exposing of the through-via structure 27 may include performing the planarization process on the substrate on which the protection layer 715 (see e.g., FIG. 12C) is formed, and removing the via insulating layer 24, the passivation layer 708, and the protection layer 715 (see e.g., FIG. 12C), which may be disposed on an upper part of the through-via structure 27. The planarization process may be the CMP process.

The protection layer 715 (see e.g., FIG. 12C) disposed on the upper surface of the passivation layer 708 may be removed by performing the planarization process for exposing the through-via structure 27. The protection layer 715 (see e.g., FIG. 12C) disposed in the alignment recessed area 708a may be retained and formed to be an alignment pattern 715a. The protection layer 715 (see e.g., FIG. 12C) disposed in the edge recessed area 708e may be retained and formed to an edge pattern 715e.

The alignment pattern 715a and the intermediate passivation layer 704 may include silicon nitride, the lower passivation layer 702 may include silicon oxide, and the upper passivation layer 706 may include a polyimide.

The protection layer 715 (see e.g., FIG. 12C), the alignment pattern 715a, and the edge pattern 715e may reduce the occurrence of a chipping failure in the wafer edge area WEA of the semiconductor substrate 3 during the planarization process for exposing the through-via structure 27.

Figure 12E:
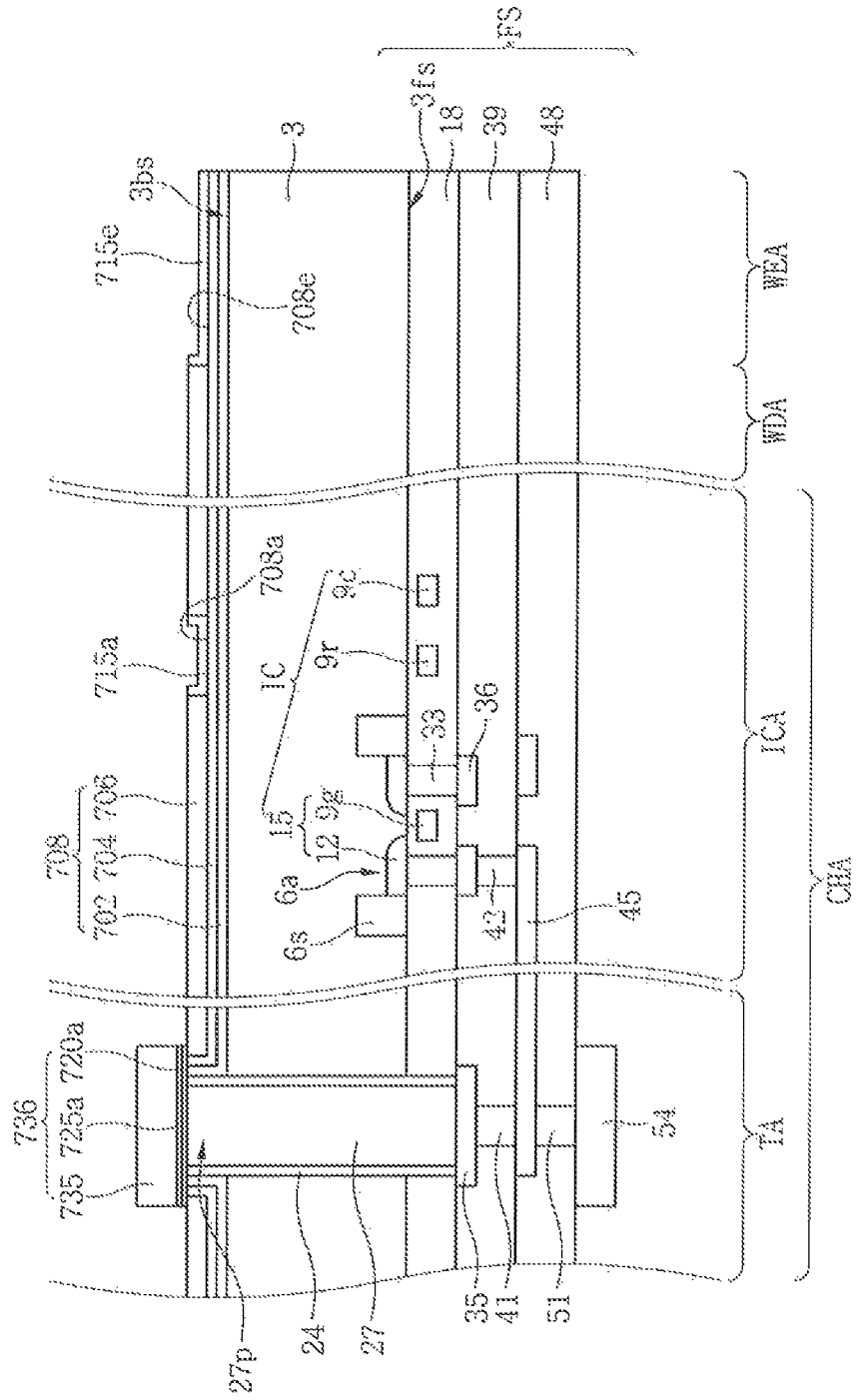

Referring to FIGS. 5 and 12E, the example of a method of forming a semiconductor device in accordance with an exemplary embodiment of the present inventive concept may include forming the back-side conductive pattern 736 including the lower back-side conductive pattern 720a, the intermediate back-side conductive pattern 725a, and the upper back-side conductive pattern 735, which may be sequentially stacked on the exposed part of the through-via structure 27, by performing the same method as that described with reference to FIGS. 6H to 6J (see e.g., step S1060 shown in FIG. 4).

Referring to FIGS. 3 and 4, the example of a method of forming a semiconductor device in accordance with an exemplary embodiment of the present inventive concept may include performing the chip dividing process (see e.g., step S1070 shown in FIG. 4). The chip area CHA of the semiconductor substrate 3 may be divided by the chip dividing process. The example of a method of forming a semiconductor device in accordance with an exemplary embodiment of the present inventive concept may include forming the semiconductor package (see e.g., step S1080 shown in FIG. 4). The semiconductor package may be formed using the semiconductor substrate 3 having the divided chip area CHA.

An example of a method of forming a semiconductor device in accordance with an exemplary embodiment of the present inventive concept will be described with reference to FIGS. 5, and 13A to 13C.

Figure 13A:
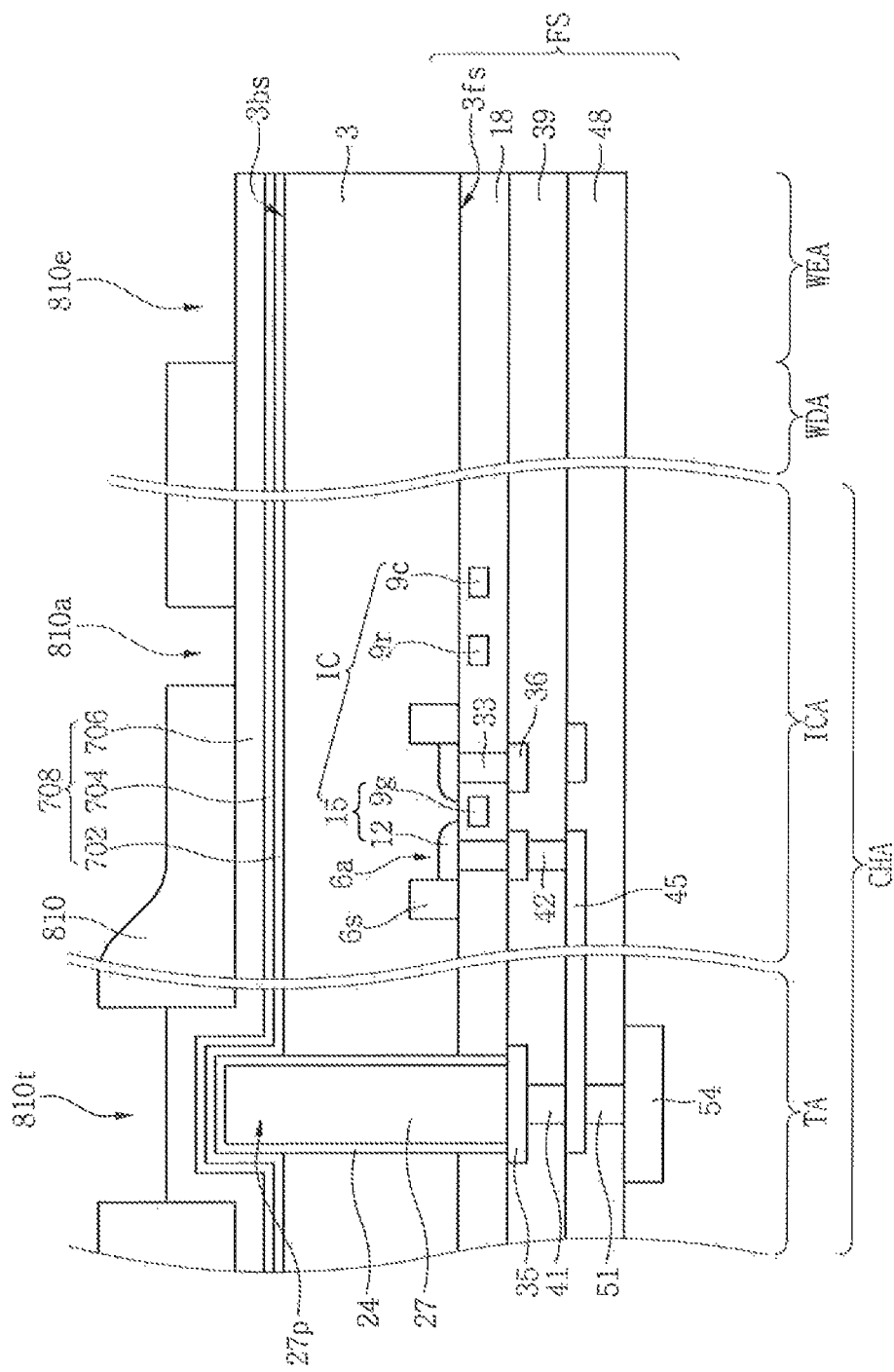
FIGS. 13A to 13D are cross-sectional views showing an example of a method of forming a semiconductor device in accordance with an exemplary embodiment of the present inventive concept.

Referring to FIGS. 5 and 13A, an example of a method of forming a semiconductor device in accordance with an exemplary embodiment of the present inventive concept may include forming the through-via structure 27 configured to pass through the semiconductor substrate 3 having the first side 3fs and the second side 3bs facing the first side 3fs, and having the back-side protruding part 27p protruding from the second side 3bs of the semiconductor substrate 3 using the same method as that described with reference to FIGS. 6A to 6C (see e.g., step S1010 shown in FIG. 4).

An example of a method of forming a semiconductor device in accordance with an exemplary embodiment of the present inventive concept may include forming the passivation layer 708, as described with reference to FIG. 12A, on the second side 3bs of the semiconductor substrate 3 (see e.g., step S1020 shown in FIG. 4). The passivation layer 708 may include the lower passivation layer 702, the intermediate passivation layer 704, and the upper passivation layer 706, which may be sequentially stacked.

An example of a method of forming a semiconductor device in accordance with an exemplary embodiment of the present inventive concept may include forming a mask pattern 810 substantially the same as the mask pattern 210 described with reference to FIG. 7A on the passivation layer 708. The mask pattern 810 may have a top opening part 810t configured to expose a part of the passivation layer 708 disposed on the upper part of the through-via structure 27, an alignment opening part 810a, which may be spaced apart from the TSV area TA and may expose a part of the passivation layer 708 disposed in the chip area CHA of the semiconductor substrate 3, and an edge opening part 810e configured to expose the passivation layer 708 disposed in the wafer edge area WEA of the semiconductor substrate 3.

Figure 13B:
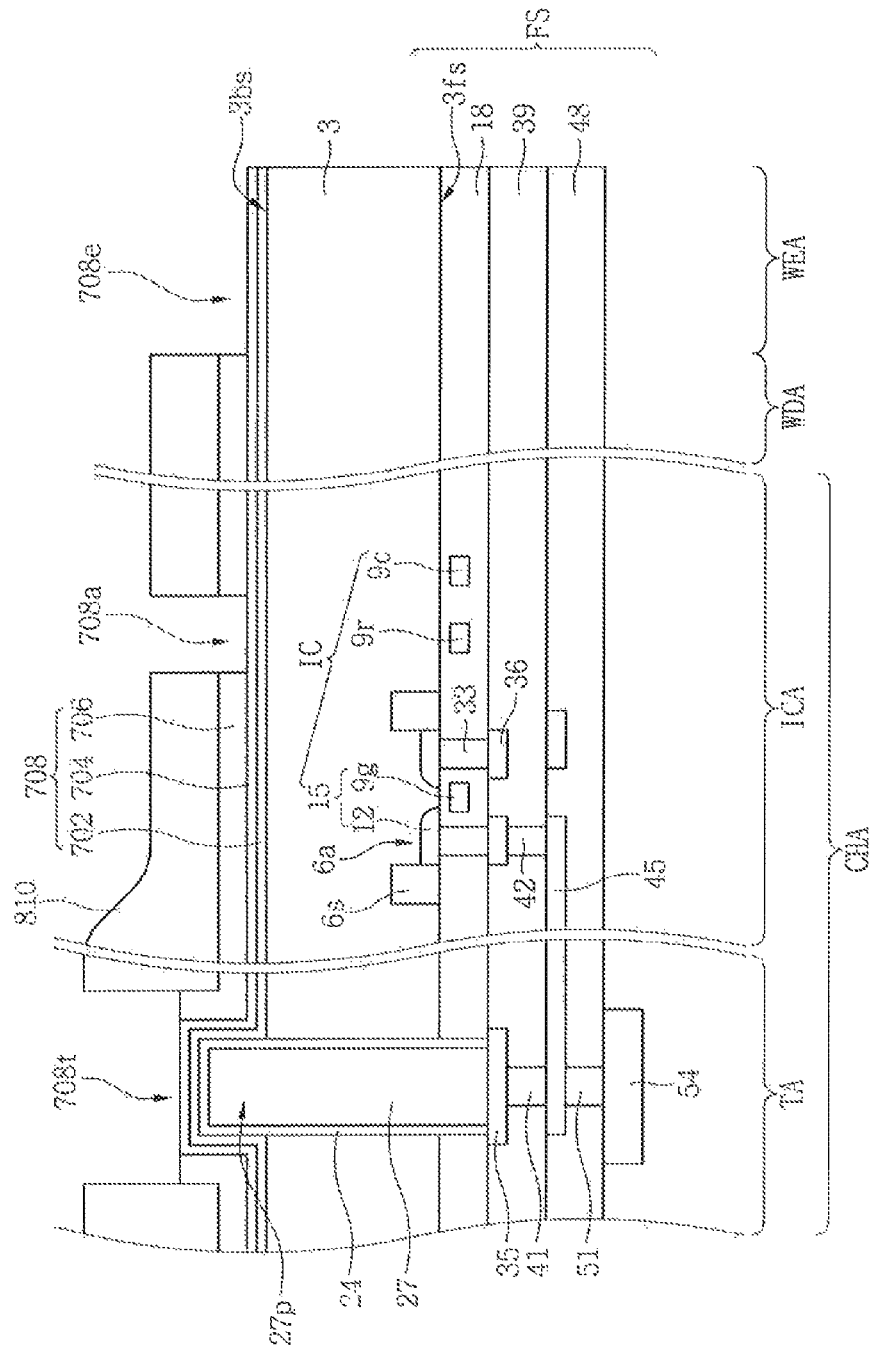

Referring to FIGS. 5 and 13B, an example of a method of forming a semiconductor device in accordance with an exemplary embodiment of the present inventive concept may include forming a top part 708t on the through-via structure 27 by partially etching the passivation layer 708 by performing the etching process using the mask pattern 810 as an etching mask, and forming the alignment recessed area 708a and the edge recessed area 708e, as described with reference to FIG. 12B, at substantially the same time. The top part 708t may be a part in which the passivation layer 708 disposed on the through-via structure 27 is etched.

Figure 13C:
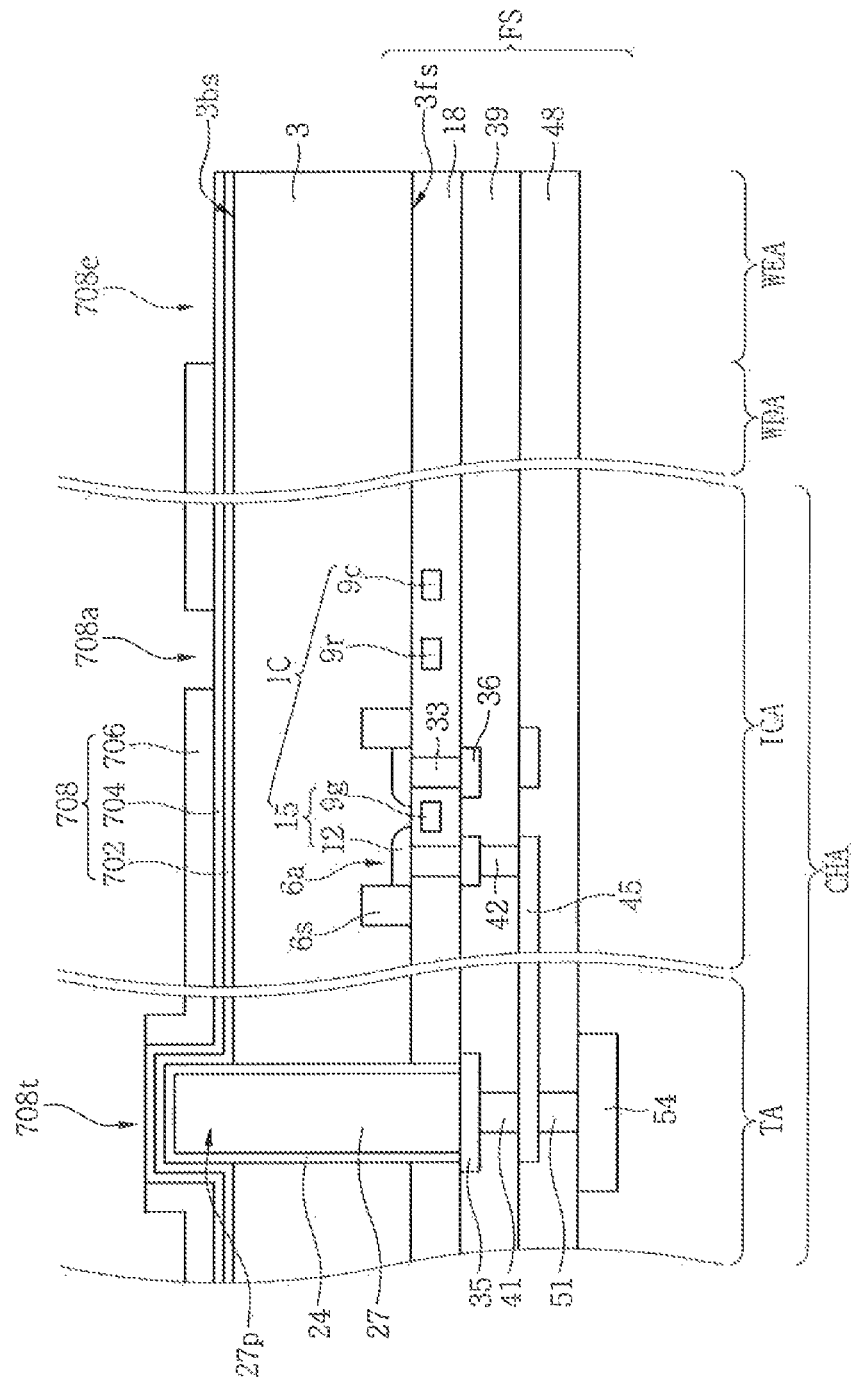

Referring to FIGS. 5 and 13C, an example of a method of forming a semiconductor device in accordance with an exemplary embodiment of the present inventive concept may include removing the mask pattern 810 (see e.g., FIG. 13B). When the mask pattern 810 (see e.g., FIG. 13B) is formed using the photoresist pattern, the mask pattern 810 (see e.g., FIG. 13B) may be removed by performing the ashing process.

Figure 13D:
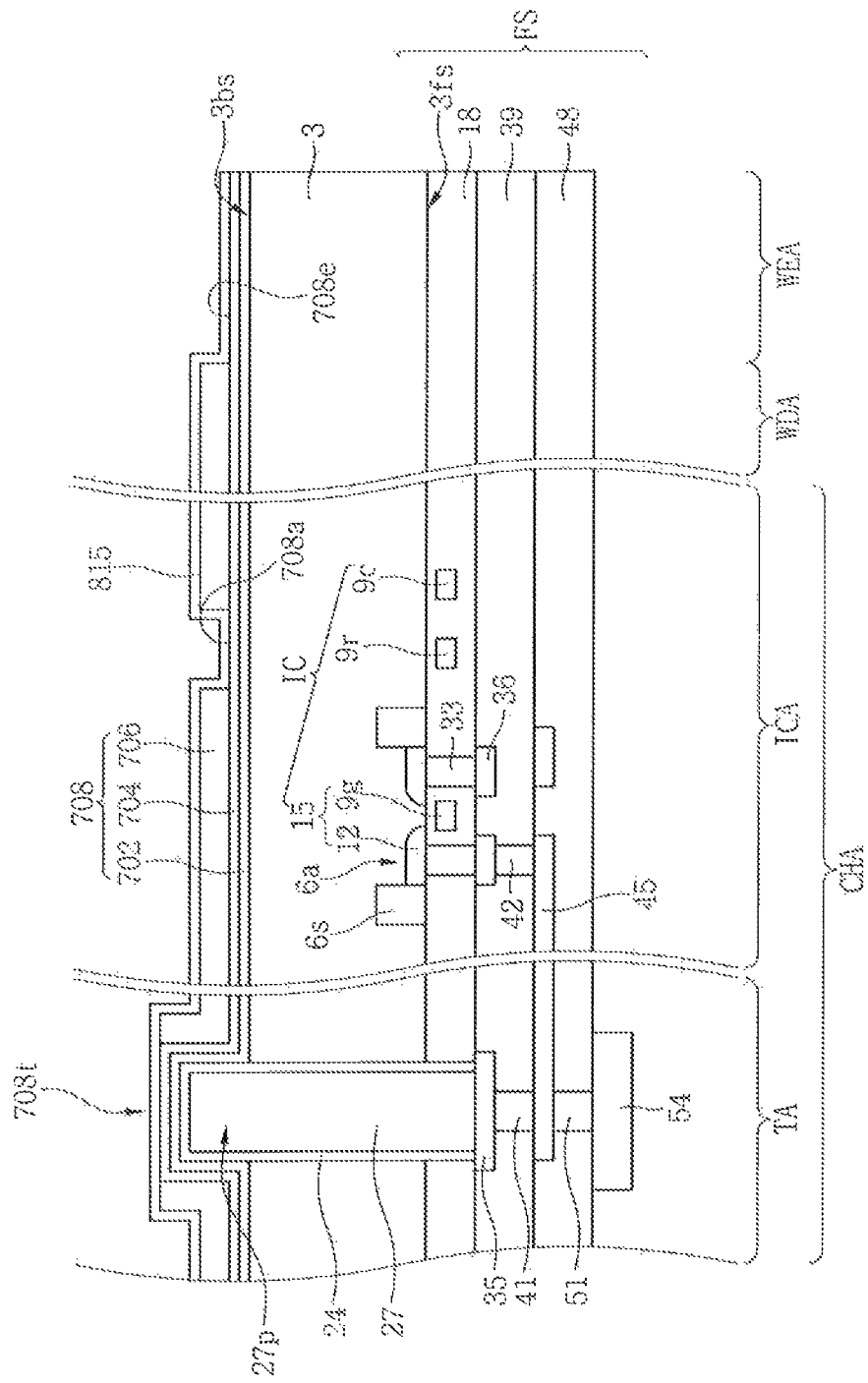

Referring to FIGS. 5 and 13D, an example of a method of forming a semiconductor device in accordance with an exemplary embodiment of the present inventive concept may include forming a protection layer 815 (see e.g., step S1040 shown in FIG. 4).

The protection layer 815 may be conformally formed on the passivation layer 708 in which the top part 708t, the alignment recessed area 708a, and the edge recessed area 708e may be formed.

The protection layer 815 may include the same material as the protection layer 715 described with reference to FIG. 12C.

An example of a method of forming a semiconductor device in accordance with an exemplary embodiment of the present inventive concept may include exposing the through-via structure 27, and forming the alignment pattern 715a in the alignment recessed area 708a, and the edge pattern 715e in the edge recessed area 705e by performing the planarization process. Therefore, the substrate, which may be the same as that described with reference to FIG. 12D, may be formed.

An example of a method of forming a semiconductor device in accordance with an exemplary embodiment of the present inventive concept will be described with reference to FIGS. 5, 14A, and 14B.

Figure 14A:
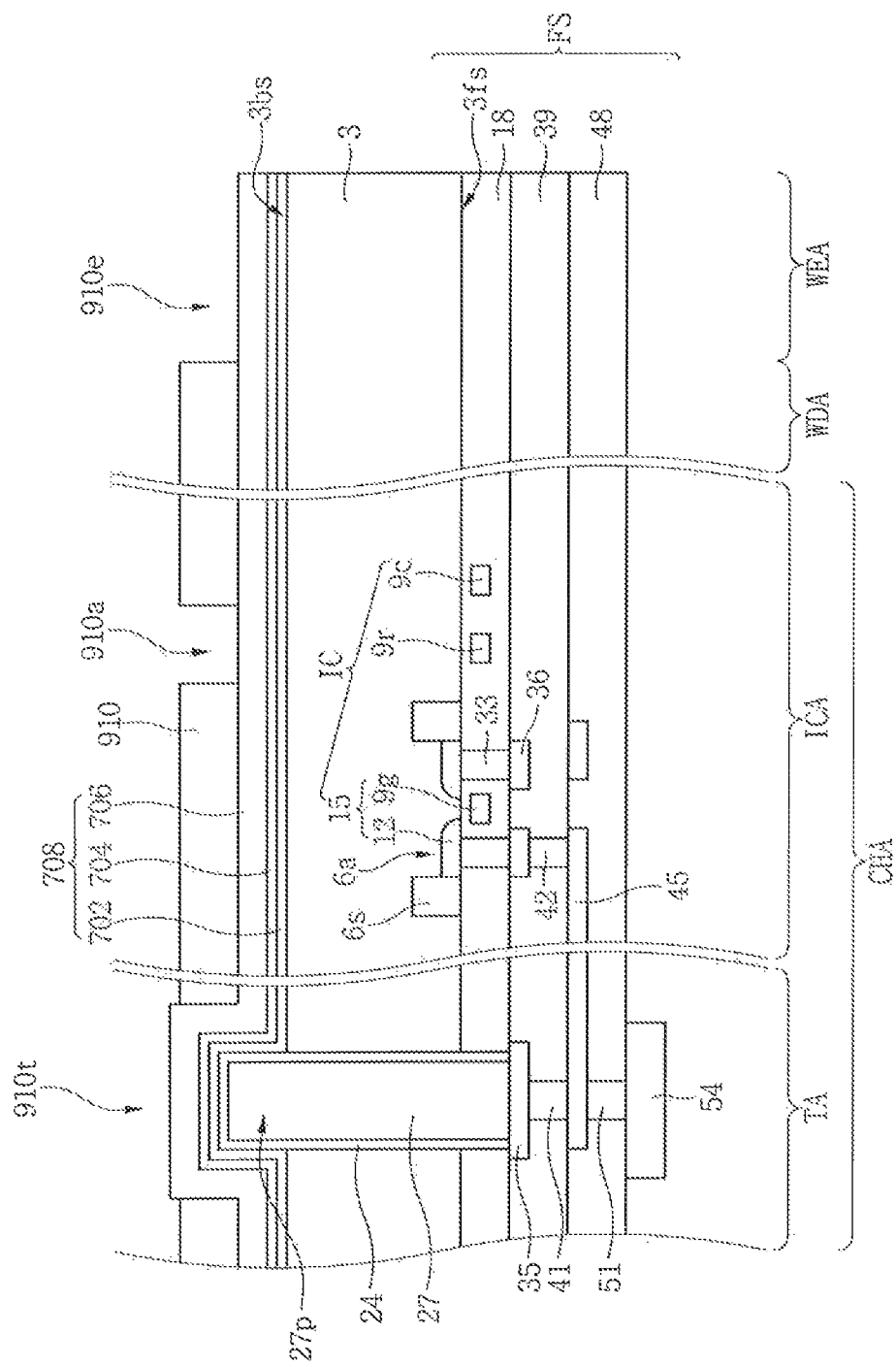
FIGS. 14A and 14B are cross-sectional views showing an example of a method of forming a semiconductor device in accordance with an exemplary embodiment of the present inventive concept.

Referring to FIGS. 5 and 14A, an example of a method of forming a semiconductor device in accordance with an exemplary embodiment of the present inventive concept may include forming the through-via structure 27 configured to pass through the semiconductor substrate 3 having the first side 3fs and the second side 3bs facing the first side 3fs, and having the back-side protruding part 27p protruding from the second side 3bs of the semiconductor substrate 3 using the same method as that described with reference to FIGS. 6A to 6C (see e.g., step S1010 shown in FIG. 4).

An example of a method of forming a semiconductor device in accordance with an exemplary embodiment of the present inventive concept may include forming the passivation layer 708, as described with reference to FIG. 12A on the second side 3bs of the semiconductor substrate 3 (see e.g., step S1020 shown in FIG. 4). The passivation layer 708 may include the lower passivation layer 702, the intermediate passivation layer 704, and the upper passivation layer 706, which may be sequentially stacked.

An example of a method of forming a semiconductor device in accordance with an exemplary embodiment of the present inventive concept may include forming a mask pattern 910, such as the mask pattern 310 described with reference to FIGS. 8A and 8B, on the passivation layer 708.

The forming of the mask pattern 910 may include forming a top opening part 910t configured to expose the passivation layer 708 disposed on the upper part of the through-via structure 27 as described with reference to FIG. 8A, and forming an alignment opening part 910a, and an edge opening part 910e by performing the exposing and developing processes as described with reference to FIG. 8B.

Figure 14B:
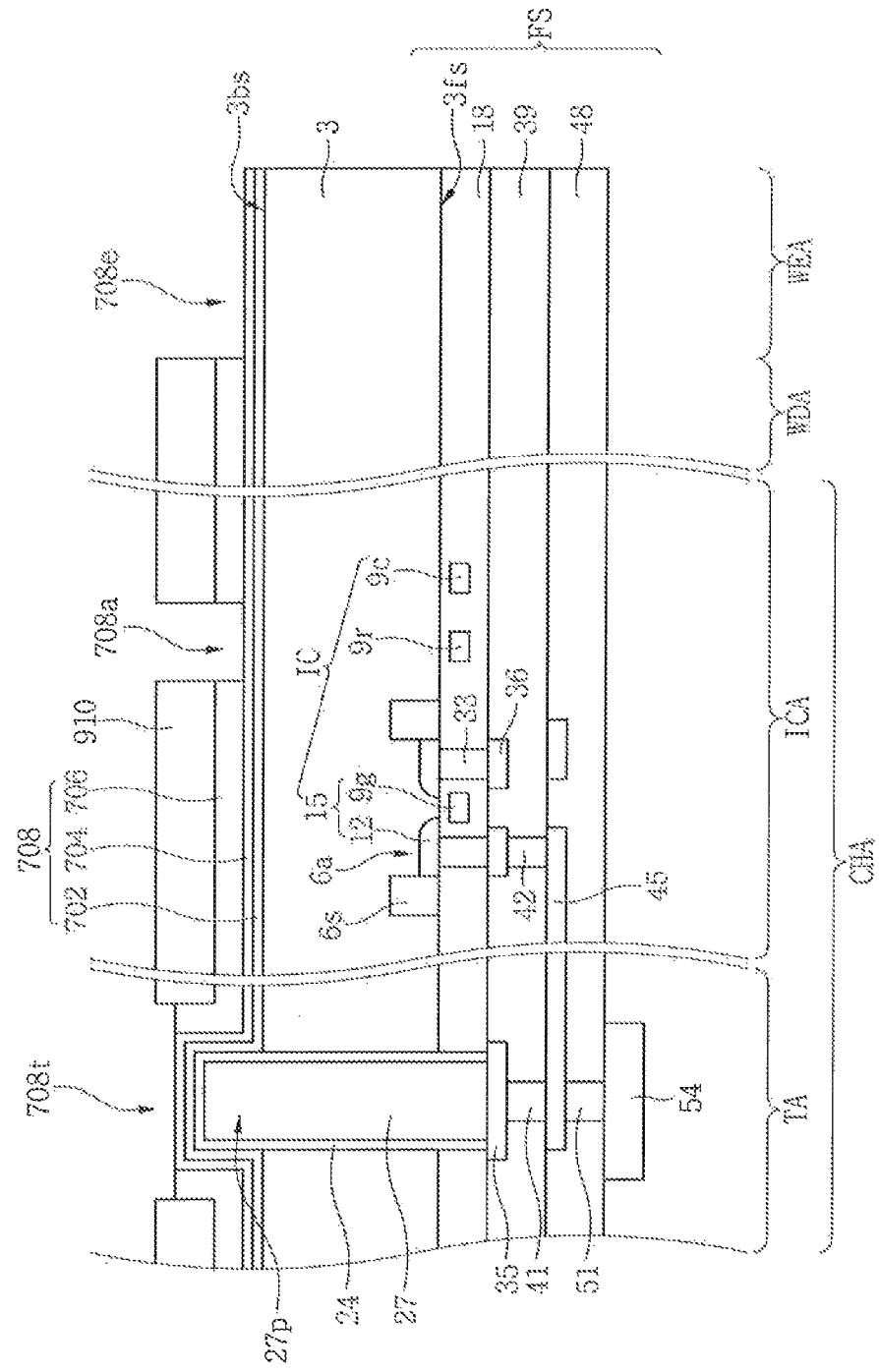

Referring to FIGS. 5 and 14B, an example of a method of forming a semiconductor device in accordance with an exemplary embodiment of the present inventive concept may include forming the top part 708t, the alignment recessed area 708a, and the edge recessed area 708e, as described with reference to FIG. 13B, by partially etching the passivation layer 708 by performing the etching process using the mask pattern 910 as an etching mask. The substrate, such as that described with reference to FIG. 13C may be formed by selectively removing the mask pattern 910.

In accordance with exemplary embodiments of the present inventive concept, the semiconductor packages including, for example, the semiconductor devices 100, 200, and 300 in accordance with exemplary embodiments of the present inventive concept described with reference to FIGS. 1A to 14B may be provided.

A semiconductor package 1100 including the semiconductor device 100 in accordance with the exemplary embodiment of the present inventive concept described with reference to FIGS. 1A and 1B will be described in more detail with reference to FIGS. 15A and 15B. FIG. 15B is a partially enlarged view of a part A1 in FIG. 15A.

Figure 15A:
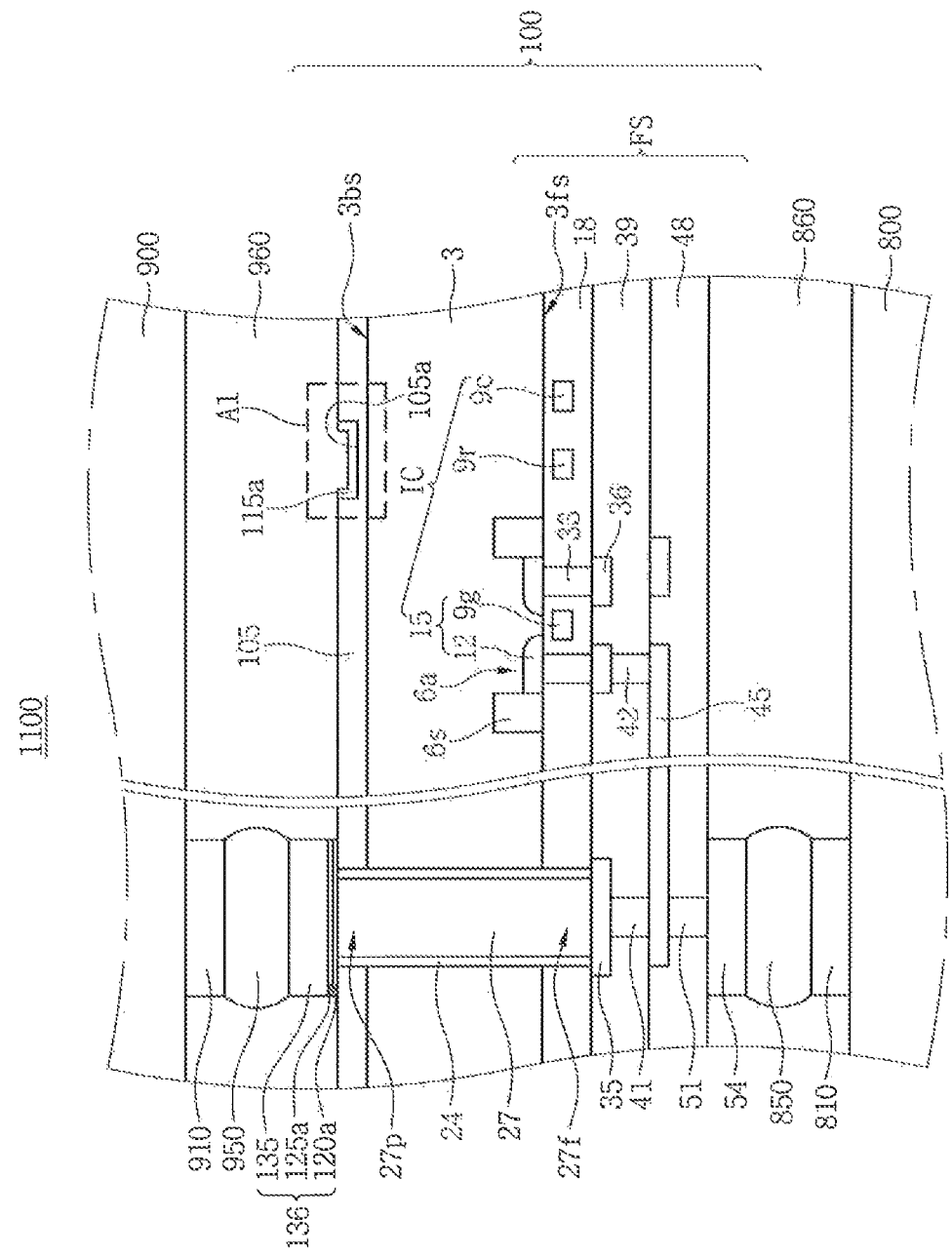
FIG. 15A is a cross-sectional view showing a semiconductor package including a semiconductor device in accordance with an exemplary embodiment of the present inventive concept.
Figure 15B:
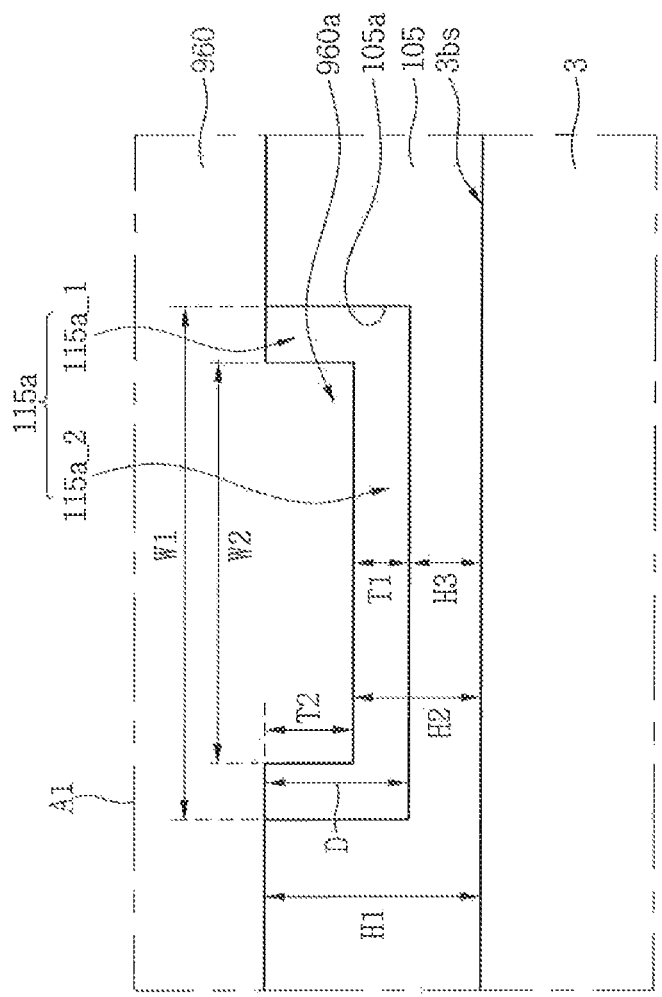
FIG. 15B is a partially enlarged view of a part A1 in FIG. 15A.

Referring to FIGS. 15A and 15B, a semiconductor package 1100 may include a lower substrate 800, an upper substrate 900 disposed on the lower substrate 800, and the semiconductor device 100 disposed between the lower substrate 800 and the upper substrate 900.

The upper substrate 900 may be an upper semiconductor chip.

In an exemplary embodiment of the present inventive concept, the lower substrate 800 may be a package substrate. For example, the lower substrate 800 may be a printed circuit board (PCB).

In an exemplary embodiment of the present inventive concept, the lower substrate 800 may be a lower semiconductor chip.

The semiconductor device 100, as described with reference to FIGS. 1A and 1B, may include the semiconductor substrate 3 having the first side 3fs and the second side 3bs, the front-side structure FS disposed on the first side 3fs of the semiconductor substrate 3, the passivation layer 105 disposed on the second side 3bs of the semiconductor substrate 3, the through-via structure 27 passing through the semiconductor substrate 3, the alignment pattern 115a, and the back-side conductive pattern 136.

The through-via structure 27 may have the back-side protruding part 27p protruding from the second side 3bs of the semiconductor substrate 3 and passing through the passivation layer 105, and the front-side protruding part 27f protruding from the first side 3fs of the semiconductor substrate 3 and disposed in the front-side structure FS.

The first side 3fs of the semiconductor substrate 3 may face the lower substrate 800, and the second side 3bs of the semiconductor substrate 3 may face the upper substrate 900. The passivation layer 105, as described with reference to FIGS. 1A and 1B, may cover the side surface of the back-side protruding part 27p of the through-via structure 27.

The front-side structure FS, as described with reference to FIGS. 1A and 1B, may include the internal circuit IC, the plurality of conductive plugs 33, 41, 42, and 51, the via metal pattern 35, the plurality of metal interconnections 36 and 45, the plurality of front-side insulating layers 18, 39, and 48, and the front-side conductive pattern 54. The front-side conductive pattern 54 may be electrically connected to the front-side protruding part 27f of the through-via structure 27.

The back-side conductive pattern 136 may be disposed on the passivation layer 105, and may be electrically connected to the back-side protruding part 27p of the through-via structure 27.

The alignment pattern 115a, as described with reference to FIGS. 1A and 1B, may be disposed in the alignment recessed area 105a disposed in the passivation layer 105.

The semiconductor package 1100 may include a lower connection pattern 850 configured to electrically connect the lower substrate 800 to the semiconductor device 100, and an upper connection pattern 950 configured to electrically connect the upper substrate 900 to the semiconductor device 100. The lower connection pattern 850 and/or the upper connection pattern 950 may include a solder material. The lower connection pattern 850 may contact the front-side conductive pattern 54 of the semiconductor device 100 and a lower conductive pattern 810 of the lower substrate 800. The upper connection pattern 950 may contact the back-side conductive pattern 136 of the semiconductor device 100 and an upper conductive pattern 910 of the upper substrate 900.

The semiconductor package 1100 may include a lower filler 860 disposed between the lower substrate 800 and the semiconductor device 100, and an upper filler 960 disposed between the upper substrate 900 and the semiconductor device 100. The lower filler 860 may fill a space between the lower substrate 800 and the semiconductor device 100. The upper filler 960 may fill a space between the upper substrate 900 and the semiconductor device 100.

The lower filler 860 and the upper filler 960 may include an insulating material. For example, at least one of the lower filler 860 and the upper filler 960 may include an insulating material such as a nonconductive film (NCF), or an underfill material. The upper filler 960 may include a different material from the alignment pattern 115a. For example, the alignment pattern 115a may include a nitride-based material such as silicon nitride, or a polymer-based material, and the upper filler 960 may include an underfill material, or an NCF. For example, the upper filler 960 may include a thermal setting structure, a thermal plastic, an ultraviolet (UV) cure material, or a combination thereof. The upper filler 960 may include epoxy series, silicon series, phenol type, acid anhydride type, and amine type hardeners, acrylic polymer, or a combination thereof.

The alignment recessed area 105a disposed in the passivation layer 105 may be filled by the alignment pattern 115a and the upper filler 960. The upper filler 960 and the alignment pattern 115a may completely fill the alignment recessed area 105a disposed in the passivation layer 105.

The alignment pattern 115a may include the first part 115a_1 configured to cover the sidewall of the alignment recessed area 105a, and the second part 115a_2 configured to cover the bottom of the alignment recessed area 105a. The upper surface of the first part 115a_1 of the alignment pattern 115a may be disposed at substantially the same level as the upper surface of the passivation layer 105. The upper surface of the second part 115a_2 of the alignment pattern 115a may be disposed at a lower level than the upper surface of the passivation layer 105 and the first part 115a_1 of the alignment pattern 115a. The first distance H1 between the upper surface of the first part 115a_1 of the alignment pattern 115a and the second side 3bs of the semiconductor substrate 3 may be greater than the second distance H2 between the upper surface of the second part 115a_2 of the alignment pattern 115a and the second side 3bs of the semiconductor substrate 3. The alignment pattern 115a may be spaced apart from the second side 3bs of the semiconductor substrate 3. The alignment pattern 115a may be spaced apart from the second side 3bs of the semiconductor substrate 3 by the third distance H3.

The upper filler 960 may have a part 960a configured to cover the passivation layer 105 and the alignment pattern 115a, and may extend into the alignment recessed area 105a. The part 960a, which may be extended into the alignment recessed area 105a of the upper filler 960 and the alignment pattern 115a may fill the alignment recessed area 105a.

The alignment pattern 115a may be formed to have a thickness T1, which may be smaller than a depth D of the alignment recessed area 105a and a width W1 of the alignment recessed area 105a, so as to not completely fill the alignment recessed area 105a.

At least one of a thickness T2 and width W2 of the part 960a, which may be extended into the alignment recessed area 105a of the upper filler 960, may be greater than the thickness T1 of the alignment pattern 115a. The part 960a, which may be extended into the alignment recessed area 105a of the upper filler 960, may increase the contact area between the semiconductor device 100 and the upper filler 960.

A semiconductor package 1200 including the semiconductor device 200 in accordance with an exemplary embodiment of the present inventive concept described with reference to FIG. 2 will be described in more detail with reference to FIG. 16.

Figure 16:
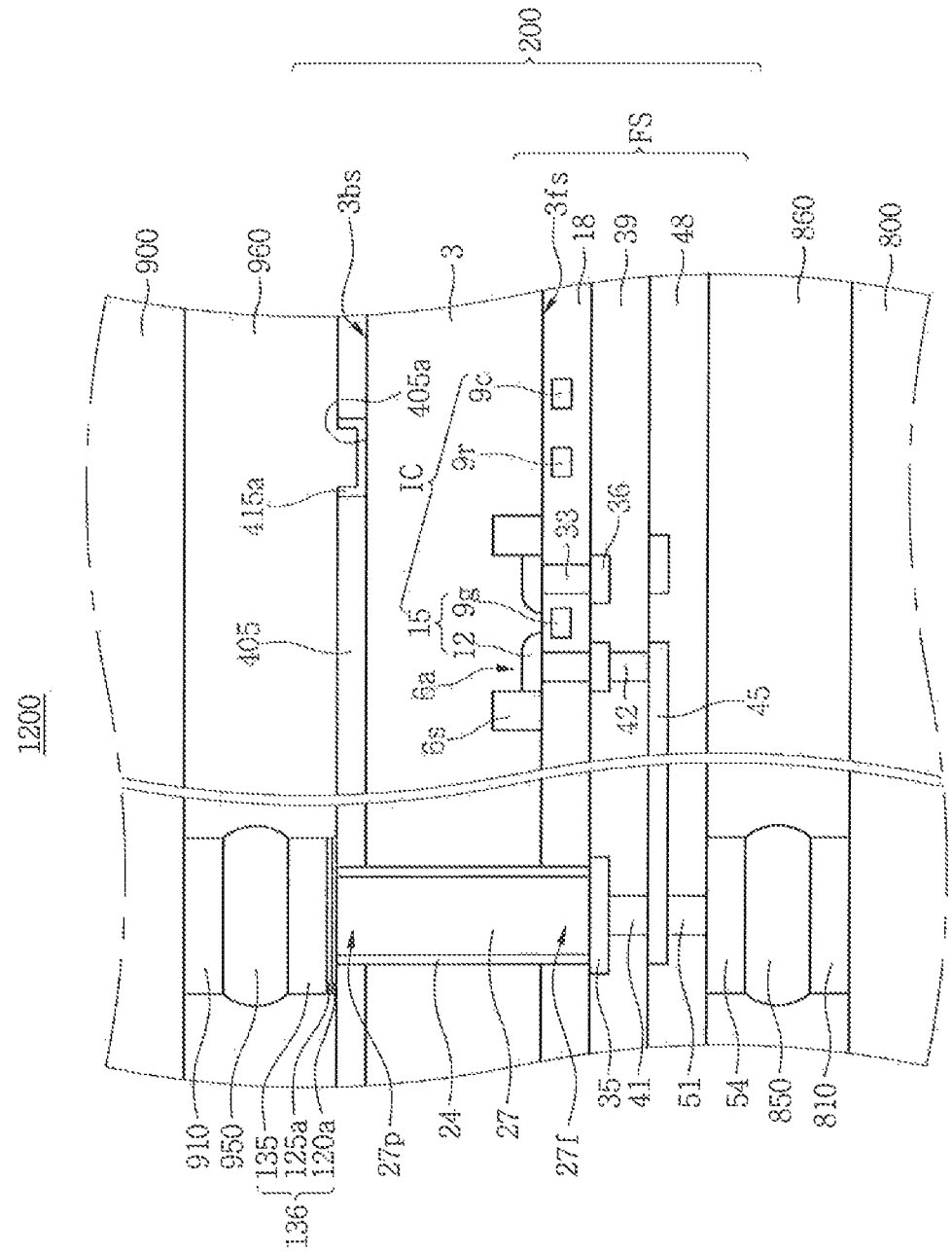
FIG. 16 is a cross-sectional view showing a semiconductor package including a semiconductor device in accordance with an exemplary embodiment of the present inventive concept.

Referring to FIG. 16, the semiconductor package 1200 may include the lower substrate 800 and the upper substrate 900, as described above with reference to FIG. 15. The semiconductor package 1200 may include the semiconductor device 200 as described above with reference to FIG. 2. The semiconductor device 200 may be disposed between the lower substrate 800 and the upper substrate 900.

The semiconductor device 200, as described above with reference to FIG. 2, may include the semiconductor substrate 3 having the first side 3fs and the second side 3bs, the front-side structure FS disposed on the first side 3fs of the semiconductor substrate 3, the passivation layer 405 disposed on the second side 3bs of the semiconductor substrate 3, the through-via structure 27 passing through the semiconductor substrate 3, the alignment pattern 415a, and the back-side conductive pattern 136.

The first side 3fs of the semiconductor substrate 3 may face the lower substrate 800, and the second side 3bs of the semiconductor substrate 3 may face the upper substrate 900. The passivation layer 405, as described above with reference to FIG. 2, may cover the side surface of the back-side protruding part 27p of the through-via structure 27.

The back-side conductive pattern 136 may be disposed on the passivation layer 405, and may be electrically connected to the back-side protruding part 27p of the through-via structure 27.

The alignment pattern 415a, as described above with reference to FIG. 2, may be disposed in the alignment recessed area 405a passing through the passivation layer 405.

The semiconductor package 1200 may include the lower connection pattern 850 configured to electrically connect the lower substrate 800 to the semiconductor device 200, and the upper connection pattern 950 configured to electrically connect the upper substrate 900 to the semiconductor device 200. The lower connection pattern 850 and/or the upper connection pattern 950 may include a solder material. The lower connection pattern 850 may contact the front-side conductive pattern 54 of the semiconductor device 200 and the lower conductive pattern 810 of the lower substrate 800. The upper connection pattern 950 may contact the back-side conductive pattern 136 of the semiconductor device 200 and an upper conductive pattern 910 of the upper substrate 900.

The semiconductor package 1200, as described above with reference to FIG. 15, may include the lower filler 860 configured to fill the space between the lower substrate 800 and the semiconductor device 200, and the upper filler 960 configured to fill the space between the upper substrate 900 and the semiconductor device 200. The alignment recessed area 405a may be filled by the alignment pattern 415a and the upper filler 960.

A semiconductor package 1300 including the semiconductor device 300 in accordance with an exemplary embodiment of the present inventive concept described with reference to FIG. 3 will be described in more detail with reference to FIG. 17.

Figure 17:
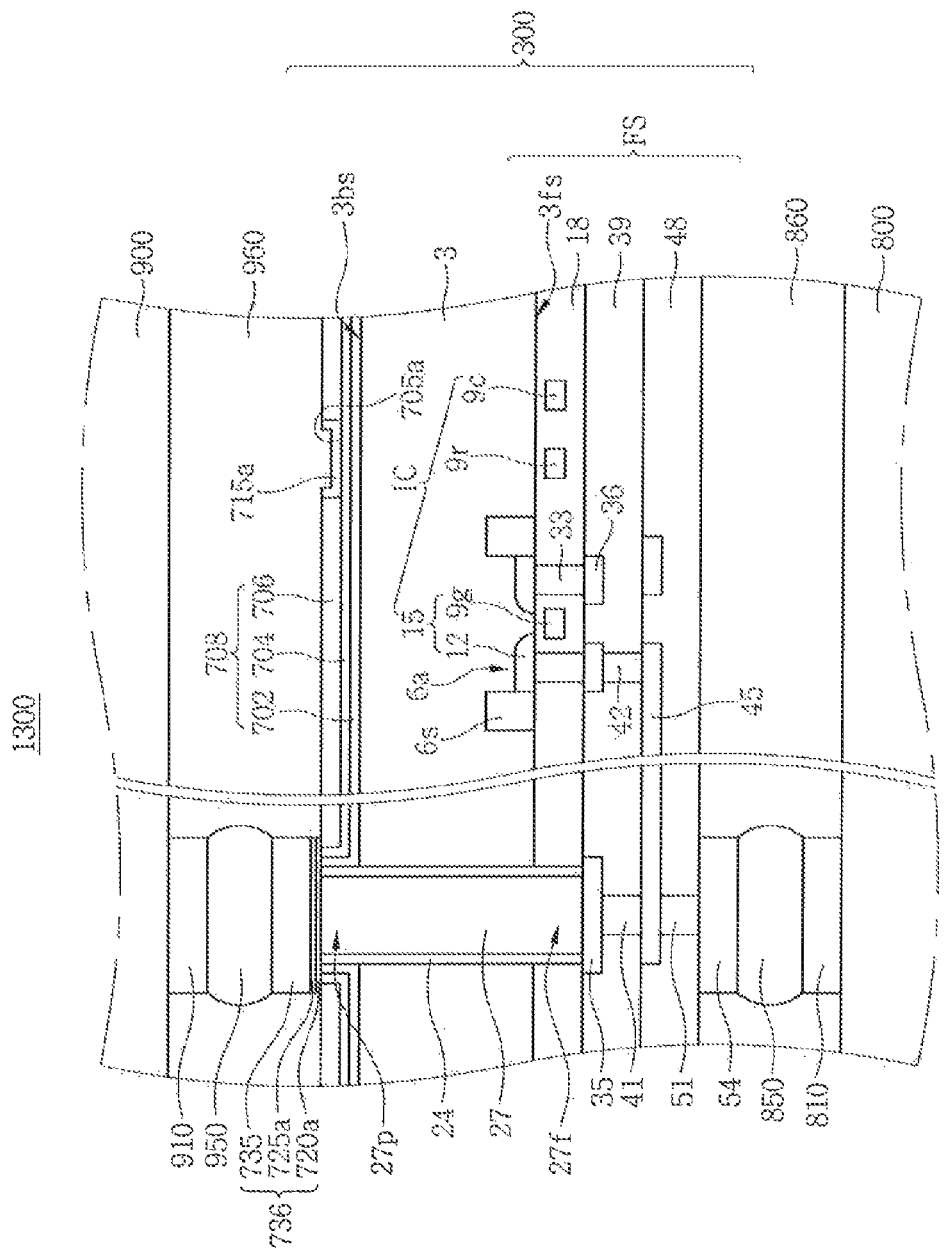
FIG. 17 is a cross-sectional view showing a semiconductor package including a semiconductor device in accordance with an exemplary embodiment of the present inventive concept.

Referring to FIG. 17, the semiconductor package 1300 may include the lower substrate 800 and the upper substrate 900, as described above with reference to FIG. 15. The semiconductor package 1300 may include the semiconductor device 300, as described with reference to FIG. 3. The semiconductor device 300 may be disposed between the lower substrate 800 and the upper substrate 900.

The semiconductor device 300, as described above with reference to FIG. 3, may include the semiconductor substrate 3 having the first side 3fs and the second side 3bs, the front-side structure FS disposed on the first side 3fs of the semiconductor substrate 3, the passivation layer 708 disposed on the second side 3bs of the semiconductor substrate 3, the through-via structure 27 passing through the semiconductor substrate 3, the alignment pattern 715a, and the back-side conductive pattern 736.

The first side 3fs of the semiconductor substrate 3 may face the lower substrate 800, and the second side 3bs of the semiconductor substrate 3 may face the upper substrate 900. The passivation layer 708, as described above with reference to FIG. 3, may cover the side surface of the back-side protruding part 27p of the through-via structure 27.

The passivation layer 708, as described above with reference to FIG. 3, may include the lower passivation layer 702, the intermediate passivation layer 704, and the upper passivation layer 706, which may be sequentially stacked on the second side 3bs of the semiconductor substrate 3. The back-side conductive pattern 736 may be disposed on the passivation layer 708, and may be electrically connected to the back-side protruding part 27p of the through-via structure 27.

The alignment pattern 715a, as described above with reference to FIG. 3, may be disposed in the alignment recessed area 708a passing through the upper passivation layer 706 of the passivation layer 708.

The semiconductor package 1300 may include the lower connection pattern 850 configured to electrically connect the lower substrate 800 to the semiconductor device 300, and the upper connection pattern 950 configured to electrically connect the upper substrate 900 to the semiconductor device 300. The lower connection pattern 850 and/or the upper connection pattern 950 may include a solder material. The lower connection pattern 850 may contact the front-side conductive pattern 54 of the semiconductor device 300 and the lower conductive pattern 810 of the lower substrate 800. The upper connection pattern 950 may contact the back-side conductive pattern 736 of the semiconductor device 300 and the upper conductive pattern 910 of the upper substrate 900.

The semiconductor package 1300, as described above with reference to FIG. 15, may include the lower filler 860 configured to fill the space between the lower substrate 800 and the semiconductor device 300, and the upper filler 960 configured to fill the space between the upper substrate 900 and the semiconductor device 300. The alignment recessed area 708a may be filled by the alignment pattern 715a and the upper filler 960.

Figure 18:
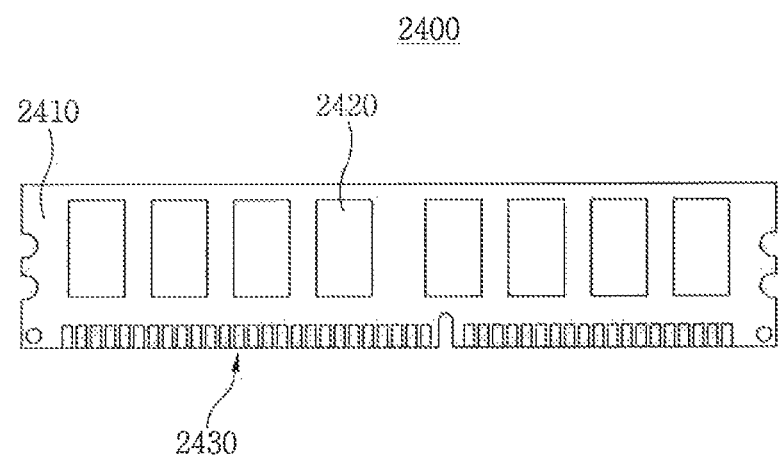
FIG. 18 is a schematic view showing a memory module including a semiconductor device in accordance with exemplary embodiments of the present inventive concept.
Figure 19:
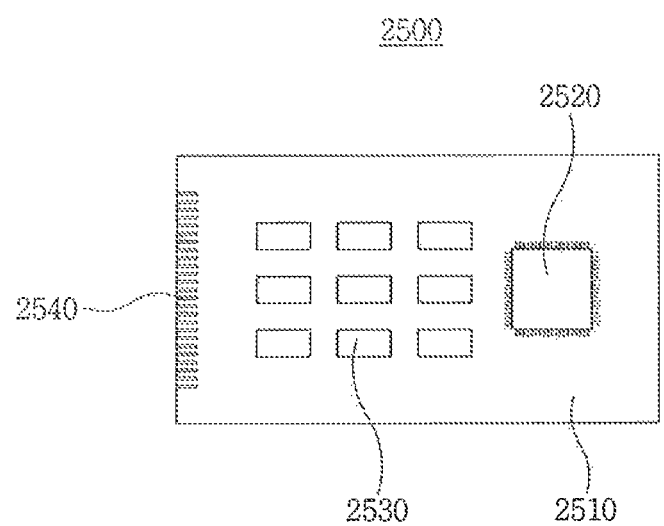
FIG. 19 is a schematic view showing a semiconductor module including a semiconductor device in accordance with exemplary embodiments of the present inventive concept.
Figure 20:
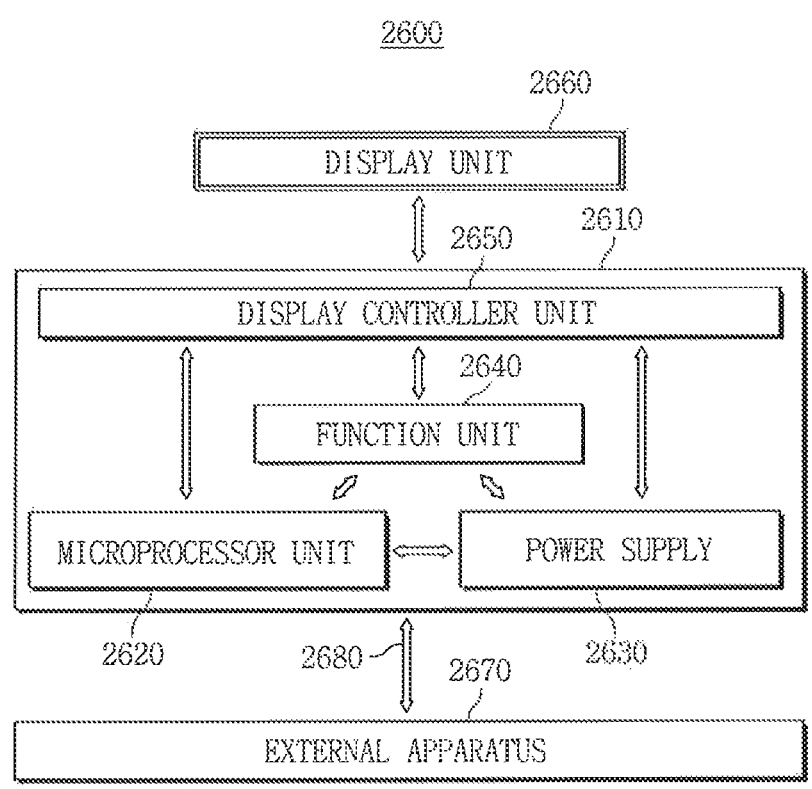
FIG. 20 is a conceptual block diagram illustrating an electronic system including a semiconductor device in accordance with exemplary embodiments of the present inventive concept.
Figure 21:
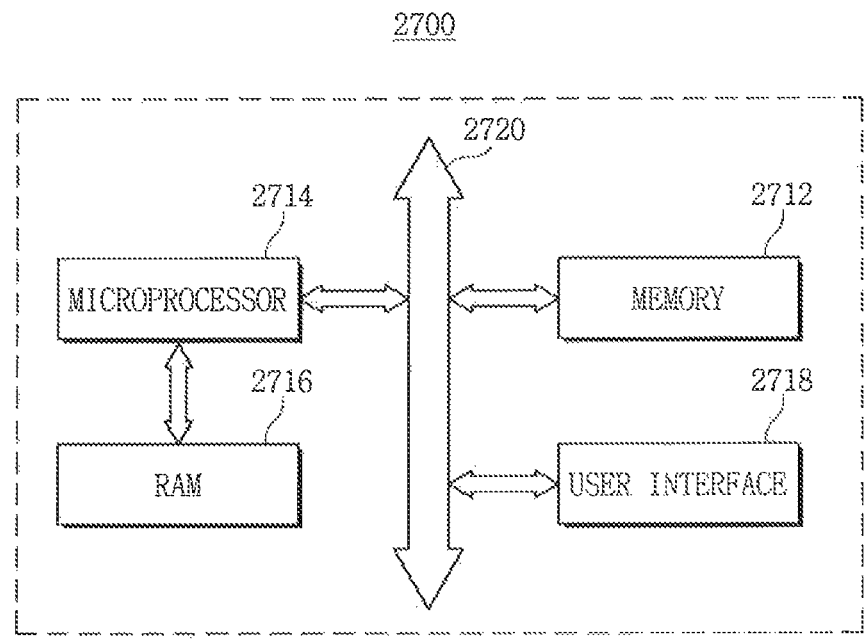
FIG. 21 is a schematic block diagram illustrating an electronic system including a semiconductor device in accordance with exemplary embodiments of the present inventive concept.
Figure 22:
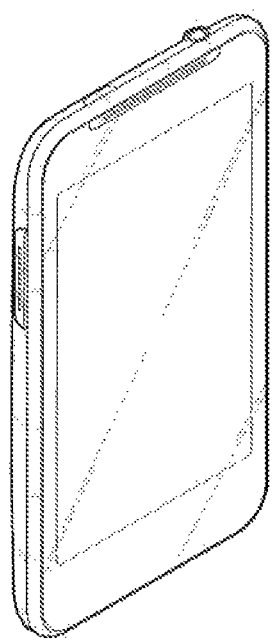
FIG. 22 is a schematic view illustrating a mobile wireless phone including a semiconductor device in accordance with exemplary embodiments of the present inventive concept.

FIG. 18 is a schematic view showing a memory module including a semiconductor device in accordance with exemplary embodiments of the present inventive concept, FIG. 19 is a schematic view showing a semiconductor module including a semiconductor device in accordance with exemplary embodiments of the present inventive concept, FIG. 20 is a conceptual block diagram illustrating an electronic system including a semiconductor device in accordance with exemplary embodiments of the present inventive concept, FIG. 21 is a schematic block diagram illustrating an electronic system including a semiconductor device in accordance with exemplary embodiments of the present inventive concept, and FIG. 22 is a schematic view illustrating a mobile wireless phone including a semiconductor device in accordance with exemplary embodiments of the present inventive concept.

A memory module 2400 including the semiconductor device in accordance with exemplary embodiments of the present inventive concept will be described below with reference to FIG. 18.

Referring to FIG. 18, the memory module 2400 may include a memory module substrate 2410, a plurality of semiconductor devices 2420 disposed on the memory module substrate 2410, and a plurality of terminals 2430.

The memory module substrate 2410 may include a PCB or a wafer. The semiconductor devices 2420 may be memory devices such as, a dynamic random access memory (DRAM). The semiconductor devices 2420 may include one or more of the semiconductor devices in accordance with exemplary embodiments of the present inventive concept described with reference to FIGS. 1A to 17, or a semiconductor package including the semiconductor device. The terminals 2430 may be electrically connected to the semiconductor devices 2420.

A semiconductor module 2500 including the semiconductor device in accordance with exemplary embodiments of the present inventive concept will be described with reference to FIG. 19.

Referring to FIG. 19, the semiconductor module 2500 may include a semiconductor device 2530 disposed on a module substrate 2510.

The semiconductor module 2500 may include a microprocessor 2520 disposed on the module substrate 2510. Input/output terminals 2540 may be disposed on at least one side of the module substrate 2510.

Any one of the semiconductor device 2530 and the microprocessor 2520 may include one or more of the semiconductor devices in accordance with exemplary embodiments of the present inventive concept described with reference to FIGS. 1A to 17, or the semiconductor package including the semiconductor device.

An electronic system 2600 including the semiconductor device in accordance with exemplary embodiments of the present inventive concept will be described with reference to FIG. 20.

Referring to FIG. 20, the electronic system 2600 may include a body 2610. The body 2610 may include a microprocessor unit 2620, a power supply 2630, a function unit 2640, and/or a display controller unit 2650. The body 2610 may be a system board or a motherboard having a PCB.

The microprocessor unit 2620, the power supply 2630, the function unit 2640, and the display controller unit 2650 may be disposed on the body 2610.

A display unit 2660 may be disposed on an upper surface of the body 2610 or outside the body 2610. For example, the display unit 2660 may be disposed on a surface of the body 2610, and may display an image processed by the display controller unit 2650.

The power supply 2630 may receive a constant voltage from an external power supply, divide the voltage into various voltage levels, and supply the voltages to the microprocessor unit 2620, the function unit 2640, and/or the display controller unit 2650.

The microprocessor unit 2620 may receive a voltage from the power supply 2630 to control the function unit 2640 and the display unit 2660.

The function unit 2640 may perform various functions of the electronic system 2600. For example, where the electronic system 2600 is a mobile electronic product such as a cellular phone, the function unit 2640 may include various components to perform wireless communication functions such as dialing, video output to the display unit 2660 or voice output to a speaker through communication with an external device 2670, and when a camera is included, it may serve as an image processor.

In an exemplary embodiment of the present inventive concept, when the electronic system 2600 is connected to a memory card to expand the capacity, the function unit 2640 may be a memory card controller. The function unit 2640 may exchange signals with the external device 2670 through a wired or wireless communication unit 2680.

When the electronic system 2600 includes a Universal Serial Bus (USB) to extend the functions, the function unit 2640 may serve as an interface controller.

Any one of the microprocessor unit 2620 and the function unit 2640 may include one or more of the semiconductor devices in accordance with exemplary embodiments of the present inventive concept described with reference to FIGS. 1A to 17, or the semiconductor package including the semiconductor device.

An electronic system 2700 including the semiconductor device in accordance with exemplary embodiments of the present inventive concept will be described with reference to FIG. 21.

Referring to FIG. 21, The electronic system 2700 may include a semiconductor device and/or a semiconductor package in accordance with exemplary embodiments of the present inventive concept. The electronic system 2700 may be included in a mobile device or a computer. For example, the electronic system 2700 may include a memory system 2712, a microprocessor 2714, a RAM 2716, and a user interface 2718 configured to perform data communication using a bus 2720. The microprocessor 2714 may program and control the electronic system 2700. The RAM 2716 may be used as an operational memory of the microprocessor 2714. The microprocessor 2714, the RAM 2716, and/or other components may be assembled within a single package. The microprocessor 2714, the memory system 2712 and/or the RAM 2716 may include a semiconductor device and/or a semiconductor package in accordance with exemplary embodiments of the present inventive concept.

The user interface 2718 may be used to input data to the electronic system 2700, or output data from the electronic system 2700. The memory system 2712 may store operational codes of the microprocessor 2714, data processed by the microprocessor 2714, or data received from the outside. The memory system 2712 may include a controller and a memory.

FIG. 22 is a schematic view illustrating a mobile wireless phone 2800 including the semiconductor device in accordance with exemplary embodiments of the present inventive concept. A mobile wireless phone 2800 may be similar to a tablet PC. The semiconductor device in accordance with an exemplary embodiment of the present inventive concept may be included in a portable computer such as a notebook PC, a MPEG audio layer-3 (MP3) player, a MP4 player, a navigation device, a solid state disk (SSD), a table computer, an automobile, and a household appliance, or the tablet PC.

In accordance with exemplary embodiments of the present inventive concept, the method of forming the semiconductor device may include forming the passivation layer on the back-side of the semiconductor substrate having the through-via structure. The alignment recessed area and an edge recessed area may be formed by performing photolithography and etching processes. A protection and an alignment pattern may be formed, which may expose the through-via structure, and may define the alignment recessed area. An edge pattern may be disposed in the edge recessed area by performing the planarization process for exposing the through-via structure. A device including the semiconductor device formed by the method according to exemplary embodiments of the present inventive concept may be provided.

The protection layer may prevent the occurrence of a crack or a chipping failure on a wafer edge part of the semiconductor substrate during the planarization process for exposing the through-via structure.

The alignment pattern may serve as a planarization supporter configured to reduce the occurrence of dishing during the planarization process for exposing the through-via structure. The alignment pattern may reduce the degradation of the thickness distribution characteristic of the passivation layer.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:

1. A semiconductor device, comprising:
   a semiconductor substrate having a first side and a second side facing the first side;
   a front-side structure disposed on the first side of the semiconductor substrate, wherein the front-side structure comprises an internal circuit;
   a passivation layer comprising upper and lower passivation layers disposed on the second side of the semiconductor substrate;
   a through-via structure passing through the semiconductor substrate and the passivation layer;
   a back-side conductive pattern disposed on the second side of the semiconductor substrate, wherein the back-side conductive pattern is electrically connected to the through-via structure;
   an alignment recessed area disposed in the upper passivation layer; and
   an alignment pattern disposed in the alignment recessed area, wherein the alignment pattern comprises a different material from each of the upper and lower passivation layers.

2. The semiconductor device according to claim 1, wherein the alignment pattern includes a first part covering a sidewall of the alignment recessed area and a second part covering a bottom of the alignment recessed area.

3. The semiconductor device according to claim 2, wherein an upper surface of the first part of the alignment pattern is disposed at substantially the same level as an upper surface of the passivation layer.

4. The semiconductor device according to claim 2, wherein a distance between an upper surface of the first part of the alignment pattern and the second side of the semiconductor substrate is greater than a distance between an upper surface of the second part of the alignment pattern and the second side of the semiconductor substrate.

5. The semiconductor device according to claim 1, wherein the alignment recessed area passes through the upper passivation layer.

6. The semiconductor device according to claim 1, wherein the passivation layer further includes an intermediate passivation layer disposed between the lower passivation layer and the upper passivation layer.

7. The semiconductor device according to claim 6, wherein the lower and intermediate passivation layers each cover the second side of the semiconductor substrate, and each include a part disposed between a side surface of the through-via structure and the upper passivation layer.

8. The semiconductor device according to claim 7, wherein the back-side conductive pattern covers the through-via structure and the lower and intermediate passivation layers are each disposed between the side surface of the through-via structure and the upper passivation layer.

9. The semiconductor device according to claim 6, wherein the intermediate passivation layer and the alignment pattern each comprise an insulating layer, and wherein the lower and upper passivation layers each include a different material from the intermediate passivation layer.

10. The semiconductor device according to claim 1, wherein the semiconductor substrate has a circuit area and a through silicon via (TSV) area, the through-via structure passes through the semiconductor substrate in the TSV area, the internal circuit is disposed on the first side of the semiconductor substrate in the circuit area, and the alignment pattern is disposed on the second side of the semiconductor substrate in the circuit area.

11. A semiconductor package, comprising:
a lower substrate;
a lower conductive pattern disposed on the lower substrate;
an upper substrate;
an upper conductive pattern disposed on the upper substrate;
a semiconductor device disposed between the lower substrate and the upper substrate;
a lower connection pattern disposed between the lower conductive pattern and the semiconductor device; and
an upper connection pattern disposed between the upper conductive pattern and the semiconductor device,
wherein the semiconductor device includes:
a semiconductor substrate disposed between the lower substrate and the upper substrate, wherein the semiconductor substrate comprises a first side facing the lower substrate and a second side facing the upper substrate;
a front-side structure disposed on the first side of the semiconductor substrate, wherein the front-side structure comprises an internal circuit and a front-side conductive pattern;
a passivation layer comprising upper and lower passivation layers disposed on the second side of the semiconductor substrate and an intermediate passivation layer disposed between the upper and lower passivation layers;
a through-via structure passing through the semiconductor substrate and the passivation layer;
a back-side conductive pattern disposed on the passivation layer, wherein the back-side conductive pattern is electrically connected to the through-via structure;
an alignment recessed area disposed in the upper passivation layer; and
an alignment pattern disposed in the alignment recessed area, wherein the alignment pattern comprises a different material from each of the upper and lower passivation layers.

12. The semiconductor package according to claim 11, wherein the lower connection pattern is in contact with the lower conductive pattern and the front-side conductive pattern, and wherein the upper connection pattern is in contact with the upper conductive pattern and the back-side conductive pattern.

13. The semiconductor package according to claim 11, further comprising:
an upper filler disposed between the upper substrate and the semiconductor device.

14. The semiconductor package according to claim 13, wherein the upper filler and the alignment pattern fill the alignment recessed area.

15. A semiconductor device, comprising:
a semiconductor substrate having a first side and a second side facing the first side;
a front-side structure disposed on the first side of the semiconductor substrate, wherein the front-side structure comprises an internal circuit;
a passivation layer disposed on the second side of the semiconductor substrate, wherein the passivation layer includes a lower passivation layer and an upper passivation layer disposed on the lower passivation layer, wherein the passivation layer includes an intermediate passivation layer disposed between the lower passivation layer and the upper passivation layer;
a through-via structure passing through the semiconductor substrate and the passivation layer;
a back-side conductive pattern disposed on the second side of the semiconductor substrate, wherein the back-side conductive pattern is electrically connected to the through-via structure;
an alignment recessed area disposed in the passivation layer; and
an alignment pattern disposed in the alignment recessed area, wherein the intermediate passivation layer and the alignment pattern each comprise an insulating layer, and wherein the lower and upper passivation layers each include a different material from the intermediate passivation layer and the alignment pattern.

16. A semiconductor package, comprising:
a lower substrate;
a lower conductive pattern disposed on the lower substrate;
an upper substrate;
an upper conductive pattern disposed on the upper substrate;
a semiconductor device disposed between the lower substrate and the upper substrate;
an upper filler disposed between the upper substrate and the semiconductor device;
a lower connection pattern disposed between the lower conductive pattern and the semiconductor device; and
an upper connection pattern disposed between the upper conductive pattern and the semiconductor device,
wherein the semiconductor device includes:
a semiconductor substrate disposed between the lower substrate and the upper substrate, wherein the semiconductor substrate comprises a first side facing the lower substrate and a second side facing the upper substrate;
a front-side structure disposed on the first side of the semiconductor substrate, wherein the front-side structure comprises an internal circuit and a front-side conductive pattern;
a passivation layer disposed on the second side of the semiconductor substrate;
a through-via structure passing through the semiconductor substrate and the passivation layer;
a back-side conductive pattern disposed on the passivation layer, wherein the back-side conductive pattern is electrically connected to the through-via structure;
an alignment recessed area disposed in the passivation layer; and
an alignment pattern disposed in the alignment recessed area, wherein the upper filler and the alignment pattern fill the alignment recessed area.

17. The semiconductor device according to claim 1, wherein the lower passivation layer is disposed between the alignment pattern and the semiconductor substrate.

18. The semiconductor device according to claim 1, wherein the lower passivation layer is in direct contact with the alignment pattern.

* * * * *